United States Patent
Park et al.

(10) Patent No.: US 11,858,950 B2
(45) Date of Patent: Jan. 2, 2024

(54) COMPOUND AND FILM AND PHOTOELECTRIC DIODE AND ORGANIC SENSOR AND ELECTRONIC DEVICE

(71) Applicant: SAMSUNG ELECTRONICS CO., LTD., Suwon-si (KR)

(72) Inventors: Bum Woo Park, Hwaseong-si (KR); Hwang Suk Kim, Suwon-si (KR); Youngchun Kwon, Yongin-si (KR); Dongseon Lee, Suwon-si (KR); Dong-Seok Leem, Seongnam-si (KR); Ohkyu Kwon, Seoul (KR); Kwang Hee Lee, Hwaseong-si (KR); Younsuk Choi, Seongnam-si (KR); Hyesung Choi, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 259 days.

(21) Appl. No.: 16/909,091

(22) Filed: Jun. 23, 2020

(65) Prior Publication Data
US 2021/0130373 A1 May 6, 2021

(30) Foreign Application Priority Data

Nov. 4, 2019 (KR) .................. 10-2019-0139719

(51) Int. Cl.
*H01L 29/08* (2006.01)
*C07F 5/02* (2006.01)
(Continued)

(52) U.S. Cl.
CPC ............... *C07F 5/02* (2013.01); *H10K 30/80* (2023.02); *H10K 39/32* (2023.02); *H10K 85/322* (2023.02)

(58) Field of Classification Search
CPC .......................... H01L 27/307; H01L 51/44
See application file for complete search history.

(56) References Cited

U.S. PATENT DOCUMENTS

2015/0158888 A1 6/2015 You et al.
2015/0303377 A1 10/2015 Thompson et al.

FOREIGN PATENT DOCUMENTS

CN 105085556 A 11/2015
CN 106479216 A 3/2017
(Continued)

OTHER PUBLICATIONS

Mueller ("Organic solar cells based on a novel infrared absorbing aza-bodipy dye") Solar Energy Materials & Solar Cells 99 (2012) 176-181 (Year: 2012).*

(Continued)

*Primary Examiner* — Angelo Trivisonno
(74) *Attorney, Agent, or Firm* — CANTOR COLBURN LLP

(57) ABSTRACT

Disclosed are a compound represented by Chemical Formula 1, a film, a photoelectric diode, an organic sensor, and an electronic device.

Chemical Formula 1

(Continued)

In Chemical Formula 1, $Ar^1$ and $Ar^2$, Z, $L^1$, $L^2$, and $R^1$ to $R^6$ are the same as defined in the detailed description.

16 Claims, 14 Drawing Sheets

(51) Int. Cl.
  *H10K 30/80* (2023.01)
  *H10K 39/32* (2023.01)
  *H10K 85/30* (2023.01)

(56) References Cited

FOREIGN PATENT DOCUMENTS

| JP | 2011022016 | A | 2/2011 |
|---|---|---|---|
| JP | 6290079 | B2 | 2/2018 |
| WO | 2006058448 | A1 | 6/2006 |
| WO | 2018021377 | A1 | 1/2018 |
| WO | 18021376 | A1 | 2/2018 |
| WO | 2018232358 | A1 | 12/2018 |

OTHER PUBLICATIONS

Wang ("Synthesis, structure and properties of thiophene-fused BODIPYs and azaBODIPYs as near-infrared agents") NewJ.Chem., 2016, 40, 5966 (Year: 2016).*

Schellhammer ("Tuning Near-Infrared Absorbing Donor Materials: A Study of Electronic, Optical, and Charge-Transport Properties of aza-BODIPYs") Chem. Mater. 2017, 29, 5525-5536 (Year: 2017).*

J. Wang, et al., Synthesis, Structure and Properties of Thiophene-fused BODIPYs and AzaBODIPYs as Near-infrared Agents, New Journal of Chemistry, DOI: 10.1039/C6NJ01011C, Jun. 1, 2016, 30 pp.

Keitaro Umezawa, et al., Bright, Color-Tunable Fluorescent Dyes in the Visible-Near-Infrared Region, J. Am. Chem. Soc. 2008, 130, 1550-1551.

Minquan Tian, et al., Search for Squaraine Derivatives That Can Be Sublimed without Thermal Decomposition, J. Phys. Chem. B 2002, 106, 4370-4376.

Tian-yi Li, et al., Small Molecule Near-Infrared Boron Dipyrromethene Donors for Organic Tandem Solar Cells, J. Am. Chem. Soc. 2017, 139, 13636-13639.

Yayang Wu, et al., β-Thiophene-Fused BF2-Azadipyrromethenes as Near-Infrared Dyes, Organic Letters, Nov. 29, 2013, 4 pp.

Extended European Search Report dated Oct. 23, 2020, of the corresponding European Patent Application No. 20181361.5.

Yayang Wu, et al., Org. Lett. 2014, 16, 748-751.

Effie Y. Zhou et al: "A Conformationally Restricted Aza-BODIPY Platform for Stimulus-Responsive Probes with Enhanced Photoacoustic Properties", Journal of the American Chemical Society, vol. 141, No. 44, Oct. 29, 2019 (Oct. 29, 2019), pp. 17601-17609.

Extended European Search Report dated Feb. 1, 2021, of the corresponding European Patent Application No. 20181361.5.

Siwar Chibani et al: "On the Computation of Adiabatic Energies in Aza-Boron-Dipyrromethene Dyes", Journal of Chemical Theory and Computation: JCTC, vol. 8, No. 9, Sep. 11, 2012 (Sep. 11, 2012), pp. 3303-3313.

* cited by examiner

COMPOUND AND FILM AND PHOTOELECTRIC DIODE AND ORGANIC SENSOR AND ELECTRONIC DEVICE

This application claims priority to and the benefit of Korean Patent Application No. 10-2019-0139719 filed in the Korean Intellectual Property Office on Nov. 4, 2019, and all the benefits accruing under 35 U.S.C. § 119, the entire contents of which are incorporated herein by reference.

BACKGROUND

1. Field

Compounds, film, photoelectric diodes, organic sensors, and electronic devices are disclosed.

2. Description of the Related Art

Imaging devices are used in digital cameras and camcorders, etc. to capture an image and to store the captured image as an electrical signal, and imaging devices include an image sensor that may separate incident light into separate components defined by separate wavelength spectrums and convert each separate component to an electrical signal.

Recently, there has been an increased interest in photoelectric diodes configured to detect light in the near infra-red and infrared wavelength spectrum with improved sensitivity of a sensor in a low illumination environment or for use in biometric devices.

SUMMARY

Some exemplary embodiments provide a compound that exhibits good light absorption properties in the near infra-red spectrum.

Some exemplary embodiments provide a film including the compound.

Some exemplary embodiments provide a photoelectric diode including the compound.

Some exemplary embodiments provide an organic sensor including the compound or the photoelectric diode.

Some exemplary embodiments provide an electronic device including the photoelectric diode or the organic sensor.

According to some exemplary embodiments, a compound represented by Chemical Formula 1 is provided.

Chemical Formula 1

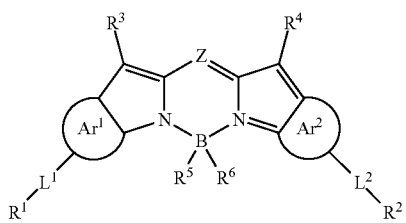

In Chemical Formula 1, $Ar^1$ and $Ar^2$ may independently be a substituted or unsubstituted benzene; a substituted or unsubstituted heterocycle including at least one N, O, S, Se, Te; or a combination thereof, or a fused ring of two or more of a substituted or unsubstituted benzene; a substituted or unsubstituted heterocycle, or a combination thereof, Z may be N or $CR^a$, wherein $R^a$ may be a substituted or unsubstituted heterocyclic group including at least one nitrogen, a C1 to C30 haloalkyl group, a C6 to C30 haloaryl group, a halogen, or a cyano group, $L^1$ and $L^2$ may independently be a single bond, a substituted or unsubstituted C6 to C30 arylene group, a divalent substituted or unsubstituted C3 to C30 heterocyclic group, or a combination thereof, $R^1$ may be a substituted or unsubstituted C3 to C30 heterocyclic group or $NR^bR^c$, wherein $R^b$ and $R^c$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof, and $R^b$ and $R^c$ may independently be present or $R^b$ and $R^c$ may be linked with each other to form a ring, $R^2$ may be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted silyl group, a halogen, a substituted or unsubstituted C6 to C30 aryl group, a substituted or unsubstituted C3 to C30 heterocyclic group, or $NR^dR^e$, wherein $R^d$ and $R^e$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof, and $R^d$ and $R^e$ may independently be present or $R^d$ and $R^e$ may be linked with each other to form a ring, $R^3$ and $R^4$ may independently be a substituted or unsubstituted C6 to C30 aryl group, a substituted or unsubstituted C3 to C30 heterocyclic group, or a combination thereof, and $R^5$ and $R^6$ together may be oxygen (=O), sulfur (=S), selenium (=Se), or tellurium (=Te), or $R^5$ and $R^6$ may be independently a substituted or unsubstituted C1 to C30 alkyl group, a substituted or unsubstituted C6 to C30 aryl group, a substituted or unsubstituted C3 to C30 heterocyclic group, a halogen, a cyano group, or a combination thereof.

$Ar^1$ and $Ar^2$ may independently be a substituted or unsubstituted benzene, a substituted or unsubstituted thiophene, a substituted or unsubstituted furan, a substituted or unsubstituted selenophene, a substituted or unsubstituted tellurophene, or a fused ring having two or more of a substituted or unsubstituted benzene, substituted or unsubstituted thiophene, substituted or unsubstituted furan, substituted or unsubstituted selenophene, substituted or unsubstituted tellurophene, or any combination thereof.

Z may be N or $CR^a$, wherein $R^a$ may be a substituted or unsubstituted pyridinyl group, a substituted or unsubstituted pyrimidinyl group, a substituted or unsubstituted triazinyl group, a substituted or unsubstituted pyrrolyl group, a substituted or unsubstituted pyrazolyl group, a substituted or unsubstituted triazolyl group, $CH_2F$, $CHF_2$, $CF_3$, F, or CN.

$L^1$ and $L^2$ may independently be a single bond; a substituted or unsubstituted phenylene group; a substituted or unsubstituted biphenylene group; a substituted or unsubstituted naphthylene group; a substituted or unsubstituted terphenylene group; a divalent substituted or unsubstituted C3 to C30 heterocyclic group including at least one O, S, Se, Te, N, Si; or a combination thereof, or a fused ring having two or more of a substituted or unsubstituted phenylene group; a substituted or unsubstituted biphenylene group; a substituted or unsubstituted naphthylene group; a substituted or unsubstituted terphenylene group; a divalent substituted or unsubstituted C3 to C30 heterocyclic group.

$R^1$ and $R^2$ may independently be represented by one of Chemical Formulae A-1 to A-4.

Chemical Formula A-1

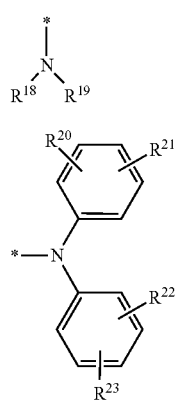

Chemical Formula A-2

Chemical Formula A-3

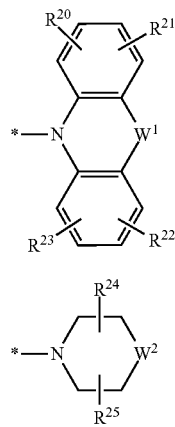

Chemical Formula A-4

In Chemical Formulae A-1 to A-4,
$W^1$ may be a single bond, O, S, Se, Te, $CR^fR^g$, or $SiR^hR^i$,
$W^2$ may be O, S, Se, Te, $CR^jR^k$, or $SiR^lR^m$,
$R^{18}$ to $R^{25}$ and $R^f$ to $R^m$ may independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen, or a combination thereof,
$R^{18}$ and $R^{19}$ may independently be present or $R^{18}$ and $R^{19}$ may be linked with each other to form a ring,
$R^{20}$ and $R^{21}$ may independently be present or $R^{20}$ and $R^{21}$ may be linked with each other to form a ring,
$R^{22}$ and $R^{23}$ may independently be present or $R^{22}$ and $R^{23}$ may be linked with each other to form a ring,
$R^{24}$ and $R^{25}$ may independently be present or $R^{24}$ and $R^{25}$ may be linked with each other to form a ring,
$R^f$ and $R^g$ may independently be present or $R^f$ and $R^g$ may be linked with each other to form a ring,
$R^h$ and $R^i$ may independently be present or $R^h$ and $R^i$ may be linked with each other to form a ring,
$R^j$ and $R^k$ may independently be present or $R^j$ and $R^k$ may be linked with each other to form a ring,
$R^l$ and $R^m$ may independently be present or $R^l$ and $R^m$ may be linked with each other to form a ring, and
* is a bond with Chemical Formula 1.
$R^1$ and $R^2$ may independently be represented by one of Chemical Formulae B-1 to B-6.

Chemical Formula B-1

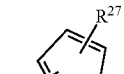

Chemical Formula B-2

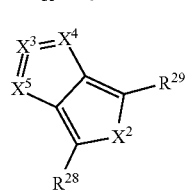

Chemical Formula B-3

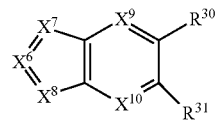

Chemical Formula B-4

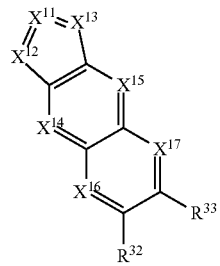

Chemical Formula B-5

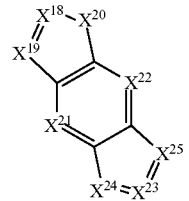

Chemical Formula B-6

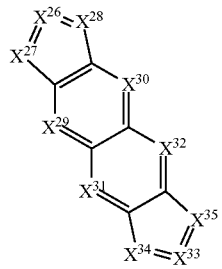

In Chemical Formulae B-1 to B-6,
$X^1$ to $X^{33}$ may independently be N, O, S, Se, Te, C, $CR^n$, or a combination thereof, $R^{26}$ to $R^{33}$ and $R''$ may independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen, a bond with Chemical Formula 1, or a combination thereof, wherein one of $R^{26}$ to $R^{33}$ and $R''$ is a bond with $L_1$ and one of $R^{26}$ to $R^{33}$ and $R''$ is a bond with $L_2$ of Chemical Formula 1.

$R^3$ and $R^4$ may independently be a substituted or unsubstituted phenyl group, a substituted or unsubstituted pyrrolyl group, a substituted or unsubstituted thiophenyl group, a substituted or unsubstituted furanyl group, a substituted or unsubstituted selenophenyl group, a substituted or unsubstituted tellurophenyl group, a fused ring having two or more of a substituted or unsubstituted phenyl group, a substituted or unsubstituted pyrrolyl group, a substituted or unsubstituted thiophenyl group, a substituted or unsubstituted furanyl group, a substituted or unsubstituted selenophenyl group, a substituted or unsubstituted tellurophenyl group, or a combination thereof, or a combination thereof.

The compound may be represented by one of Chemical Formulae 1a-1 to 1l-1.

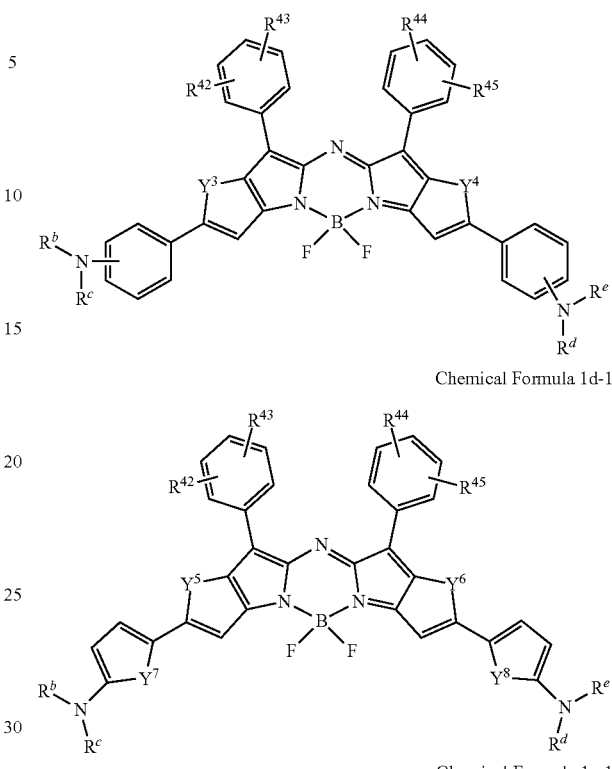

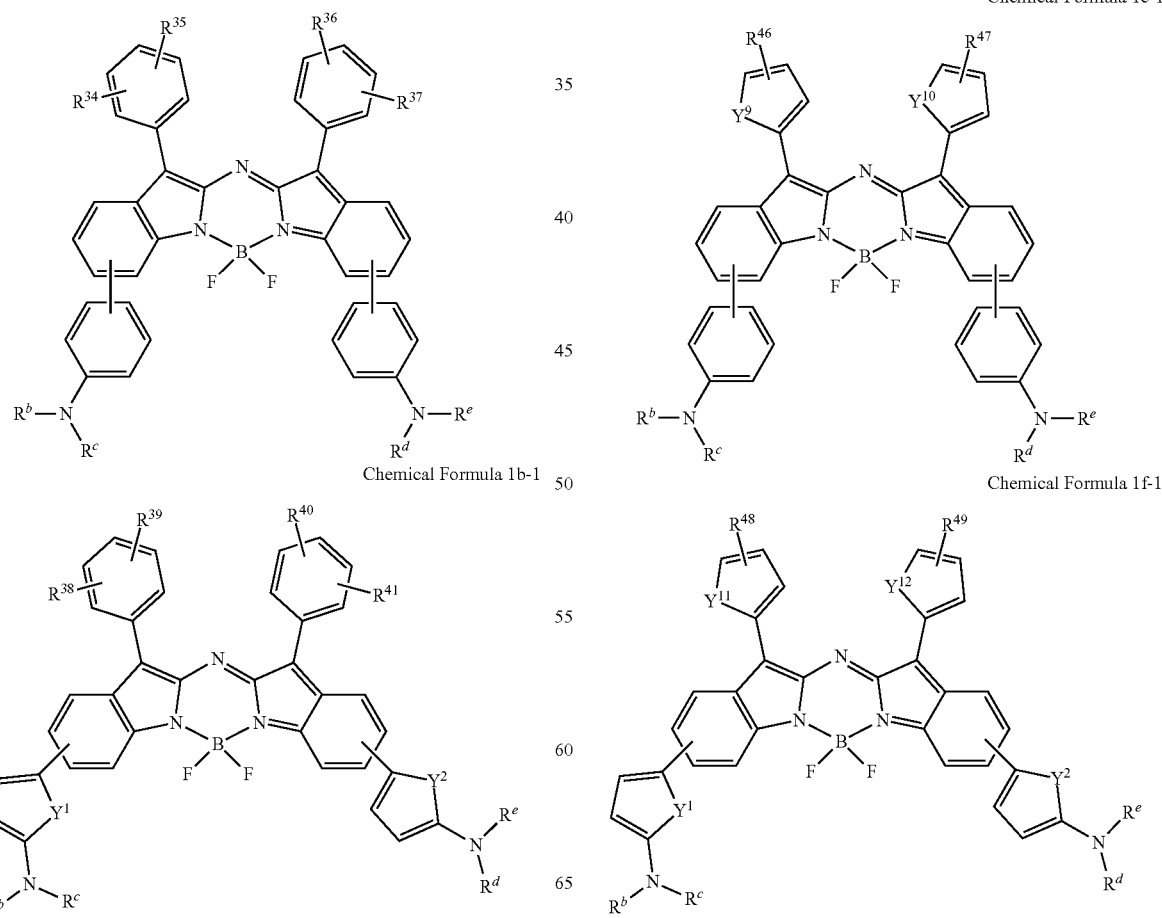

Chemical Formula 1g-1

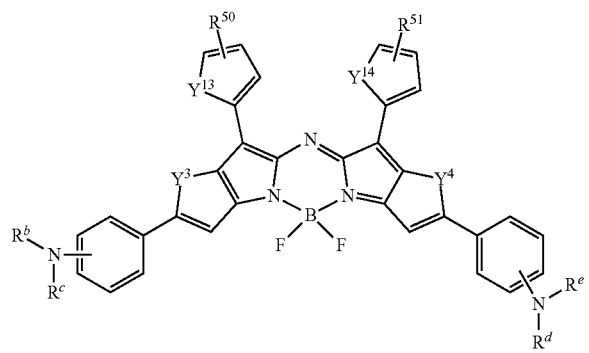

Chemical Formula 1h-1

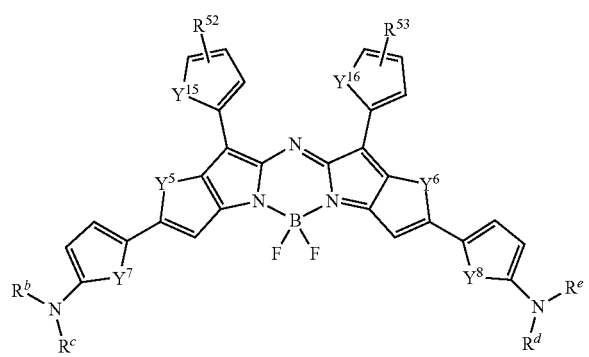

Chemical Formula 1i-1

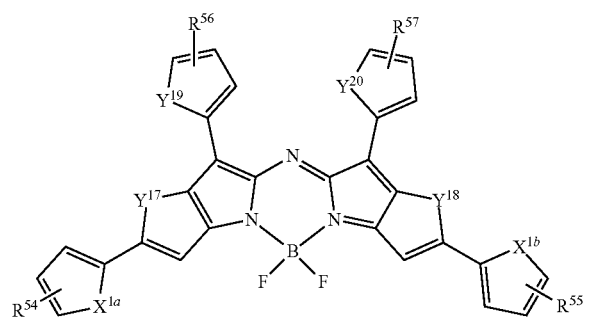

Chemical Formula 1j-1

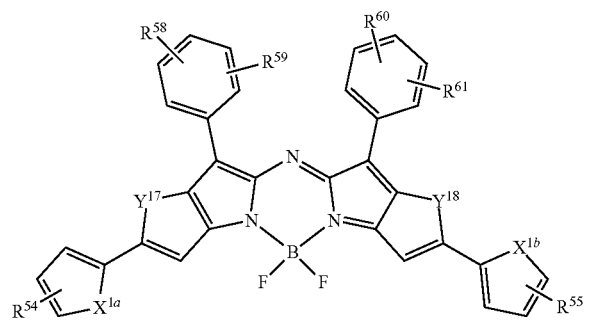

Chemical Formula 1k-1

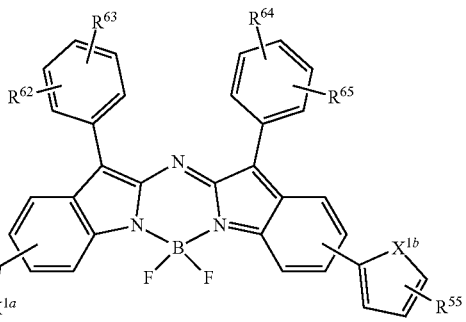

Chemical Formula 1l-1

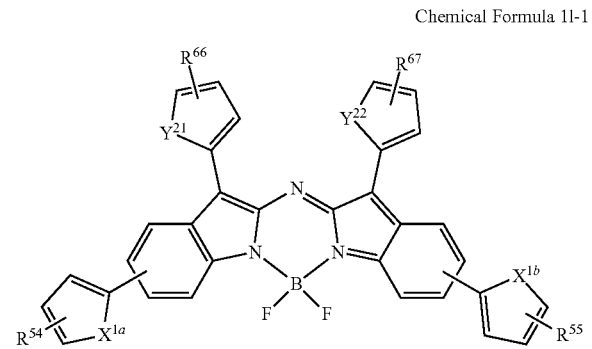

In Chemical Formulae 1a-1 to 1l-1, $R^b$ to $R^e$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof, $R^b$ and $R^c$ may independently be present or $R^b$ and $R^c$ may be linked with each other to form a ring, $R^d$ and $R^e$ may independently be present or $R^d$ and $R^e$ may be linked with each other to form a ring, $Y^1$ to $Y^{22}$ may independently be N, O, S, Se, Te, or a combination thereof, $X^{1a}$ and $X^{1b}$ may independently be N, O, S, Se, Te, $CR''$, or a combination thereof, and $R^{34}$ to $R^{67}$ and $R''$ may independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen or a combination thereof.

The compound may be represented by one of Chemical Formulae 1a-2 to 1l-2.

Chemical Formula 1a-2
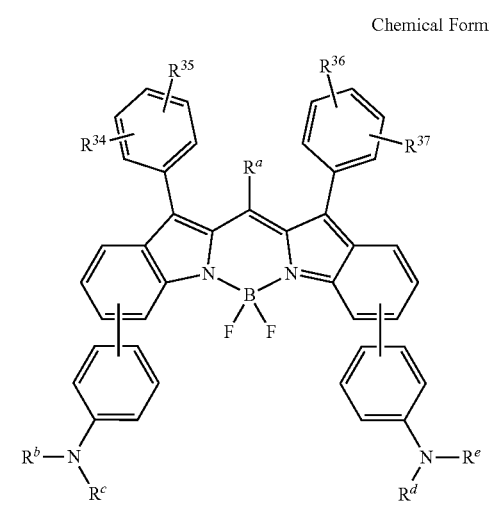
Chemical Formula 1b-2
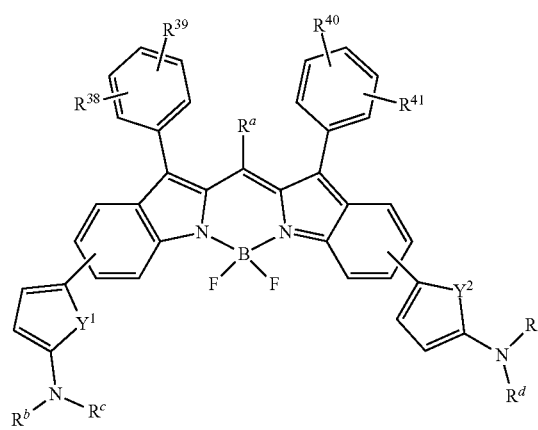
Chemical Formula 1c-2
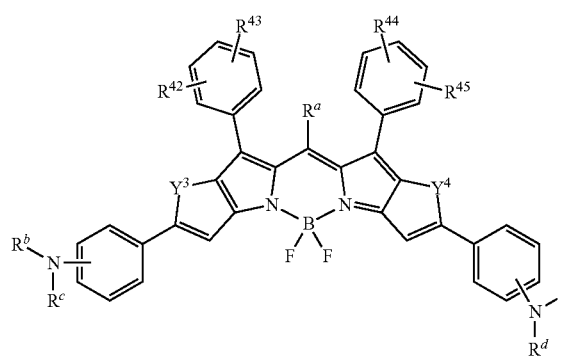
Chemical Formula 1d-2
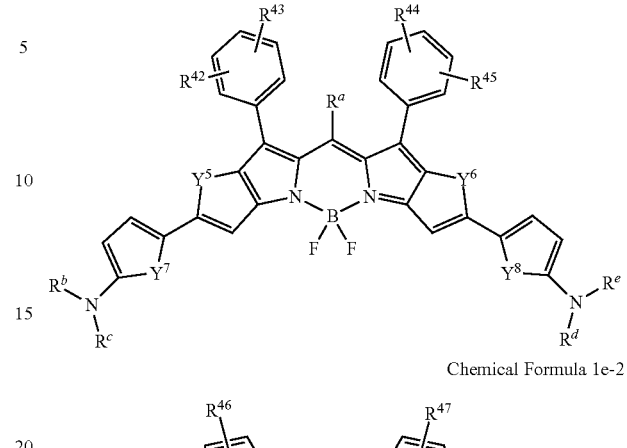
Chemical Formula 1e-2
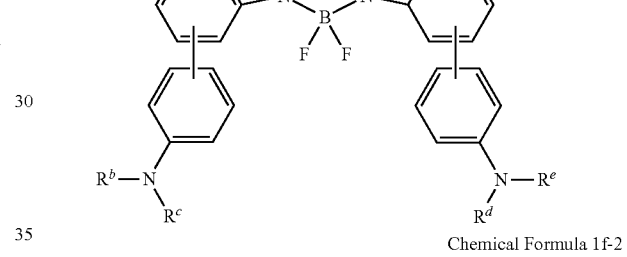
Chemical Formula 1f-2
Chemical Formula 1g-2
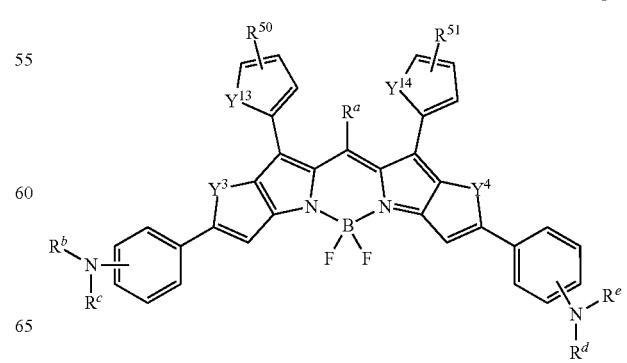

-continued

Chemical Formula 1h-2

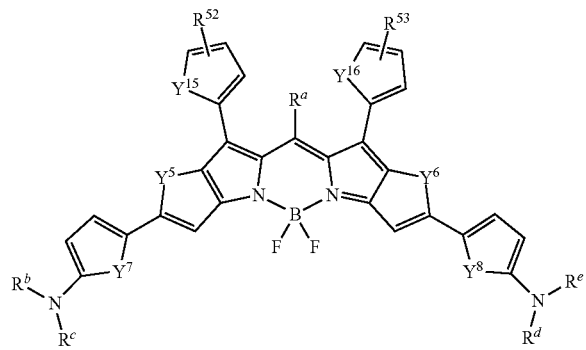

Chemical Formula 1i-2

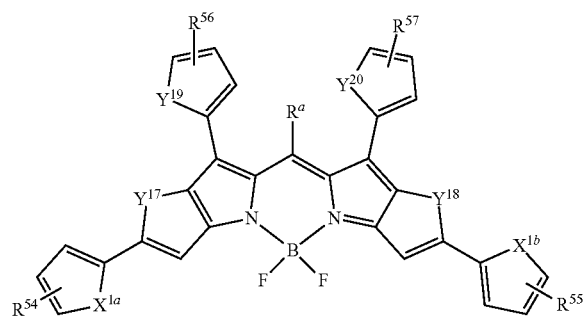

Chemical Formula 1j-2

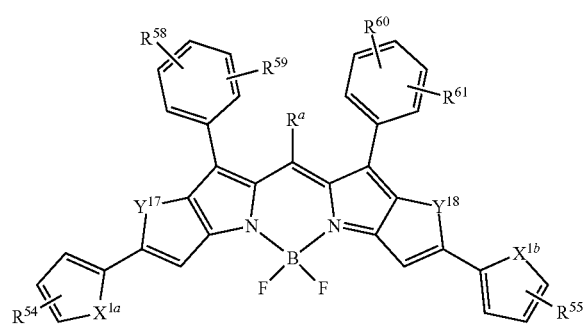

Chemical Formula 1k-2

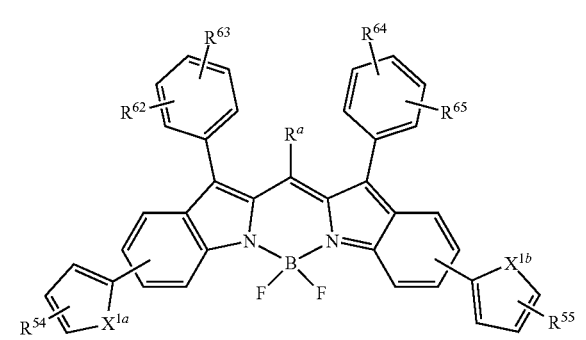

-continued

Chemical Formula 1l-2

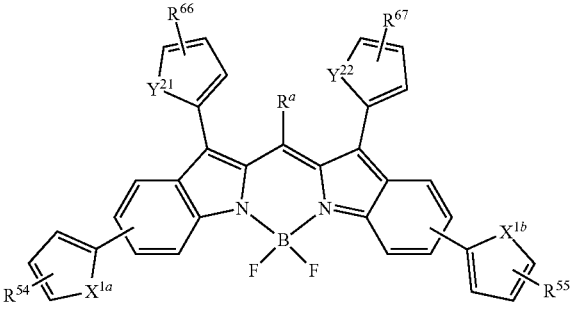

In Chemical Formulae 1a-2 to 1l-2, $R^a$ may be a substituted or unsubstituted pyridinyl group, a substituted or unsubstituted pyrimidinyl group, a substituted or unsubstituted triazinyl group, a substituted or unsubstituted pyrrolyl group, a substituted or unsubstituted pyrazolyl group, a substituted or unsubstituted triazolyl group, a C1 to C30 haloalkyl group, a C6 to C30 haloaryl group, a halogen, or a cyano group, $R^b$ to $R^e$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof, $R^b$ and $R^c$ may independently be present or $R^b$ and $R^c$ may be linked with each other to form a ring, $R^d$ and $R^e$ may independently be present or $R^d$ and $R^e$ may be linked with each other to form a ring, $Y^1$ to $Y^{22}$ may independently be N, O, S, Se, Te, or a combination thereof, $X^{1a}$ and $X^{1b}$ may independently be N, O, S, Se, Te, $CR''$, or a combination thereof, and $R^{34}$ to $R^{67}$ and $R''$ may independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen or a combination thereof.

A peak absorption wavelength of the compound may be in a wavelength spectrum of about 780 nm to about 3000 nm.

According to some exemplary embodiments, a film including the compound is provided.

According to some exemplary embodiments, a photoelectric diode includes a first electrode and a second electrode facing each other and an organic layer between the first electrode and the second electrode, wherein the organic layer includes the compound represented by Chemical Formula 1.

A peak absorption wavelength of the organic layer may belong to a wavelength spectrum of about 780 nm to about 3000 nm.

According to some exemplary embodiments, an organic sensor including the photoelectric diode is provided.

According to some exemplary embodiment, an electronic device including the photoelectric diode or the organic sensor is provided.

The compound with good light absorption properties in near infra-red regions may be effectively used in a photoelectric diode and/or an organic sensor.

DETAILED DESCRIPTION

Figure 1:
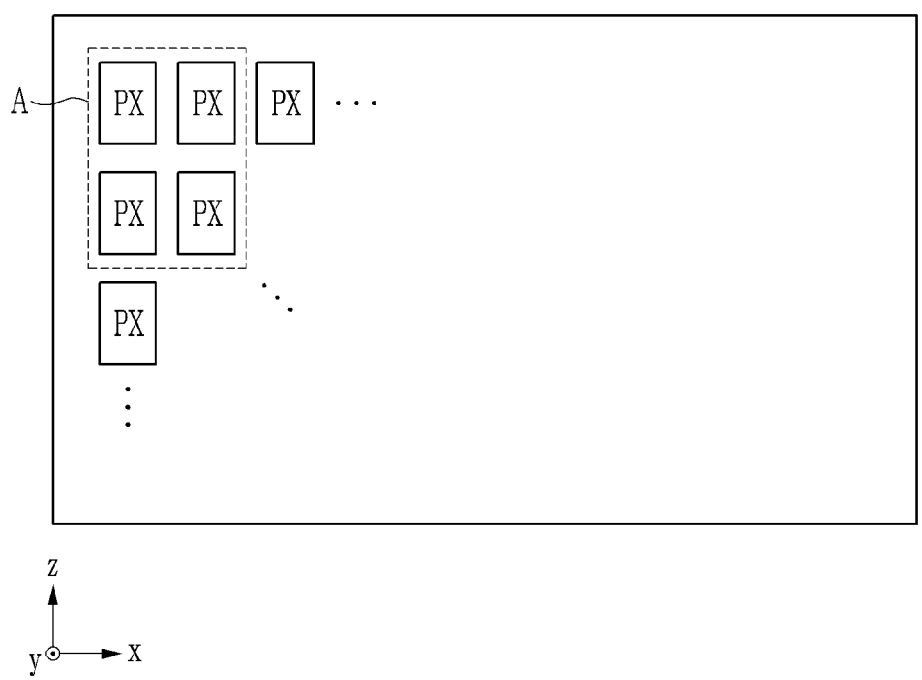
FIG. 1 is a schematic view showing an example of a pixel array of an organic sensor according to an exemplary embodiment.

Exemplary embodiments will hereinafter be described in detail, and may be easily performed by a person skilled in the related art. However, this disclosure may be embodied in many different forms and is not to be construed as limited to the exemplary embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

Hereinafter, as used herein, when a definition is not otherwise provided, "substituted" refers to replacement of hydrogen of a compound or a group by a substituent of a halogen atom, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof.

As used herein, when specific definition is not otherwise provided, "hetero" refers to one including 1 to 4 of N, O, S, Se, Te, Si, P, or a combination thereof.

As used herein, when a definition is not otherwise provided, the term "aromatic ring" refers to a cyclic functional group in which all ring-forming atoms have a p-orbital, wherein these p-orbitals are conjugated.

Hereinafter, as used herein, when a definition is not otherwise provided, "aryl group" refers to a group including at least one aromatic hydrocarbon moiety. All the elements of the hydrocarbon aromatic moiety have p-orbitals which form conjugation, for example a phenyl group, a naphthyl group, and the like; two or more aromatic hydrocarbon moieties may be linked by a sigma bond, for example a biphenyl group, a terphenyl group, a quarterphenyl group, and the like; and two or more aromatic hydrocarbon moieties may be fused directly or indirectly to provide a non-aromatic fused ring, for example a fluorenyl group. The aryl group may include a monocyclic, polycyclic or fused ring polycyclic (i.e., rings sharing adjacent pairs of carbon atoms) functional group.

Hereinafter, as used herein, when a definition is not otherwise provided, "heterocyclic group" refers to a group obtained by replacing carbon atoms in a ring of an aryl group, alicyclic hydrocarbon group, or a fused ring thereof with at least one of N, O, S, Se, Te, P, Si, or a combination thereof. Hereinafter, as used herein, when a definition is not otherwise provided, "ring" refers to an aromatic ring, a non-aromatic ring, a heteroaromatic ring, a hetero non-aromatic ring, a fused ring thereof, and/or a combination thereof.

Hereinafter, as used herein, when a definition is not otherwise provided, the term "C1 to C30 alkyl group" as used herein refers to a linear or branched saturated aliphatic hydrocarbons monovalent group having 1 to 30 carbon atoms.

Hereinafter, as used herein, when a definition is not otherwise provided, the term "C1 to C30 alkoxy group" used herein refers to a monovalent group represented by —OA$_{101}$ (wherein A$_{101}$ is the C1 to C30 alkyl group), and examples thereof are a methoxy group, an ethoxy group, a propoxy group, a butoxy group, and a pentoxy group.

Hereinafter, as used herein, when a definition is not otherwise provided, the term "C2 to C30 alkenyl group" as used herein refers to a hydrocarbon group formed by substituting at least one carbon-carbon double bond in the middle or at the terminus of the C2 to C30 alkyl group, and examples thereof include an ethenyl group, a propenyl group, and a butenyl group.

Hereinafter, as used herein, when a definition is not otherwise provided, the term "C2 to C30 alkynyl group" as used herein refers to a hydrocarbon group formed by substituting at least one carbon-carbon triple bond in the middle or at the terminus of the C2 to C30 alkyl group, and examples thereof include an ethynyl group, and a propynyl group.

Hereinafter, as used herein, when a definition is not otherwise provided, the term "haloalkyl group" refers to an alkyl group where at least one hydrogen is replaced by F, Cl, Br, I, or a combination thereof. Specific examples of a haloalkyl group may be a fluoroalkyl group, for example a perfluoroalkyl group.

Hereinafter, as used herein, when a definition is not otherwise provided, the term "haloaryl group" refers to an aryl group where at least one hydrogen is replaced by F, Cl, Br, I, or a combination thereof. Specific examples of a haloaryl group may be a fluoroaryl group, for example a perfluoroaryl group.

Hereinafter, a compound according to an embodiment is described.

The compound according to an embodiment may be represented by Chemical Formula 1.

Chemical Formula 1

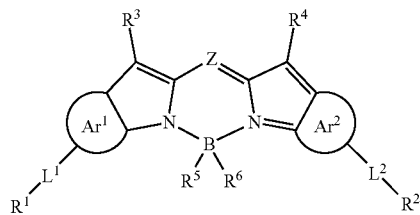

In Chemical Formula 1,

Ar$^1$ and Ar$^2$ may independently be a substituted or unsubstituted benzene; a substituted or unsubstituted heterocycle including at least one N, O, S, Se, Te, or any combination thereof; or a fused ring having two or more of a substituted or unsubstituted benzene; a substituted or unsubstituted heterocycle, or a combination thereof, Z may be N or CR$^a$, wherein R$^a$ may be an electron withdrawing group, L$^1$ and L$^2$ may independently be a single bond, a substituted or unsubstituted C6 to C30 arylene group, a divalent substituted or unsubstituted C3 to C30 heterocyclic group, or a combination thereof, R$^1$ may be a substituted or unsubstituted C3 to C30 heterocyclic group or NR$^b$R$^c$, wherein R$^b$ and R$^c$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof, and R$^b$ and R$^c$ may independently be present or R$^b$ and R$^c$ may be linked with each other to form a ring, R$^2$ may be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted silyl group, a halogen, a substituted or unsubstituted C6 to C30 aryl group, a substituted or unsubstituted C3 to C30 heterocyclic group or $NR^dR^e$, wherein $R^d$ and $R^e$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof, and $R^d$ and $R^e$ may independently be present or $R^d$ and $R^e$ may be linked with each other to form a ring, $R^3$ and $R^4$ may independently be a substituted or unsubstituted C6 to C30 aryl group, a substituted or unsubstituted C3 to C30 heterocyclic group, or a combination thereof, and $R^5$ and $R^6$ together may be oxygen (=O), sulfur (=S), selenium (=Se), or tellurium (=Te), or $R^5$ and $R^6$ may independently be a substituted or unsubstituted C1 to C30 alkyl group, a substituted or unsubstituted C6 to C30 aryl group, a substituted or unsubstituted C3 to C30 heterocyclic group, a halogen, a cyano group, or a combination thereof.

The compound has a structure in which two pyrroles form a complex with a disubstituted boron atom. The compound may be configured to absorb light in the near infra-red wavelength spectrum and may exhibit good electrical properties, by combining a core and/or a substituent with a moiety that imparts electron donating properties.

A peak absorption wavelength ($\lambda_{max}$) of the compound may be for example greater than or equal to about 700 nm, for example greater than or equal to about 720 nm, greater than or equal to about 730 nm, greater than or equal to about 750 nm, greater than or equal to about 780 nm, greater than or equal to about 790 nm, greater than or equal to about 800 nm, greater than or equal to about 810 nm, greater than or equal to about 820 nm, greater than or equal to about 830 nm, greater than or equal to about 840 nm, greater than or equal to about 850 nm, greater than or equal to about 870 nm, greater than or equal to about 890 nm, greater than or equal to about 900 nm, or greater than or equal to about 910 nm. The peak absorption wavelength of the compound may be for example in a wavelength spectrum of about 700 nm to about 3000 nm, within the range, for example about 750 nm to about 2500 nm, about 780 nm to about 2200 nm, about 790 nm to about 2100 nm, about 800 nm to about 2000 nm, about 810 nm to about 2000 nm, about 820 nm to about 2000 nm, about 830 nm to about 2000 nm, about 850 nm to about 1900 nm, about 870 nm to about 1800 nm, about 900 nm to about 1600 nm, or about 910 nm to about 1500 nm.

For example, $Ar^1$ and $Ar^2$ may independently be a substituted or unsubstituted benzene, a substituted or unsubstituted thiophene, a substituted or unsubstituted furan, a substituted or unsubstituted selenophene, a substituted or unsubstituted tellurophene, a fused ring having two or more of a substituted or unsubstituted benzene, a substituted or unsubstituted thiophene, a substituted or unsubstituted furan, a substituted or unsubstituted selenophene, a substituted or unsubstituted tellurophene, or a combination thereof, or a combination thereof.

For example, $Ar^1$ and $Ar^2$ may independently be a substituted or unsubstituted benzene, a substituted or unsubstituted naphthalene, a substituted or unsubstituted thiophene, a substituted or unsubstituted benzothiophene, a substituted or unsubstituted dibenzothiophene, a substituted or unsubstituted furan, a substituted or unsubstituted benzofuran, a substituted or unsubstituted dibenzofuran, a substituted or unsubstituted selenophene, a substituted or unsubstituted benzoselenophene, a substituted or unsubstituted dibenzoselenophene, a substituted or unsubstituted tellurophene, a substituted or unsubstituted benzotellurophene, a substituted or unsubstituted dibenzotellurophene, or a combination thereof.

For example, $Ar^1$ and $Ar^2$ may be the same.

For example, $Ar^1$ and $Ar^2$ may be different.

For example, Z may be nitrogen (N) or carbon substituted with an electron withdrawing group ($R^a$), wherein the electron withdrawing group may be for example a substituted or unsubstituted heterocyclic group including at least one nitrogen; a C1 to C30 haloalkyl group; a C6 to C30 haloaryl group; a halogen; a cyano group; or a combination thereof. For example, the electron withdrawing group ($R^a$) may be a substituted or unsubstituted pyridinyl group, a substituted or unsubstituted pyrimidinyl group, a substituted or unsubstituted triazinyl group, a substituted or unsubstituted pyrrolyl group, a substituted or unsubstituted pyrazolyl group, a substituted or unsubstituted triazolyl group, $CH_2F$, $CHF_2$, $CF_3$, F, or CN.

For example, $L^1$ and $L^2$ may independently be a single bond; a substituted or unsubstituted phenylene group; a substituted or unsubstituted biphenylene group; a substituted or unsubstituted naphthylene group; a substituted or unsubstituted terphenylene group; a divalent substituted or unsubstituted C3 to C30 heterocyclic group including at least one O, S, Se, Te, N, Si; or a combination thereof, a fused ring having two or more of a substituted or unsubstituted phenylene group; a substituted or unsubstituted biphenylene group; a substituted or unsubstituted naphthylene group; a substituted or unsubstituted terphenylene group; a divalent substituted or unsubstituted C3 to C30 heterocyclic group, or a combination thereof, or a combination thereof. For example, $L^1$ and $L^2$ may independently be a single bond, a substituted or unsubstituted p-phenylene group, a substituted or unsubstituted m-phenylene group, a substituted or unsubstituted o-phenylene group, a substituted or unsubstituted biphenylene group, a substituted or unsubstituted naphthylene group, a substituted or unsubstituted terphenylene group, a substituted or unsubstituted thiophenylene group, a substituted or unsubstituted benzothiophenylene group, a substituted or unsubstituted dibenzothiophenylene group, a substituted or unsubstituted furanylene group, a substituted or unsubstituted benzofuranylene group, a substituted or unsubstituted dibenzofuranylene group, a substituted or unsubstituted selenophenylene group, a substituted or unsubstituted benzoselenophenylene group, a substituted or unsubstituted dibenzoselenophenylene group, a substituted or unsubstituted tellurophenylene group, a substituted or unsubstituted benzotellurophenylene group, a substituted or unsubstituted dibenzotellurophenylene group, a substituted or unsubstituted pyrrolylene group, a substituted or unsubstituted benzopyrrolylene group, a substituted or unsubstituted Dibenzopyrrolylene group, or a combination thereof.

For example, $L^1$ and $L^2$ may be the same.

For example, $L^1$ and $L^2$ may be the different.

For example, $R^1$ and $R^2$ may be the same or different substituted or unsubstituted amine group and may be, for example independently represented by one of Chemical Formulae A-1 to A-4.

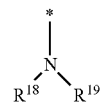

Chemical Formula A-1

-continued

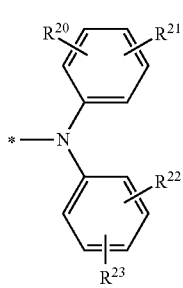
Chemical Formula A-2

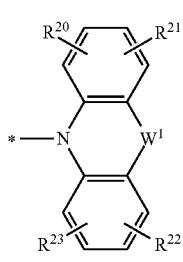
Chemical Formula A-3

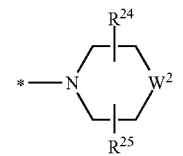
Chemical Formula A-4

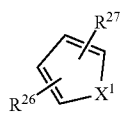
Chemical Formula B-1

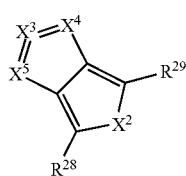
Chemical Formula B-2

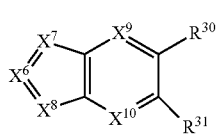
Chemical Formula B-3

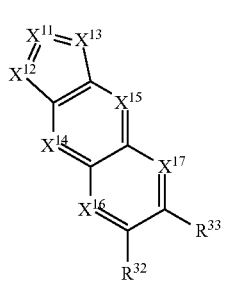
Chemical Formula B-4

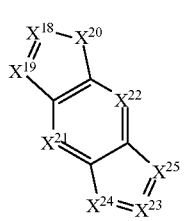
Chemical Formula B-5

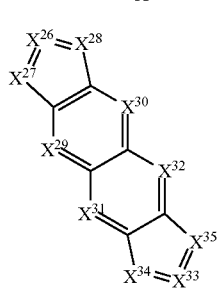
Chemical Formula B-6

In Chemical Formulae A-1 to A-4, $W^1$ is a single bond, O, S, Se, Te, $CR^fR^g$, or $SiR^hR^i$, $W^2$ is O, S, Se, Te, $CR^jR^k$, or $SiR^lR^m$, $R^{18}$ to $R^{25}$ and $R^f$ to $R^m$ are independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen, or a combination thereof, $R^{18}$ and $R^{19}$ may independently be present or $R^{18}$ and $R^{19}$ may be linked with each other to form a ring, $R^{20}$ and $R^{21}$ may independently be present or $R^{20}$ and $R^{21}$ may be linked with each other to form a ring, $R^{22}$ and $R^{23}$ may independently be present or $R^{22}$ and $R^{23}$ may be linked with each other to form a ring, $R^{24}$ and $R^{25}$ may independently be present or $R^{24}$ and $R^{25}$ may be linked with each other to form a ring, $R^f$ and $R^g$ may independently be present or $R^f$ and $R^g$ may be linked with each other to form a ring, $R^h$ and $R^i$ may independently be present or $R^h$ and $R^i$ may be linked with each other to form a ring, $R^j$ and $R^k$ may independently be present or $R^j$ and $R^k$ may be linked with each other to form a ring, $R^l$ and $R^m$ may independently be present or $R^l$ and $R^m$ may be linked with each other to form a ring, and

* is a bond with Chemical Formula 1.

For example, in Formula 1, $R^1$ and $R^2$ may be the same or different substituted or unsubstituted heterocyclic group and may be, for example, independently represented by one of Chemical Formulae B-1 to B-6.

In Chemical Formulae B-1 to B-6, $X^1$ to $X^{35}$ may independently be N, O, S, Se, Te, C, or $CR''$, or a combination thereof, and $R^{26}$ to $R^{33}$ and $R''$ may independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen, a bond with Chemical Formula 1, or a combination thereof, wherein one of $R^{26}$ to $R^{33}$ and $R''$ is a bond with $L_1$ and one of $R^{26}$ to $R^{33}$ and $R''$ is a bond with $L_2$ of Chemical Formula 1.

For example, $X^1$ and $X^2$ may independently be O, S, Se, or Te.

For example, $X^1$ and $X^2$ may independently be O or S.

For example, $X^3$, $X^6$, $X^{11}$, $X^{18}$, $X^{23}$, $X^{26}$, and $X^{33}$ may independently be O, S, Se, Te, C, or CR''.

For example, $X^3$, $X^6$, $X^{11}$, $X^{18}$, $X^{23}$, $X^{26}$, and $X^{33}$ may independently be O, S, or CR''.

For example, $X^4$, $X^5$, $X^7$ to $X^{10}$, $X^{12}$ to $X^{17}$, $X^{19}$ to $X^{22}$, $X^{24}$, $X^{25}$, $X^{27}$ to $X^{32}$, $X^{34}$, and $X^{35}$ may independently be N or CR''.

For example, $R^1$ and $R^2$ of Formula 1 may be a group derived from one of compounds in Group 1, but are not limited thereto:

Group 1

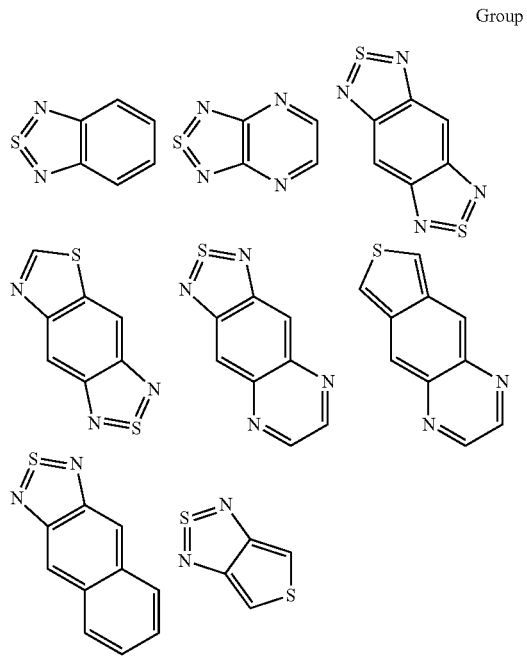

wherein $R_1$ of Group 1 is attached to Chemical Formula 1 via a single bond between a carbon atom of a compound of Group 1 and $L_1$ and $R_2$ of Group 1 is attached to Chemical Formula 1 via a single bond between a carbon atom of a compound of Group 1 and $L_2$.

For example, in Formula 1, $R^3$ and $R^4$ may independently be a substituted or unsubstituted C6 to C30 aryl group; a substituted or unsubstituted heterocycle group including at least one N, O, S, Se, Te, or a combination thereof; or a combination thereof. For example, $R^3$ and $R^4$ may independently be a substituted or unsubstituted phenyl group, a substituted or unsubstituted pyrrolyl group, a substituted or unsubstituted thiophenyl group, a substituted or unsubstituted furanyl group, a substituted or unsubstituted selenophenyl group, a substituted or unsubstituted tellurophenyl group, a fused ring having two or more of a substituted or unsubstituted phenyl group, a substituted or unsubstituted pyrrolyl group, a substituted or unsubstituted thiophenyl group, a substituted or unsubstituted furanyl group, a substituted or unsubstituted selenophenyl group, a substituted or unsubstituted tellurophenyl group, or a combination thereof, or a combination thereof, and for example $R^3$ and $R^4$ may independently be a substituted or unsubstituted phenyl group, a substituted or unsubstituted naphthyl group, a substituted or unsubstituted thiophenyl group, a substituted or unsubstituted benzothiophenyl group, a substituted or unsubstituted dibenzothiophenyl group, a substituted or unsubstituted furanyl group, a substituted or unsubstituted benzofuranyl group, a substituted or unsubstituted dibenzofuranyl group, a substituted or unsubstituted selenophenyl group, a substituted or unsubstituted benzoselenophenyl group, a substituted or unsubstituted dibenzoselenophenyl group, a substituted or unsubstituted tellurophenyl group, a substituted or unsubstituted benzotellurophenyl group, a substituted or unsubstituted dibenzotellurophenyl group, a substituted or unsubstituted pyrrolyl group, a substituted or unsubstituted benzopyrrolyl group, a substituted or unsubstituted dibenzopyrrolyl group, or a combination thereof. Herein "substituted" may refer to replacement of at least one hydrogen with for example a C1 to C20 alkyl group, a C1 to C20 haloalkyl group, a C1 to C20 alkoxy group, a C6 to C30 aryl group, or a C3 to C30 heterocyclic group, or a combination thereof, but is not limited thereto.

For example, $R^3$ and $R^4$ may be the same.

For example, $R^3$ and $R^4$ may be the different.

For example, $R^5$ and $R^6$ may independently be a halogen or a C1 to C20 haloalkyl group and $R^5$ and $R^6$ may be for example fluorine.

For example, $R^5$ and $R^6$ may be the same.

For example, $R^5$ and $R^6$ may be the different.

For example, Z may be N.

The compound of Formula 1 may be represented by one of Chemical Formulae 1a-1 to 1l-1.

Chemical Formula 1a-1

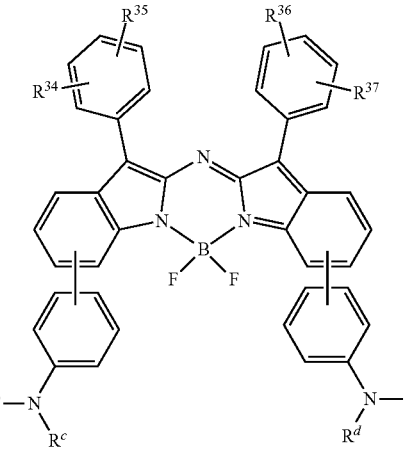

Chemical Formula 1b-1

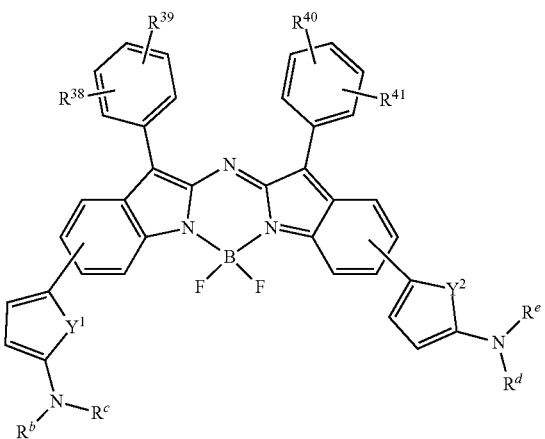

-continued
Chemical Formula 1c-1
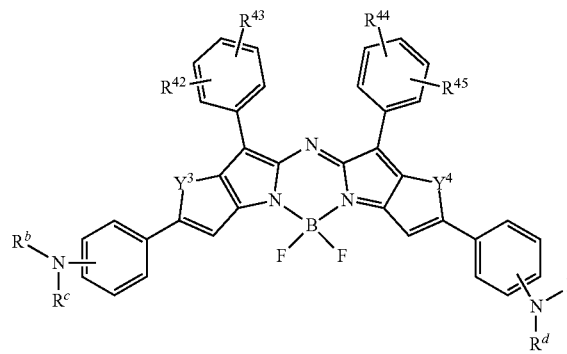
Chemical Formula 1d-1
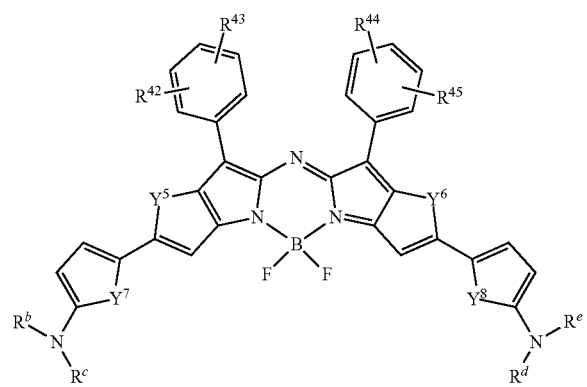
Chemical Formula 1e-1
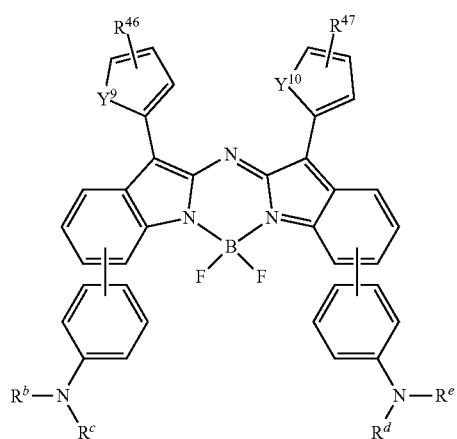
Chemical Formula 1f-1
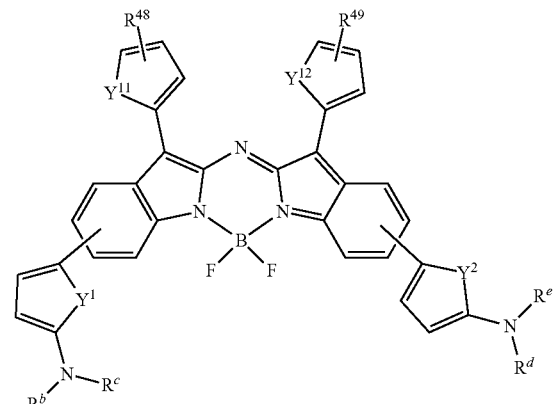
Chemical Formula 1g-1
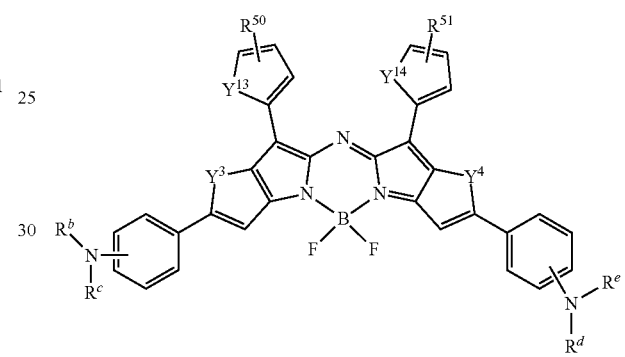
Chemical Formula 1h-1
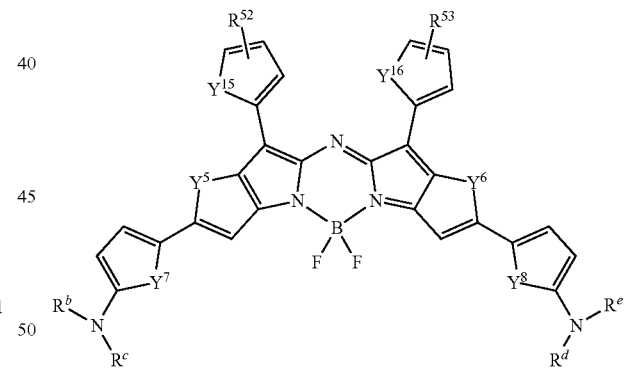
Chemical Formula 1i-1
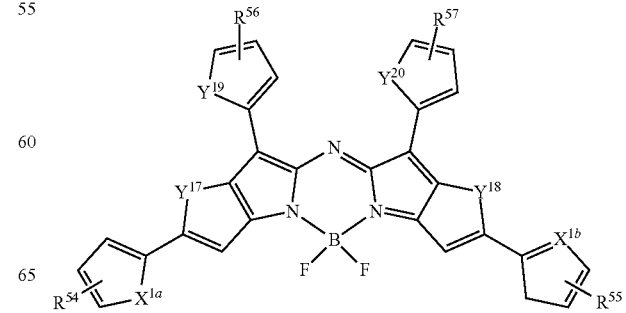

-continued

Chemical Formula 1j-1

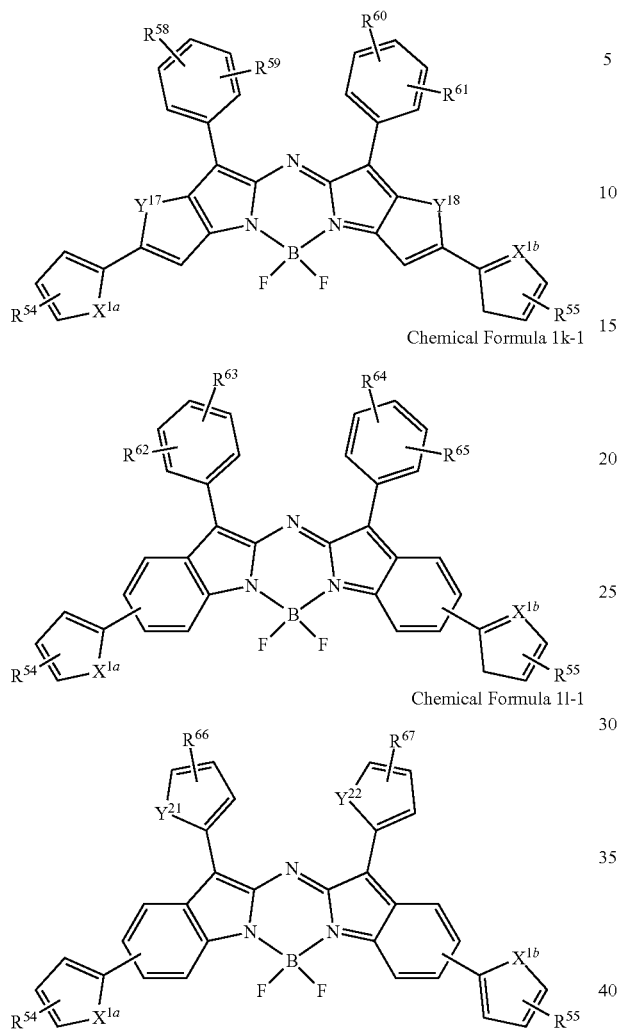

Chemical Formula 1k-1

Chemical Formula 1l-1

In Chemical Formulae 1a-1 to 1l-1,

R$^b$ to R$^e$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof, R$^b$ and R$^c$ may independently be present or R$^b$ and R$^c$ may be linked with each other to form a ring, R$^d$ and R$^e$ may independently be present or R$^d$ and R$^e$ may be linked with each other to form a ring, Y$^1$ to Y$^{22}$ may independently be N, O, S, Se, Te, or a combination thereof, X$^{1a}$ and X$^{1b}$ may independently be N, O, S, Se, Te, or CR'', and R$^{34}$ to R$^{67}$ and R'' may independently be hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen or a combination thereof.

For example, Z may be CR$^a$.

The compound of Formula 1 may be represented by one of Chemical Formulae 1a-2 to 1l-2.

Chemical Formula 1a-2

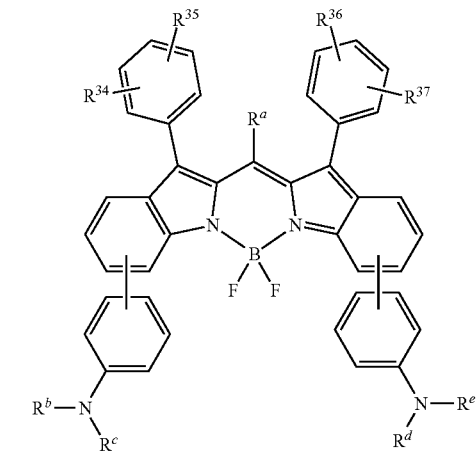

Chemical Formula 1b-2

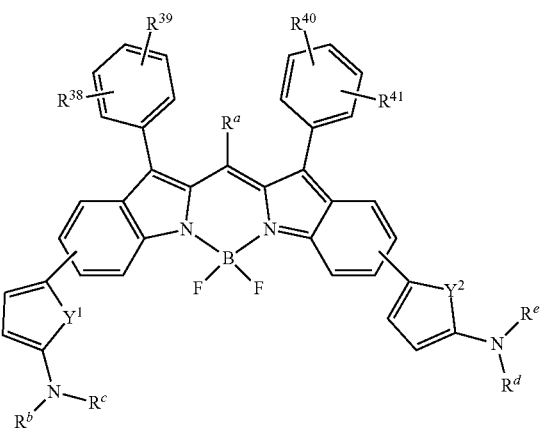

Chemical Formula 1c-2

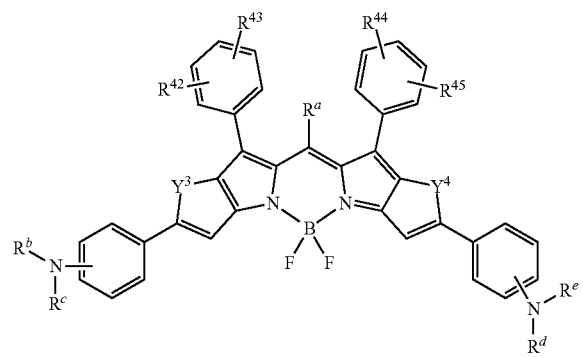

Chemical Formula 1d-2
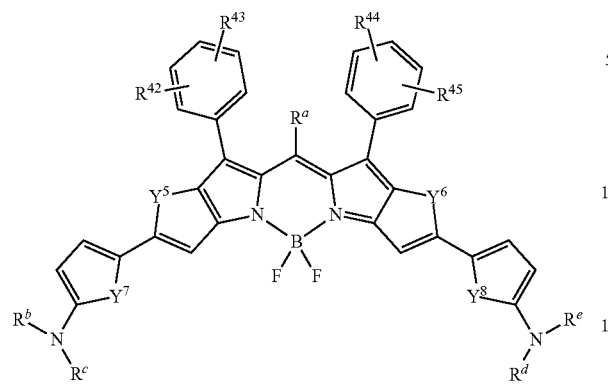
Chemical Formula 1e-2
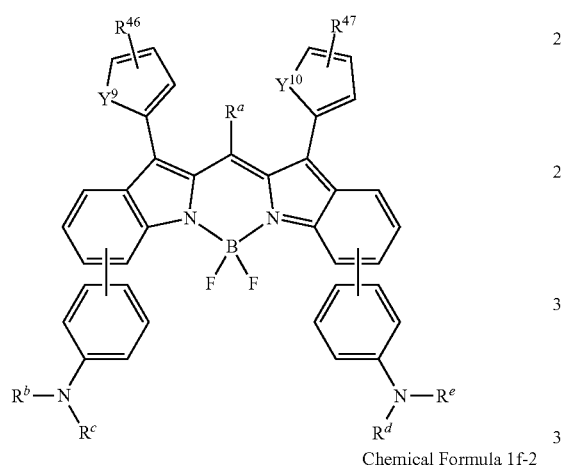
Chemical Formula 1f-2
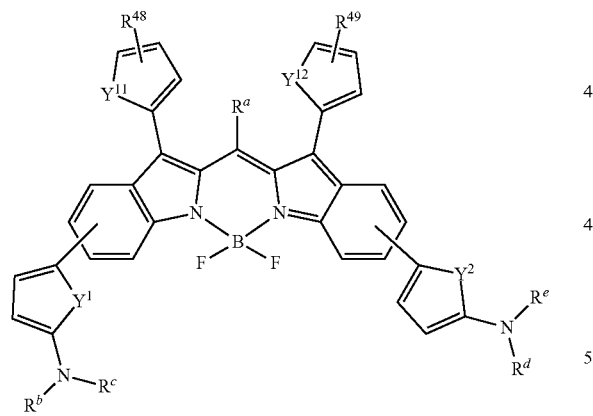
Chemical Formula 1g-2
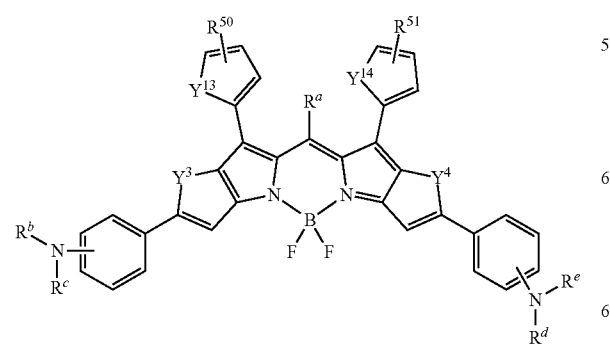
Chemical Formula 1h-2
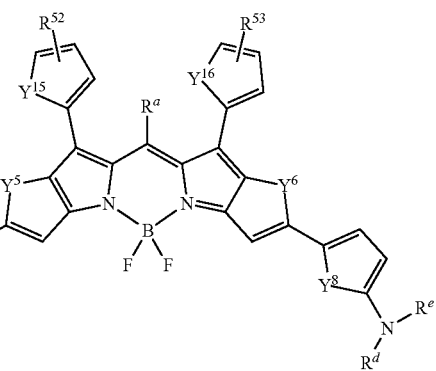
Chemical Formula 1i-2
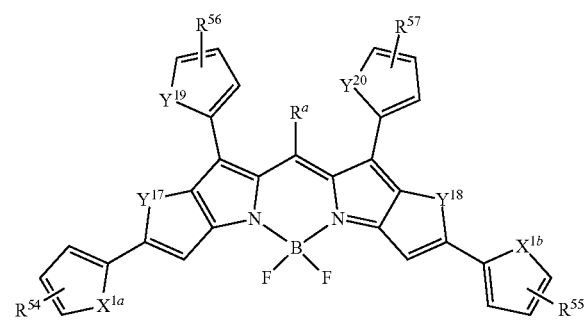
Chemical Formula 1j-2
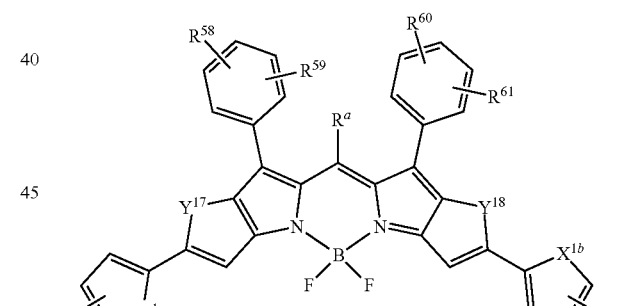
Chemical Formula 1k-2
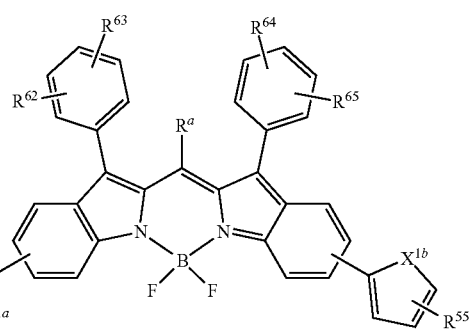

Chemical Formula 1l-2

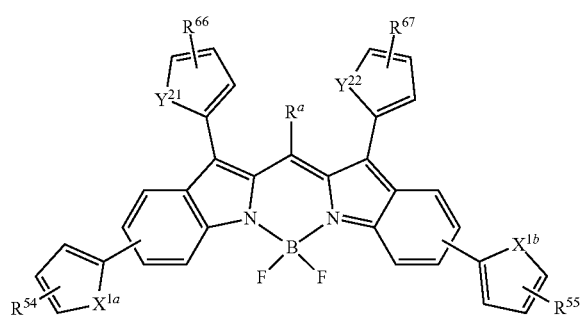

In Chemical Formulae 1a-2 to 1l-2, $R^a$ may be a substituted or unsubstituted pyridinyl group, a substituted or unsubstituted pyrimidinyl group, a substituted or unsubstituted triazinyl group, a substituted or unsubstituted pyrrolyl group, a substituted or unsubstituted pyrazolyl group, a substituted or unsubstituted triazolyl group, C1 to C30 haloalkyl group, C6 to C30 haloaryl group, a halogen, or a cyano group, $R^b$ to $R^e$, $Y^1$ to $Y^{22}$, $X^{1a}$ and $X^{1b}$, $R^{34}$ to $R^{67}$, and $R''$ may be the same as described above.

For example, the compound of Formula 1 may be one of compounds of Group 2, but is not limited thereto.

Group 2

1

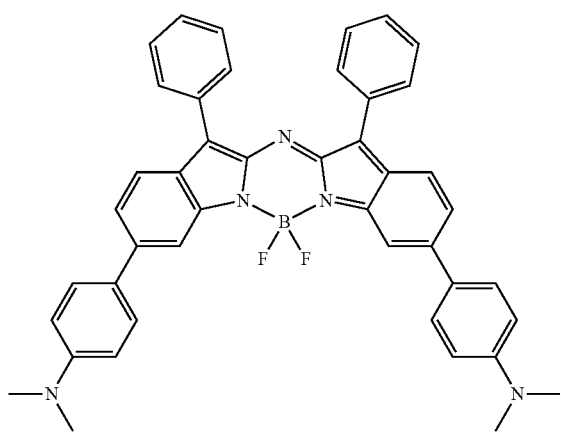

2

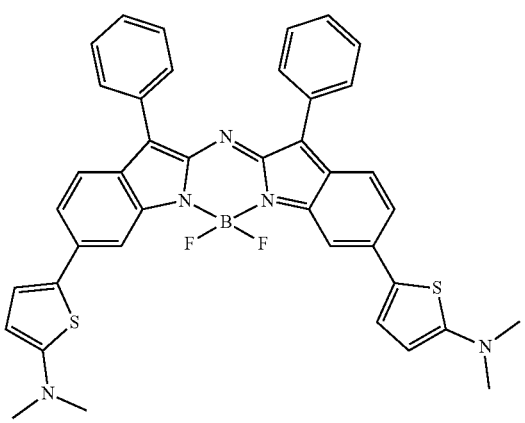

3

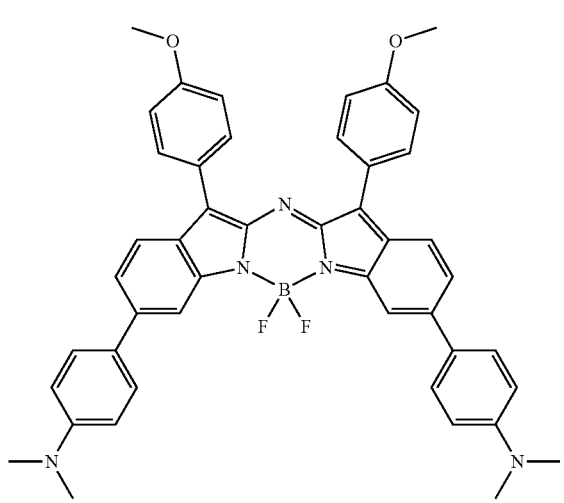

4

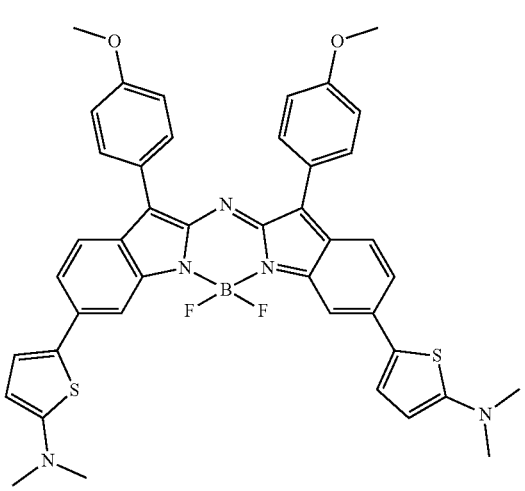

5
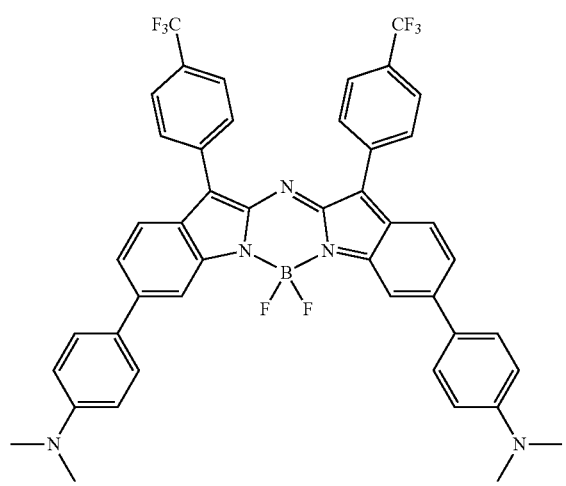
6
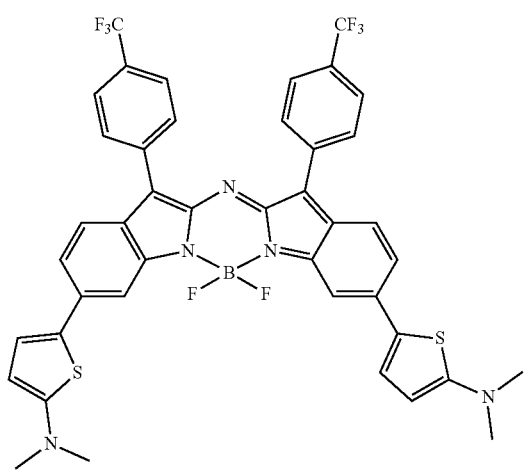
7
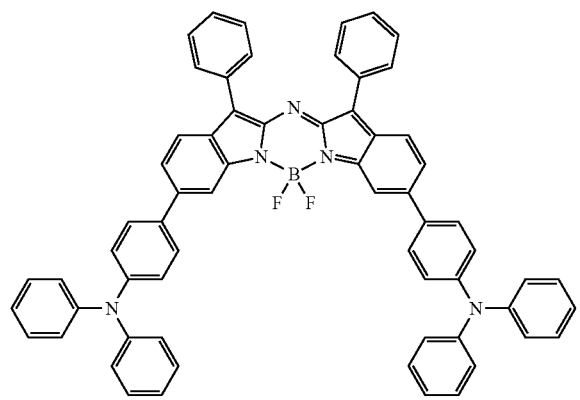
8
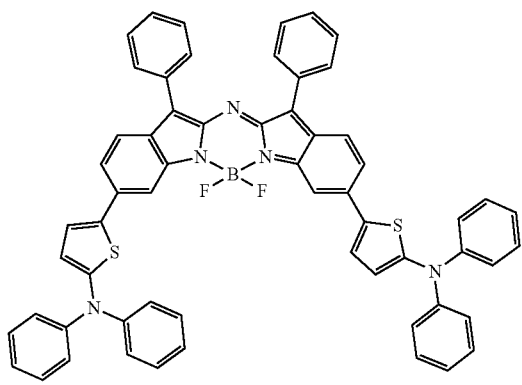
9
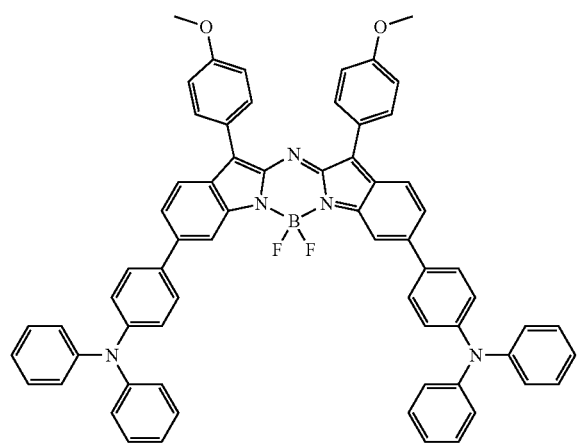
10
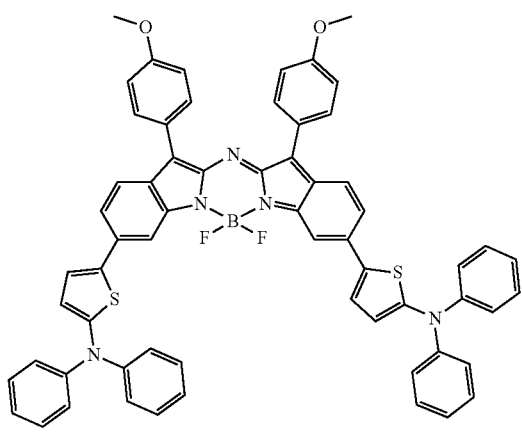

-continued
11
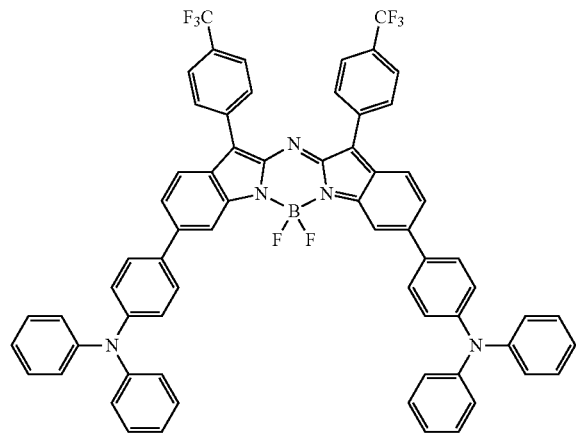
12
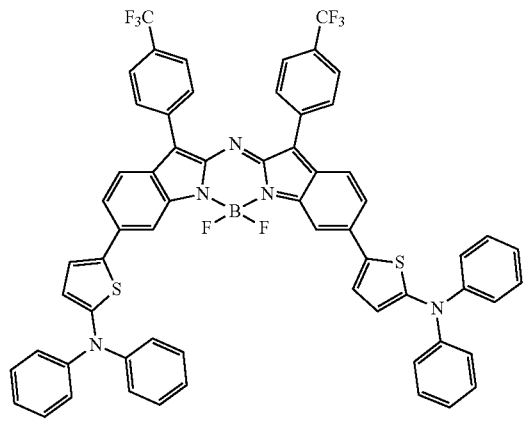
13
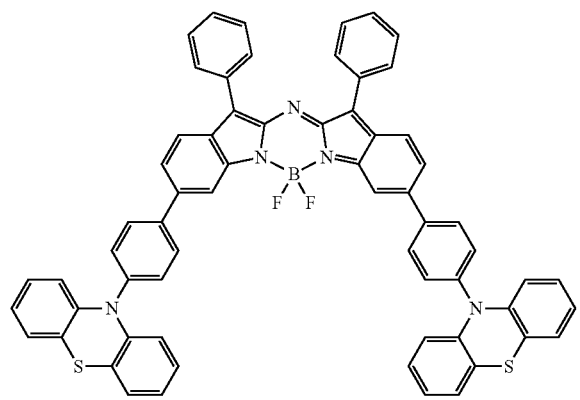
14
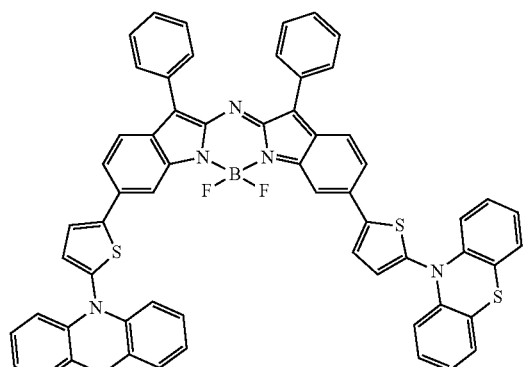
15
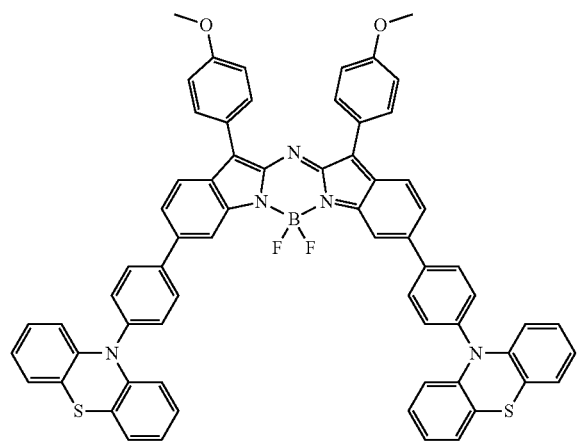
16
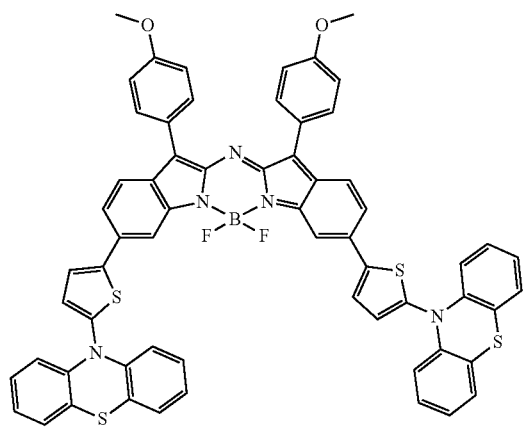

-continued
17
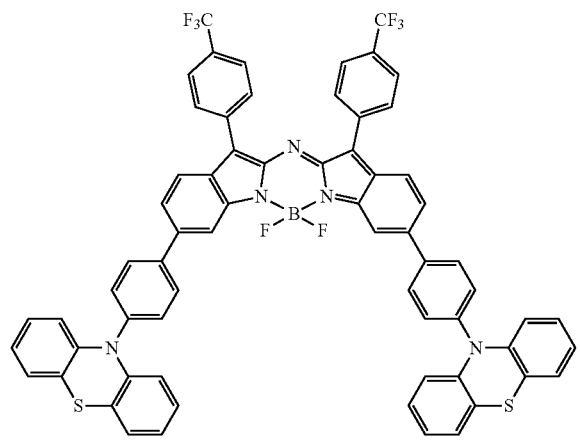
18
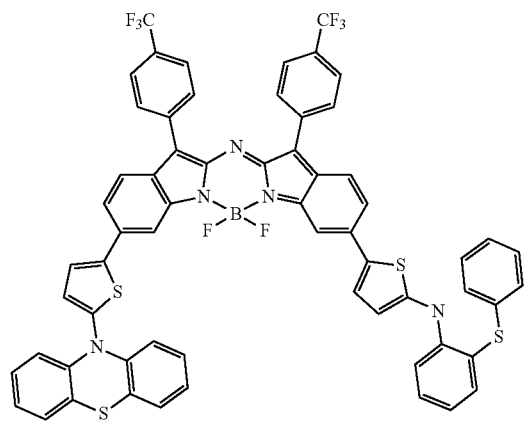
19
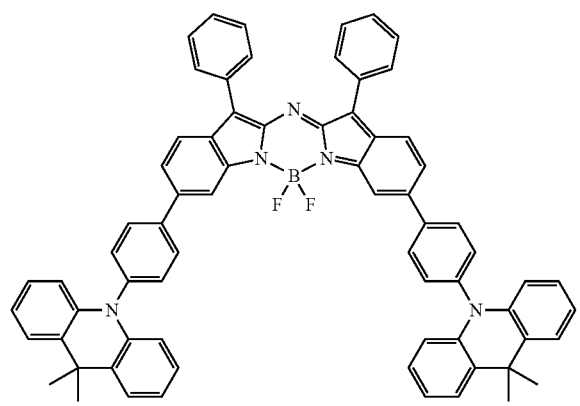
20
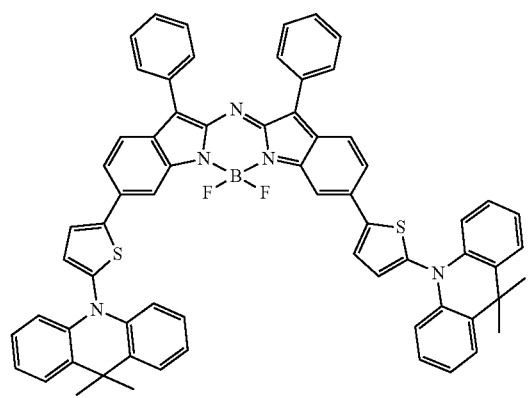
21
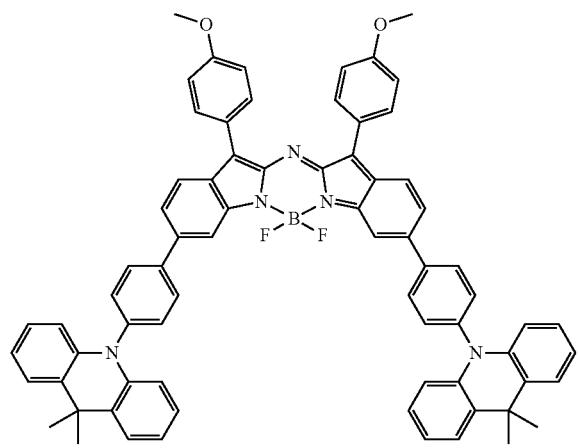
22
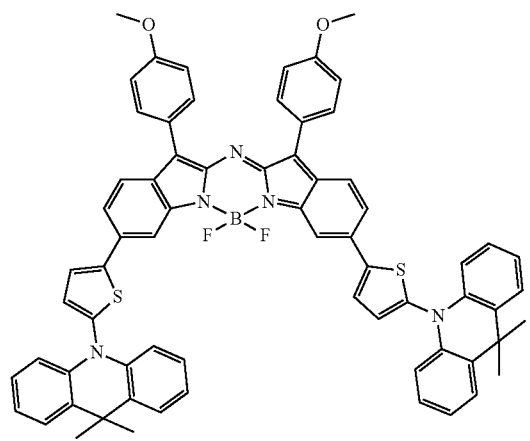

23
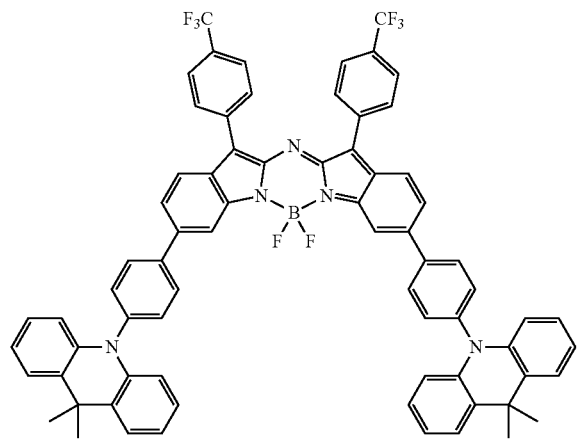
24
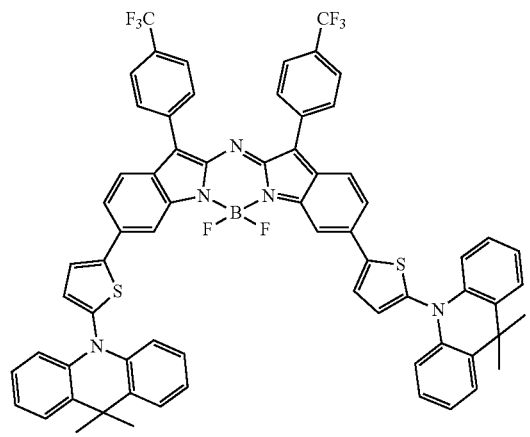
25
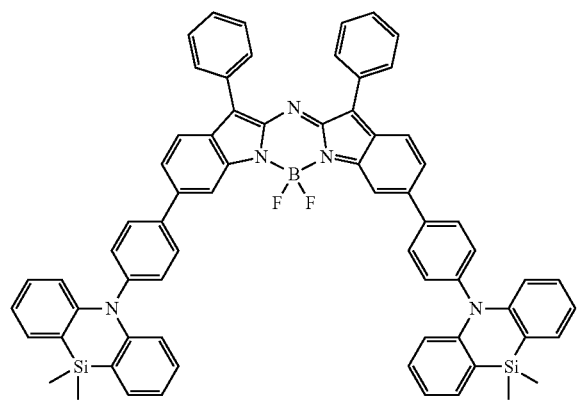
26
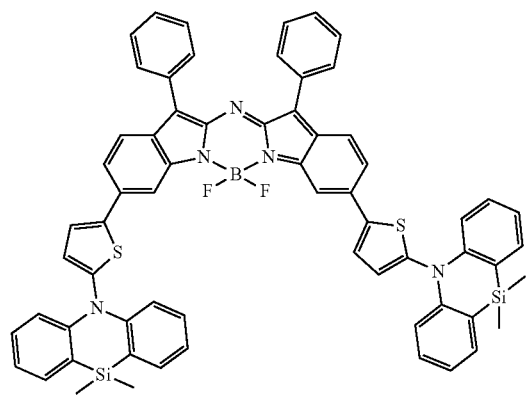
27
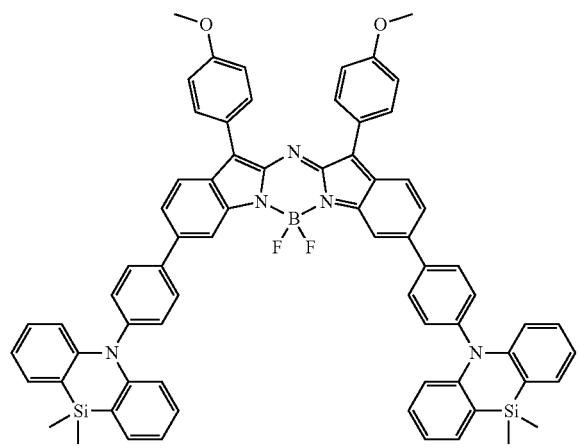
28
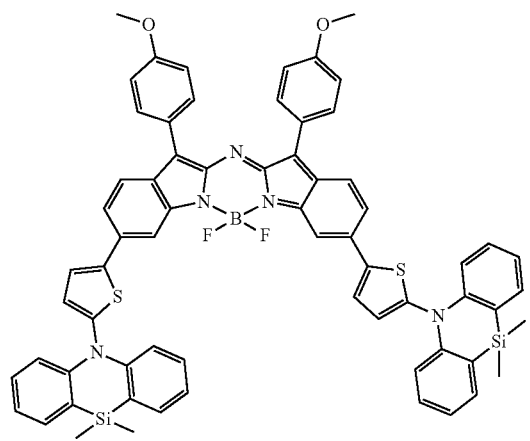

-continued
29
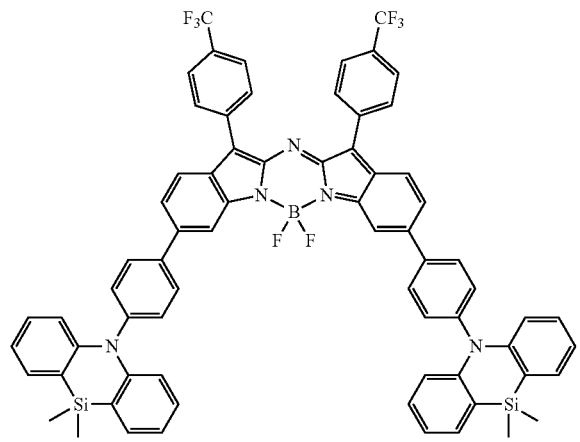
30
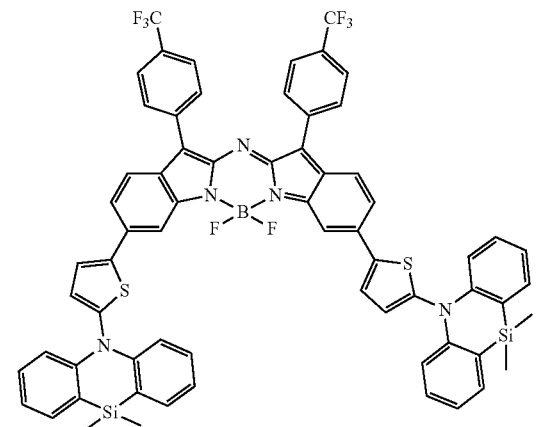
31
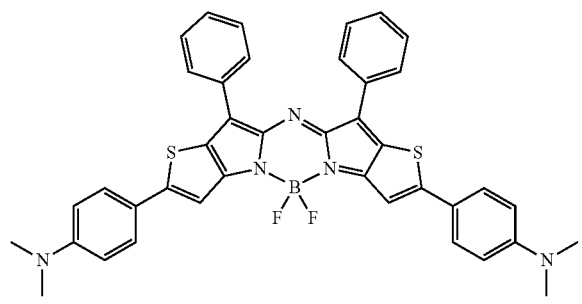
32
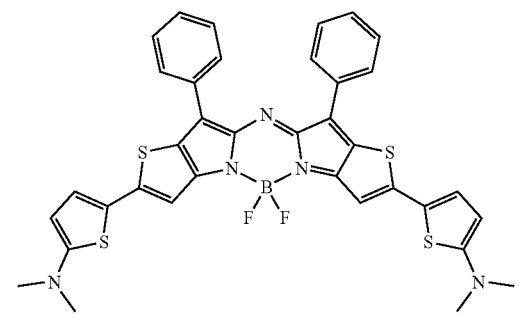
33
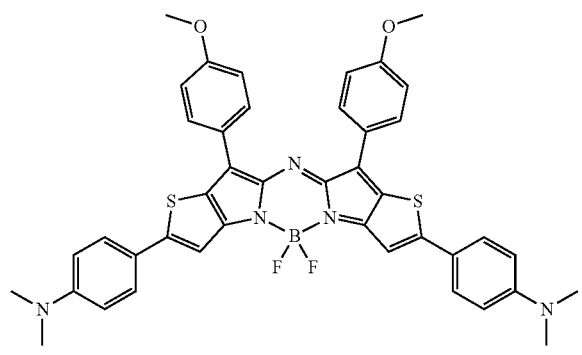
34
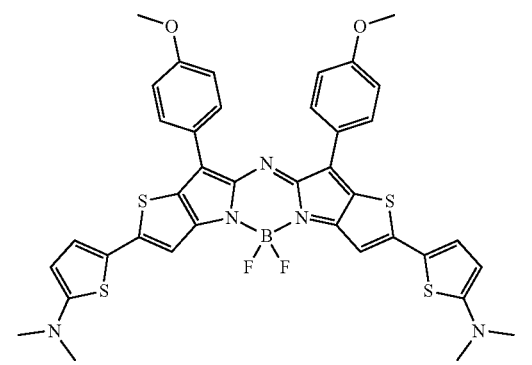
35
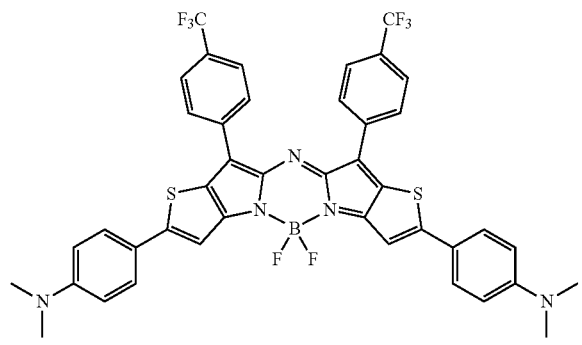
36
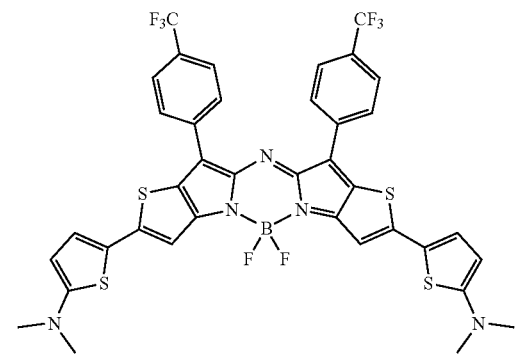

37
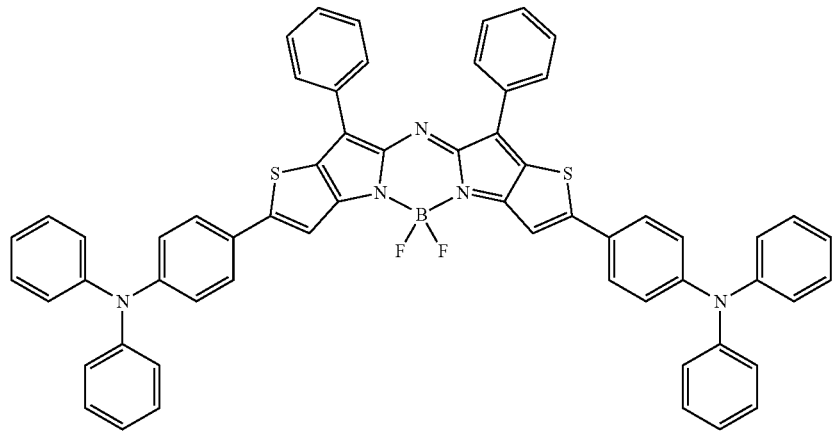
38
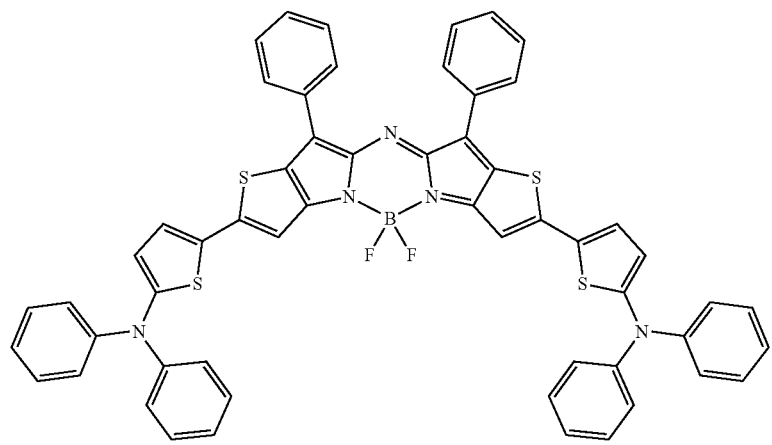
39
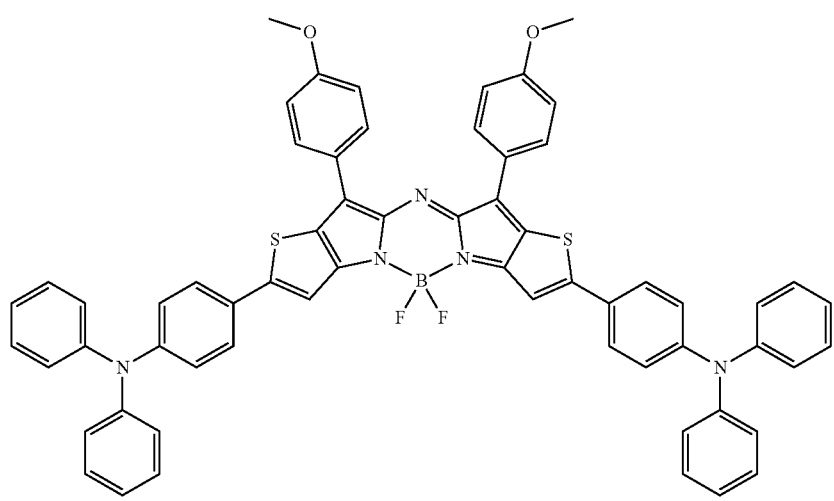

-continued
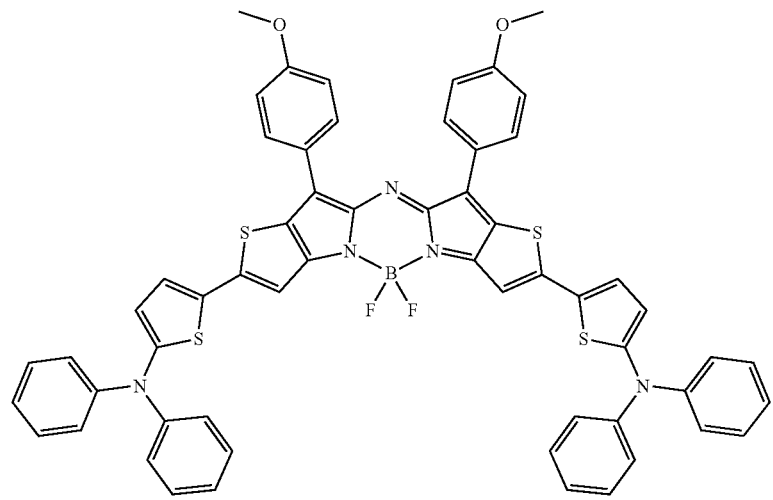
40
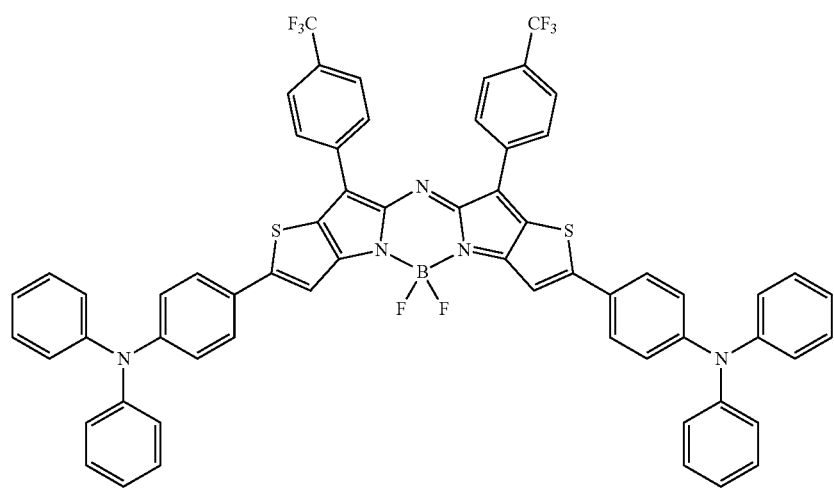
41
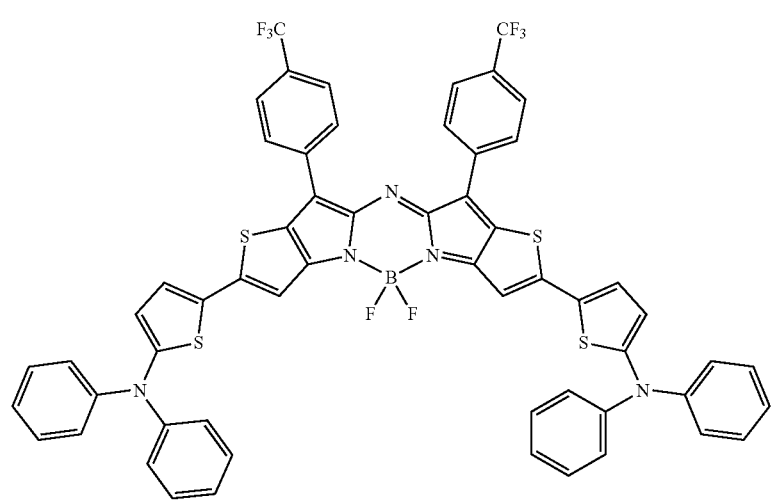
42

-continued
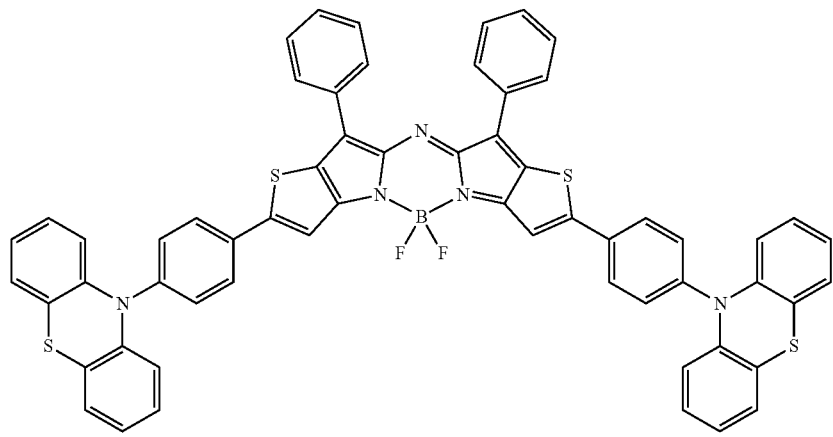
43
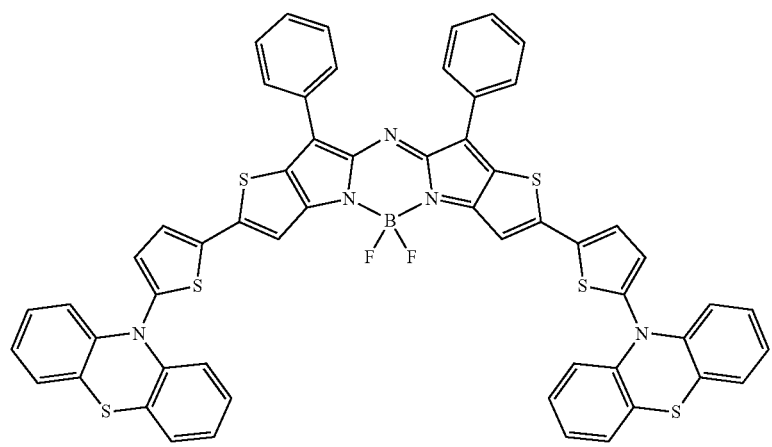
44
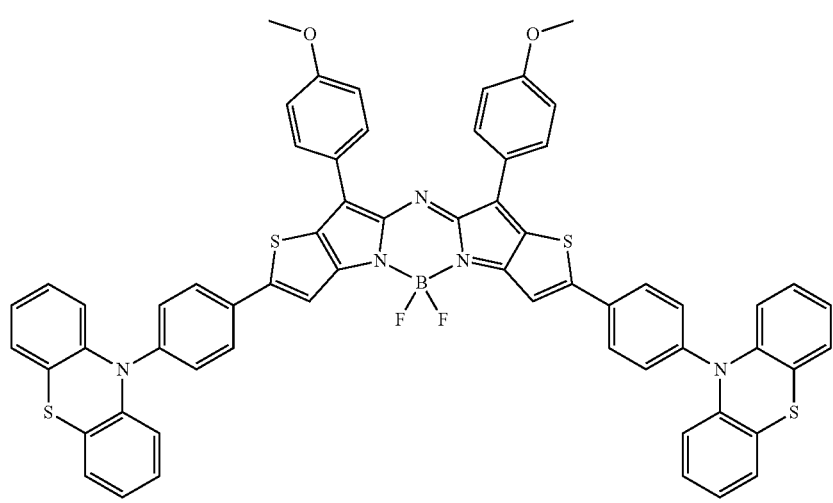
45

46
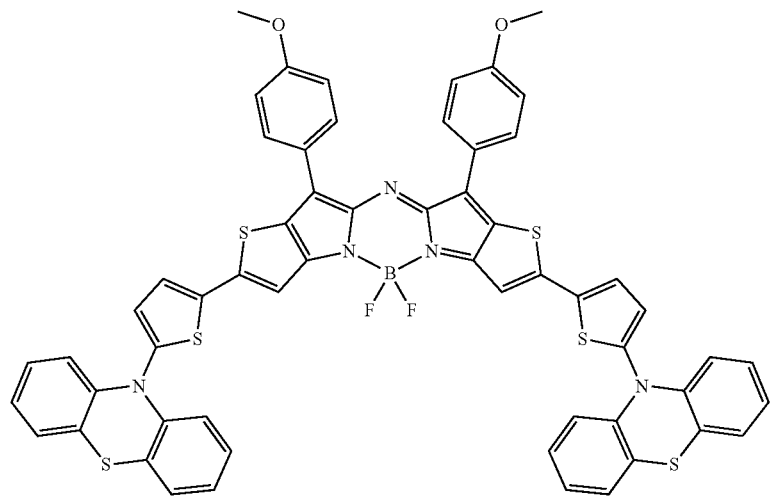
47
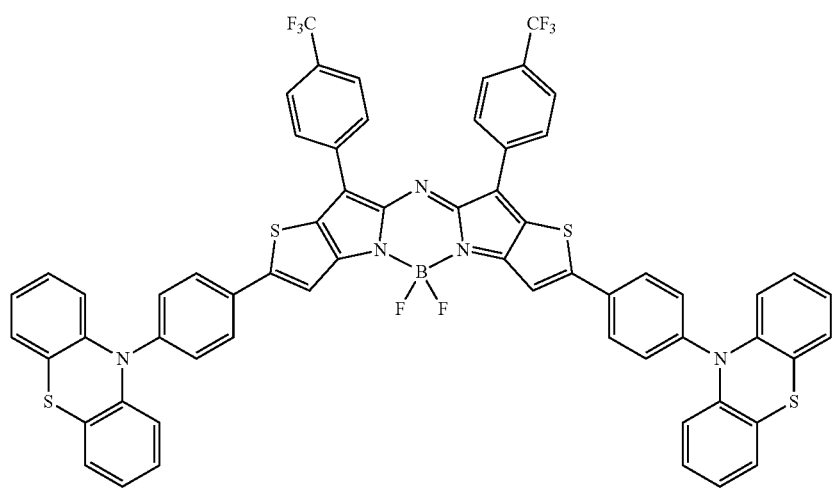
48
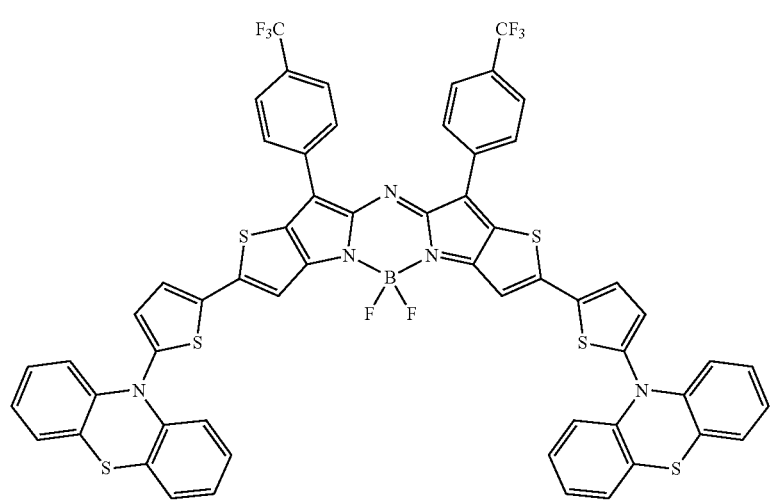

49
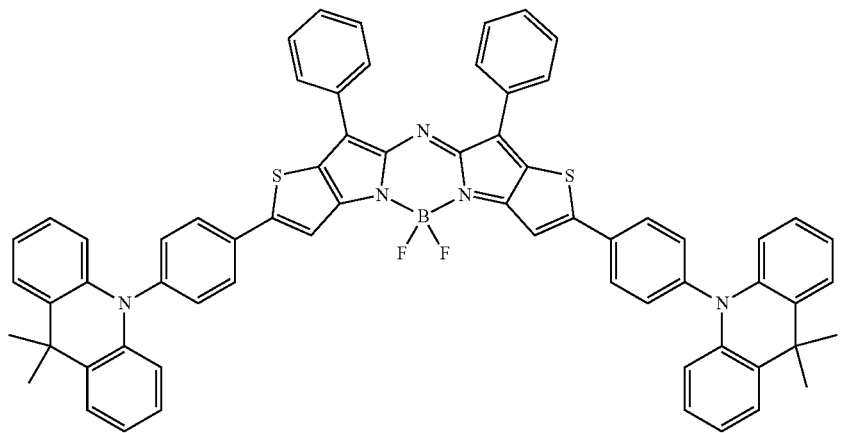
50
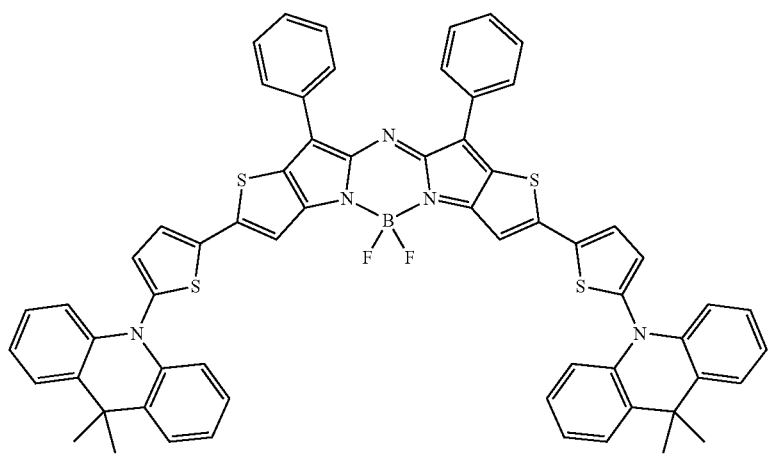
51
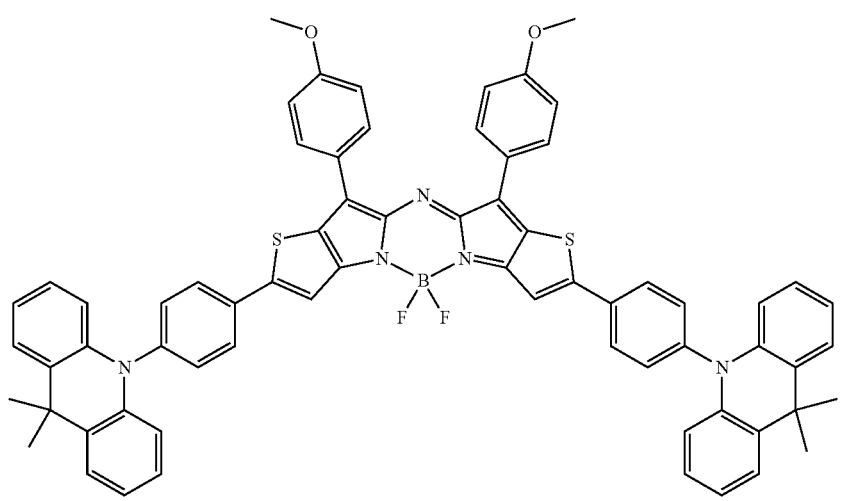

-continued
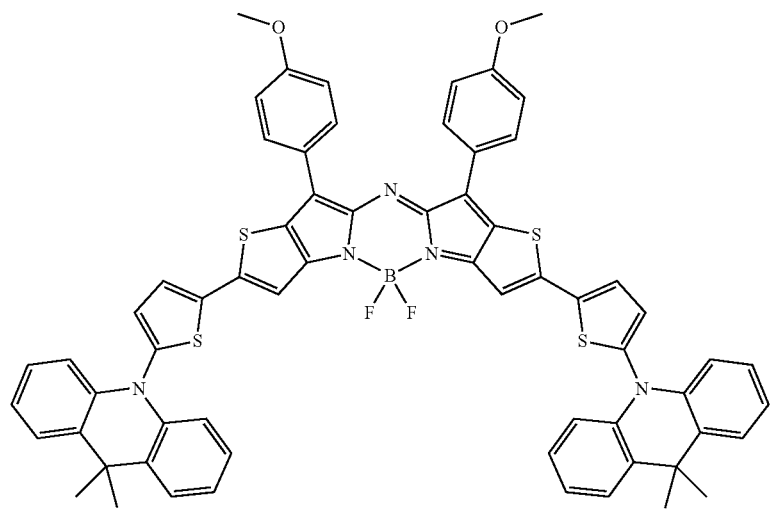
52
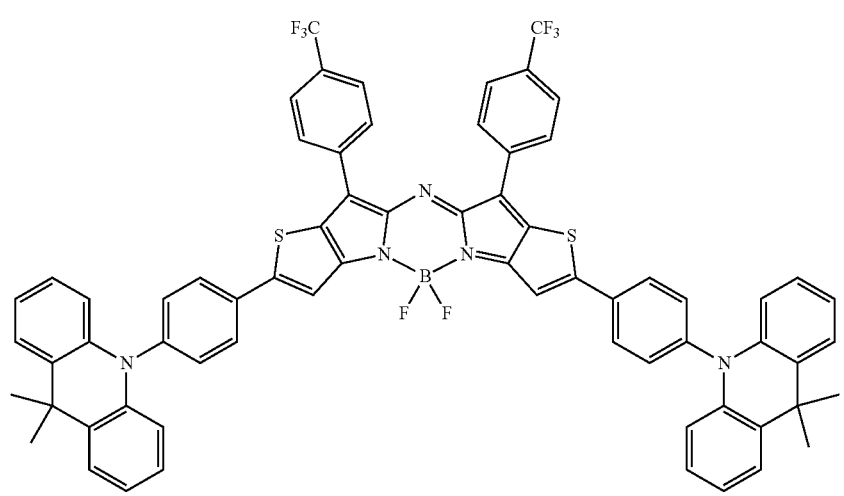
53
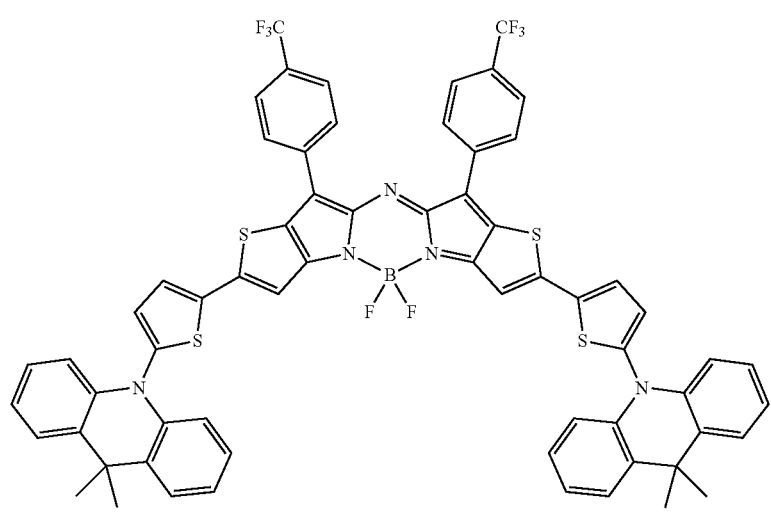
54

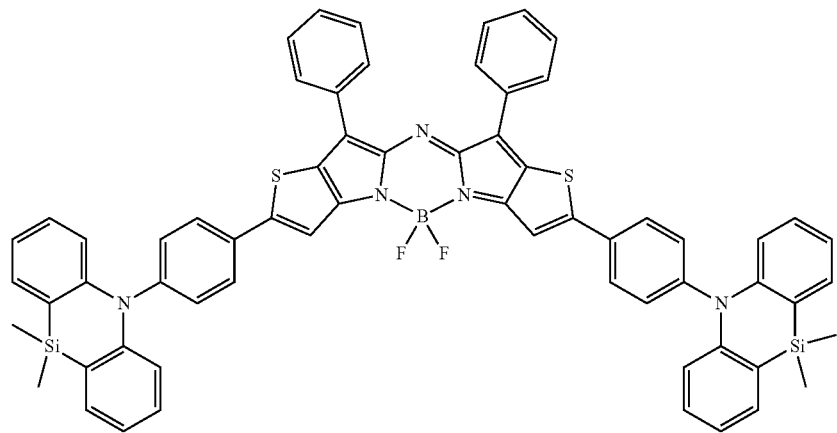
55
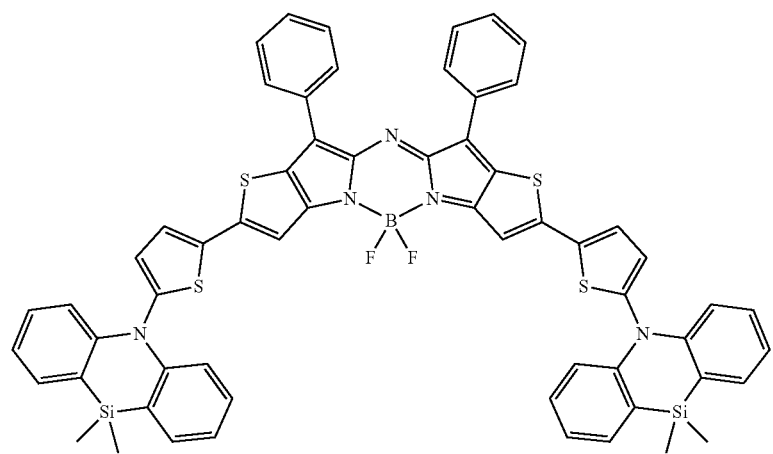
56
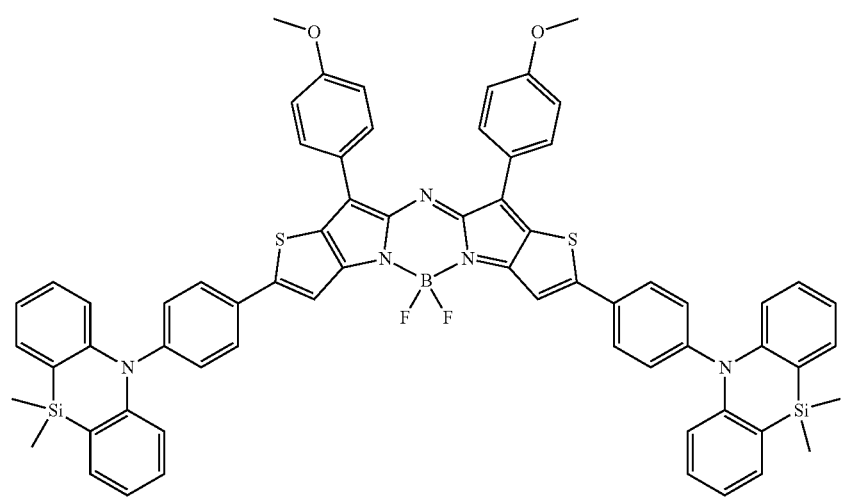
57

-continued
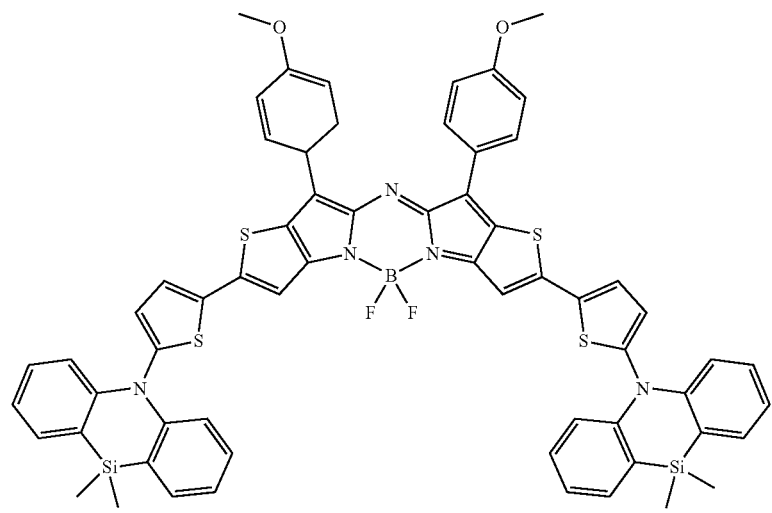
58
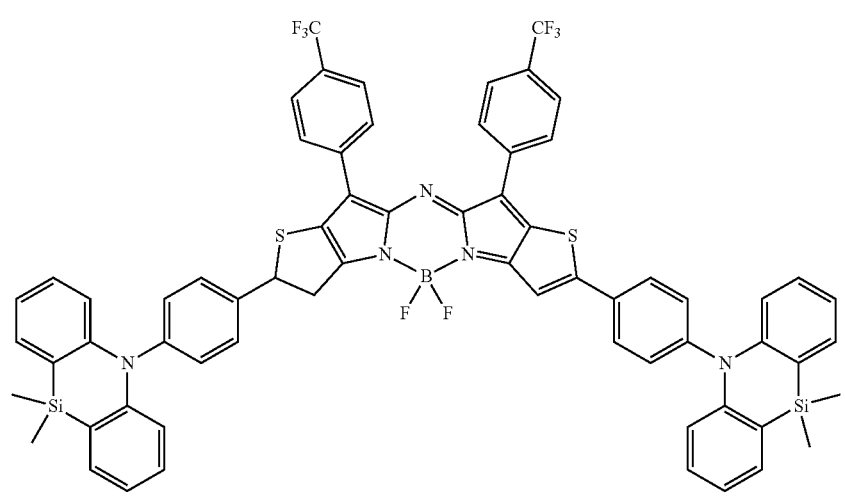
59
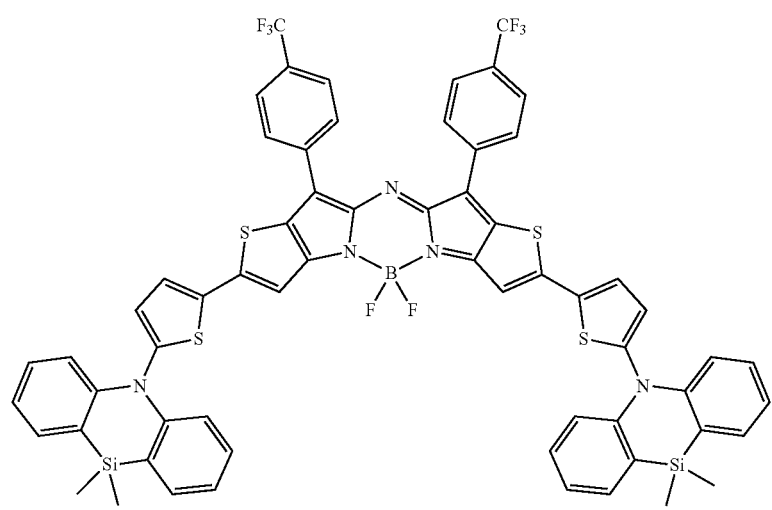
60

-continued
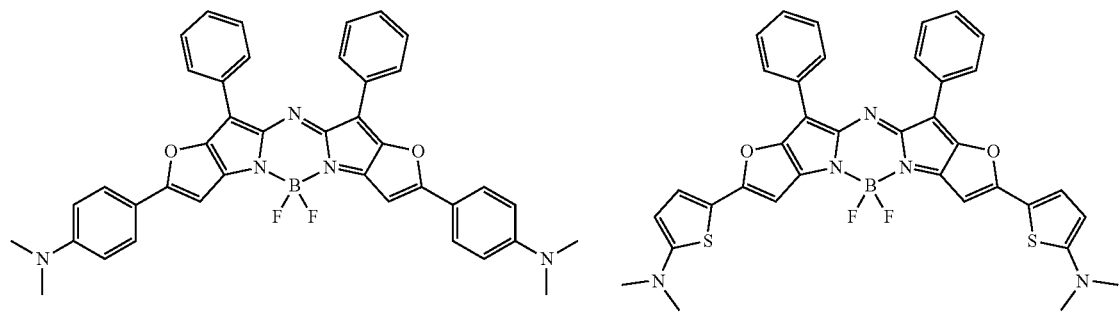
61
62
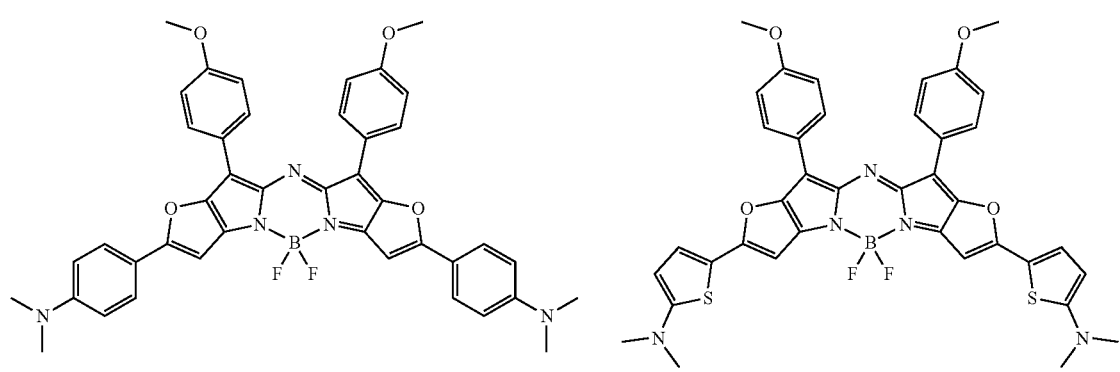
63
64
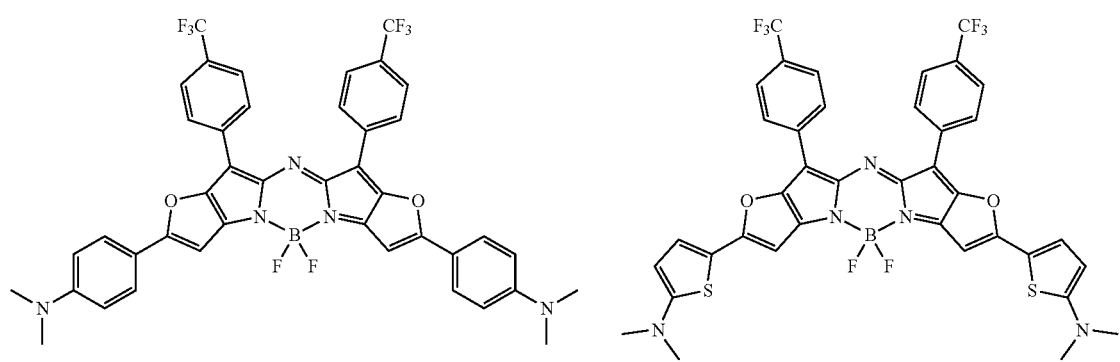
65
66
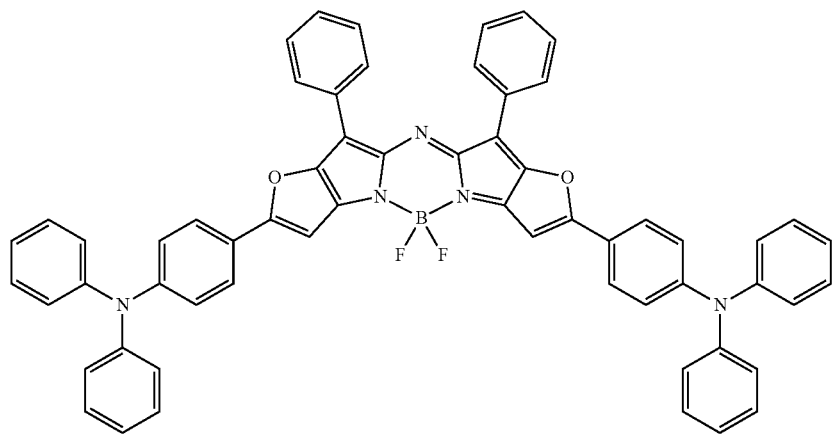
67

68
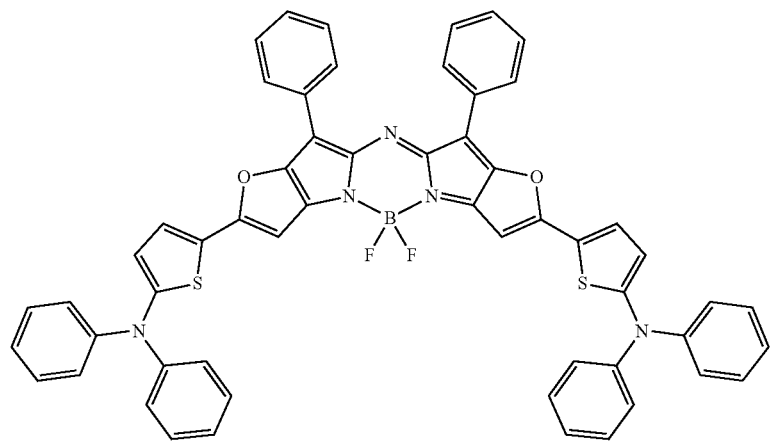
69
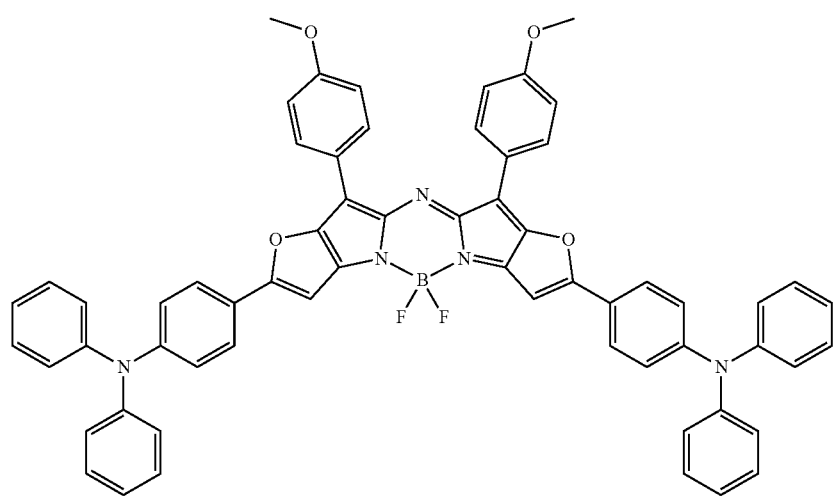
70
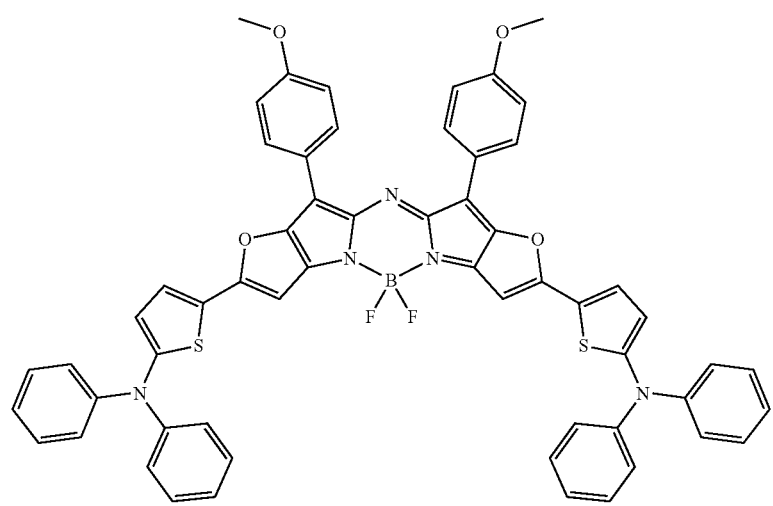

71
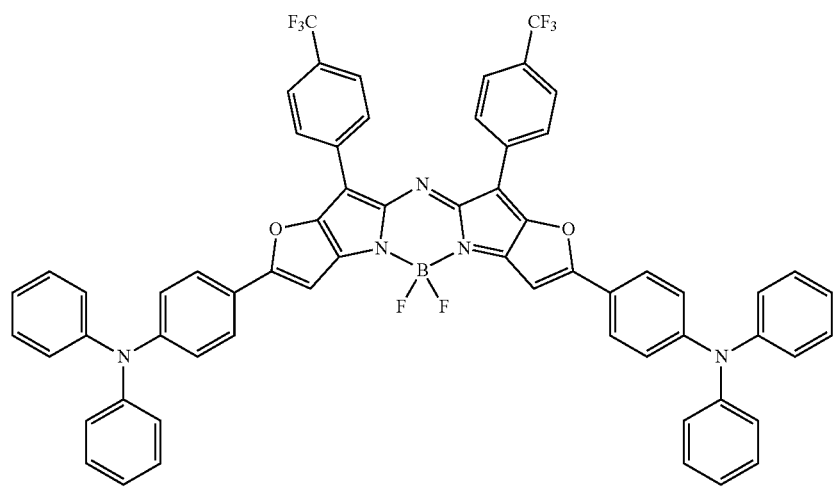
72
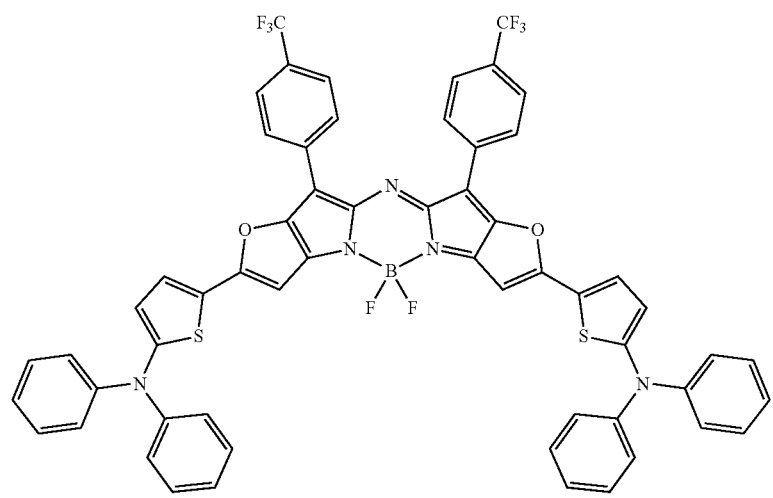
73
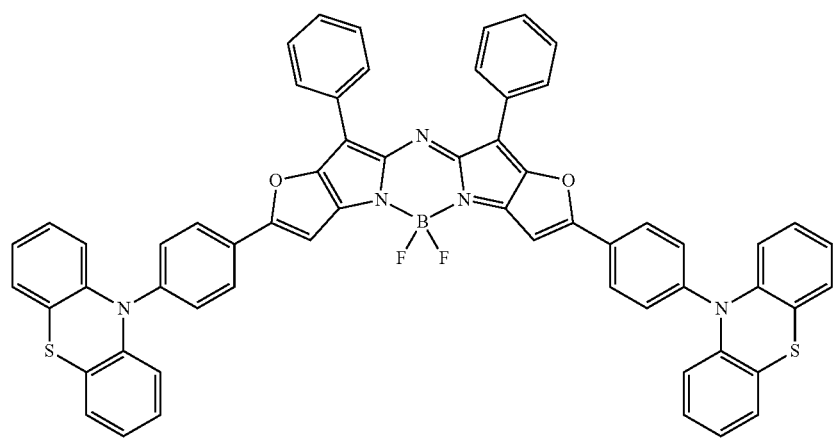

74
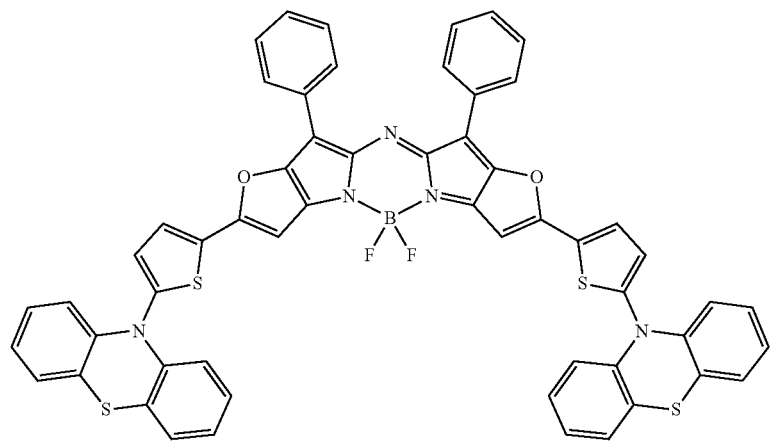
75
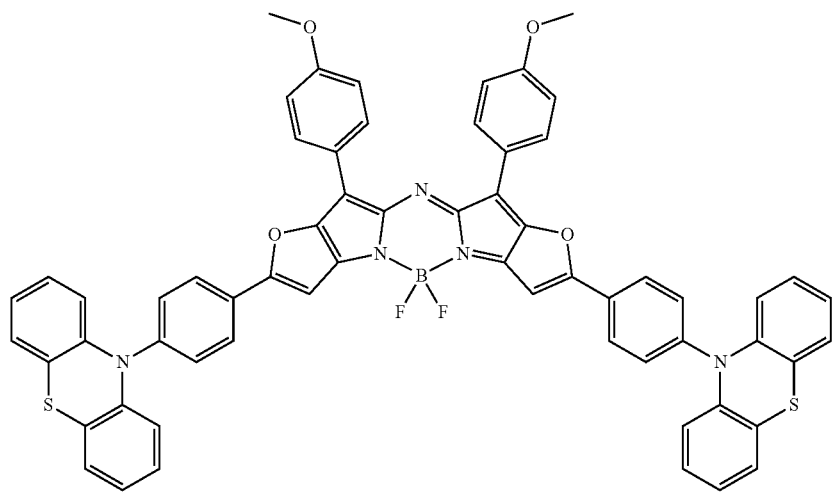
76
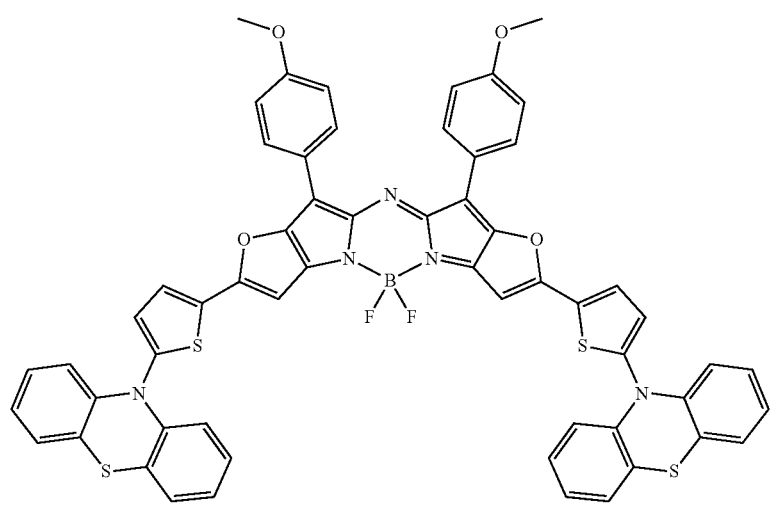

-continued
77
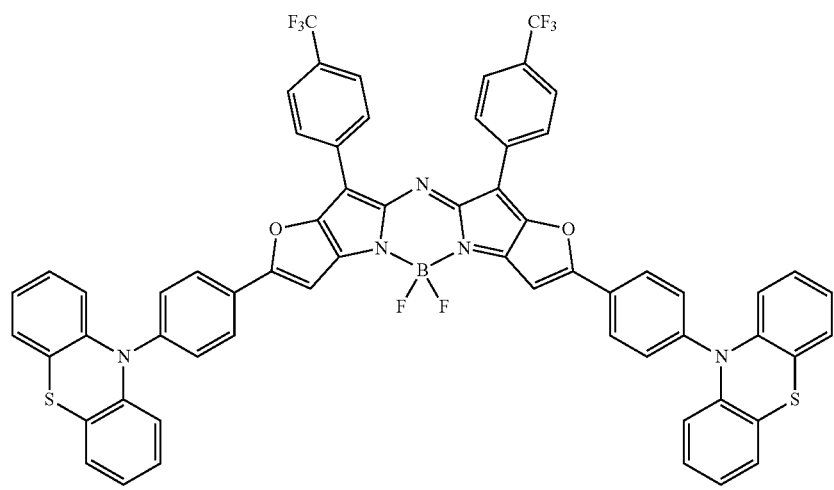
78
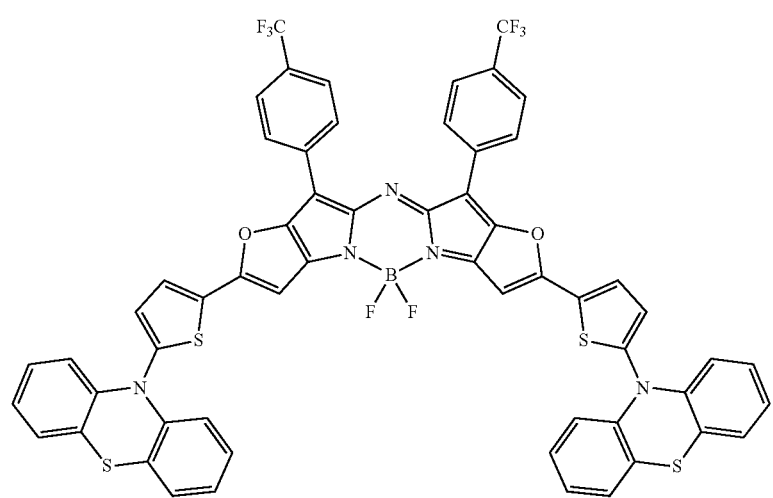
79
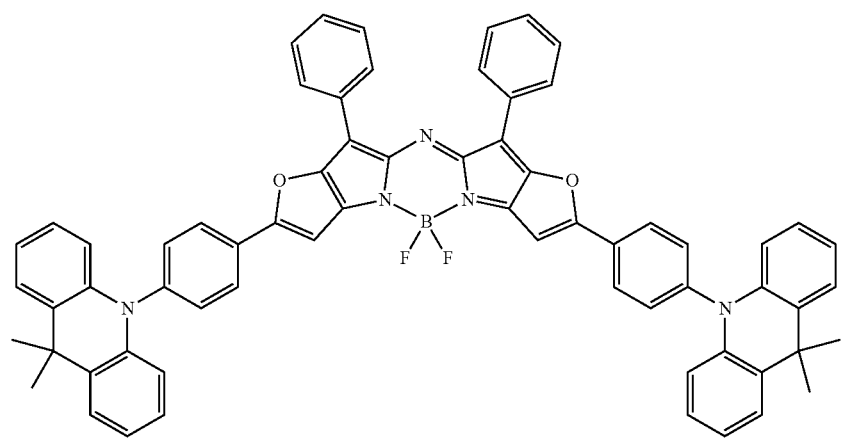

-continued
80
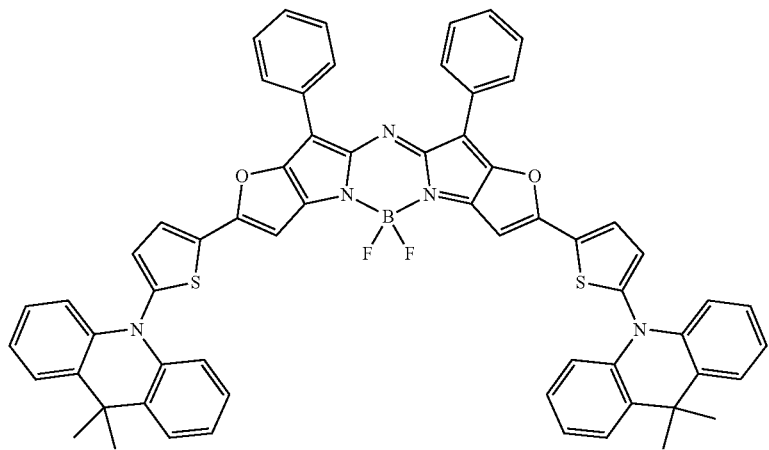
81
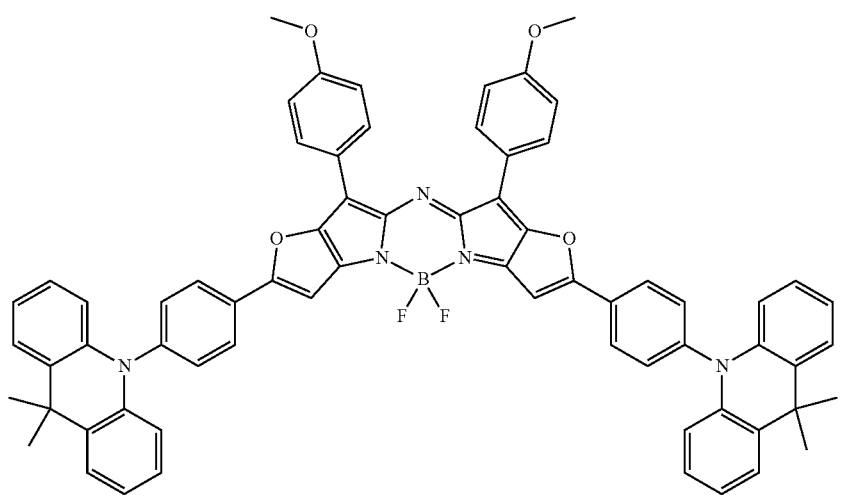
82
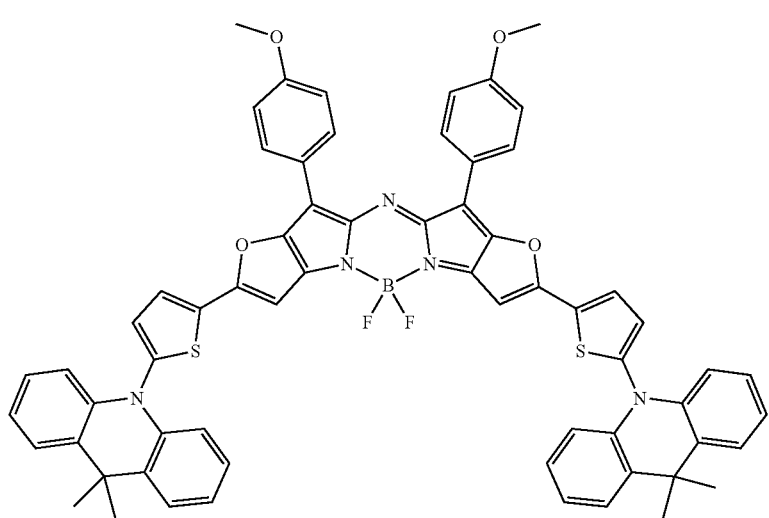

-continued
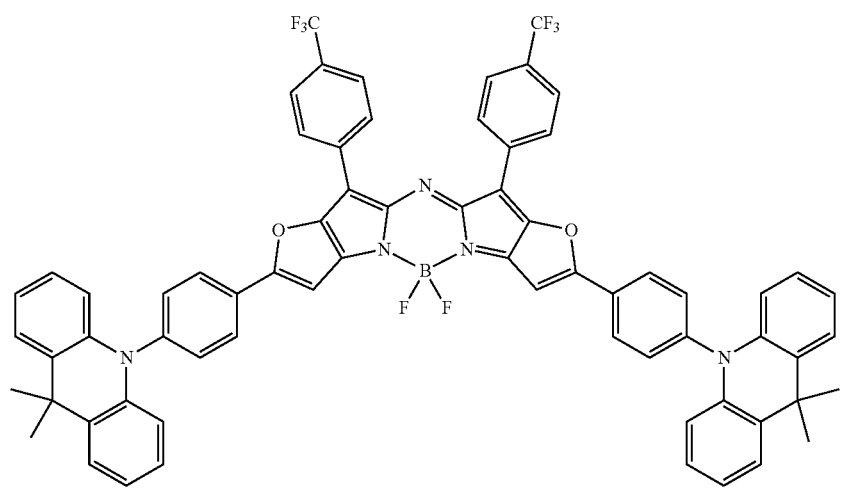
83
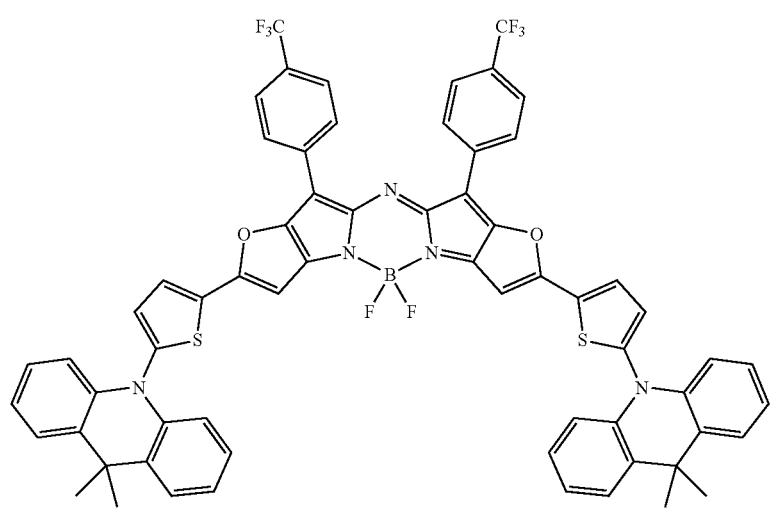
84
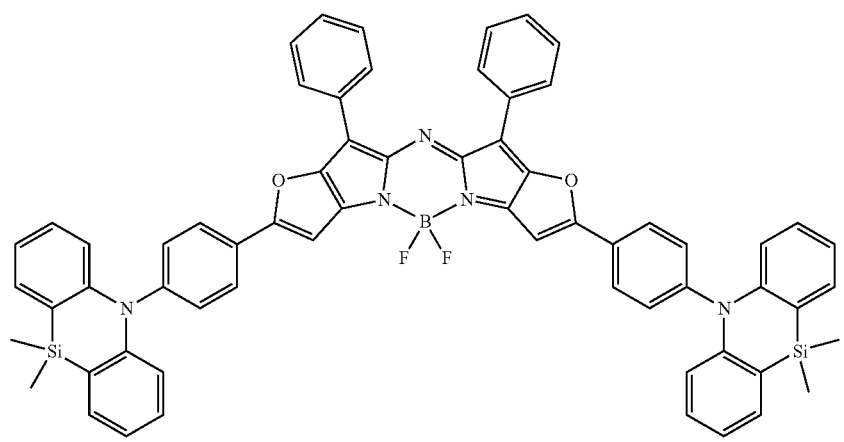
85

86
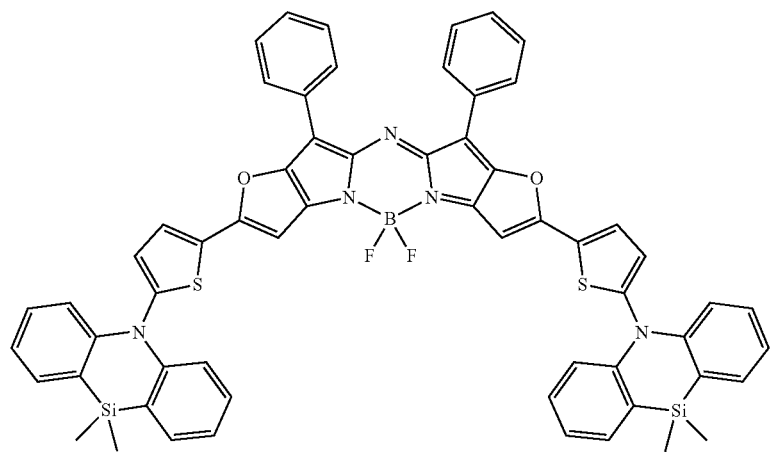
87
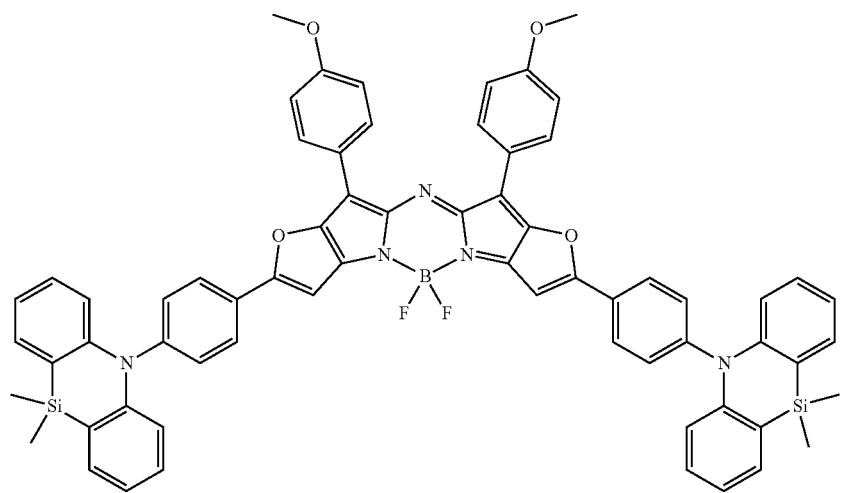
88
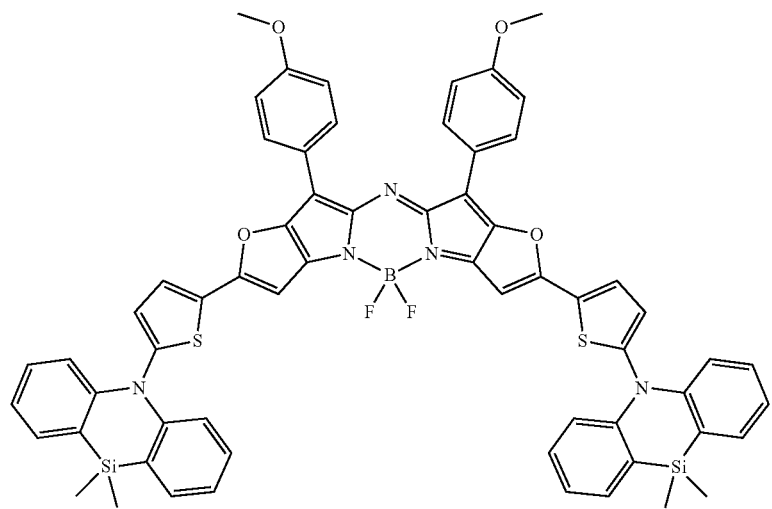

-continued
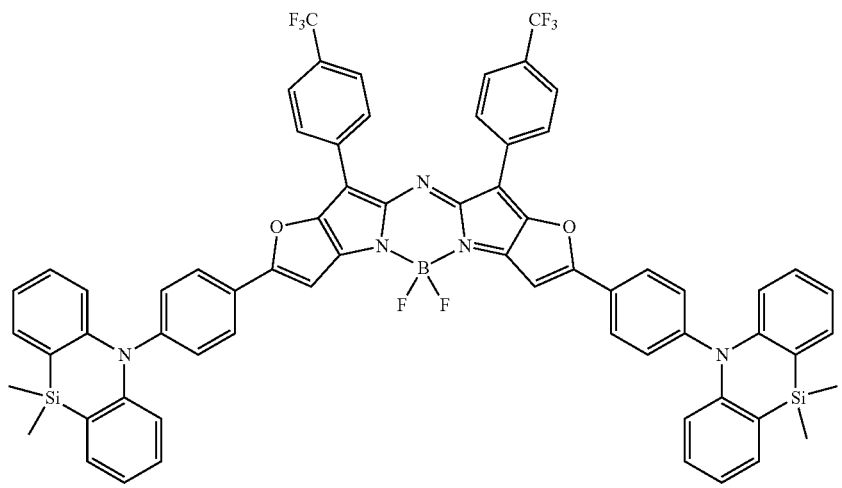
89
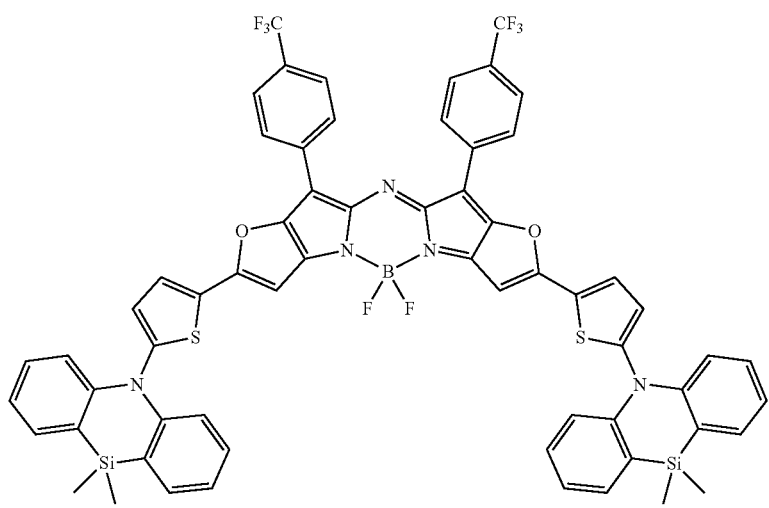
90
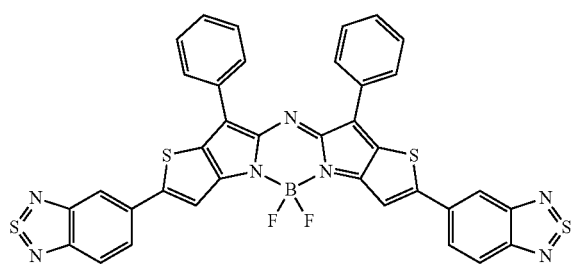
91
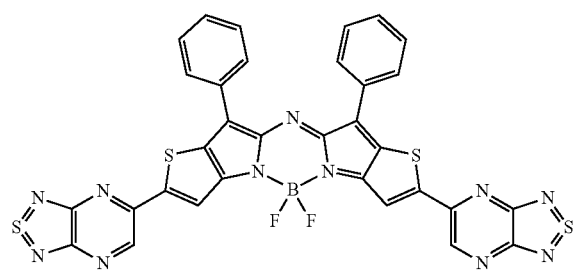
92
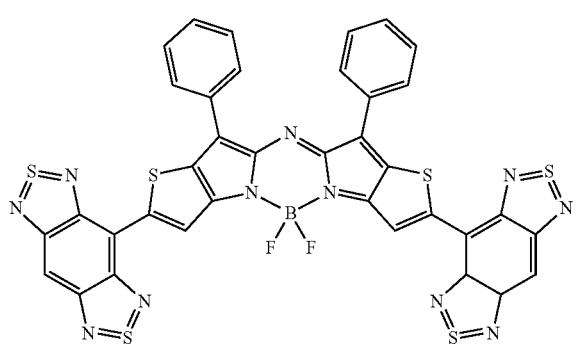
93
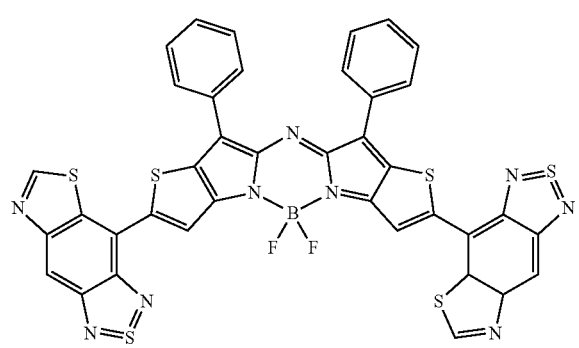
94

-continued
95
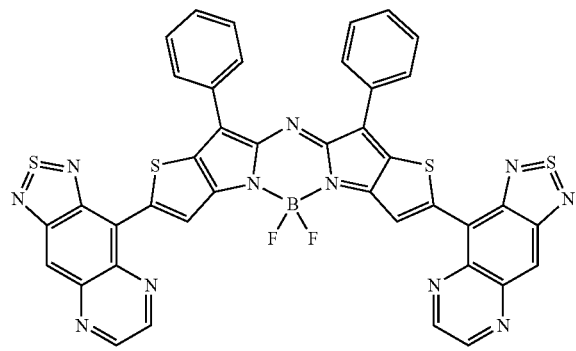
96
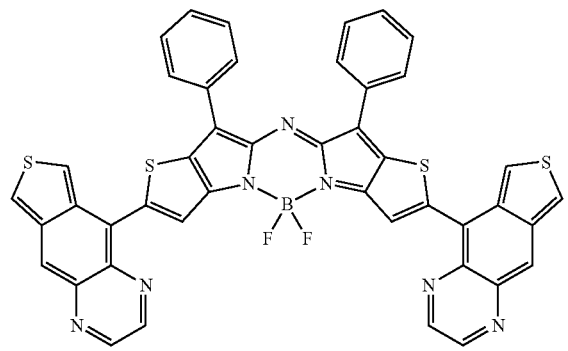
97
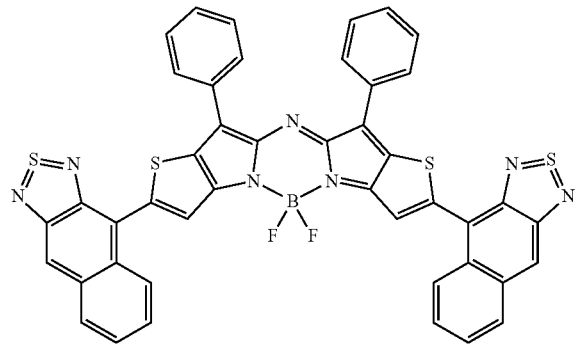
98
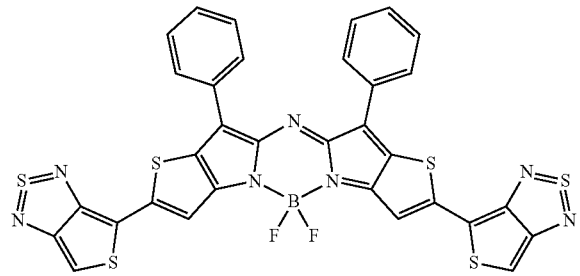
99
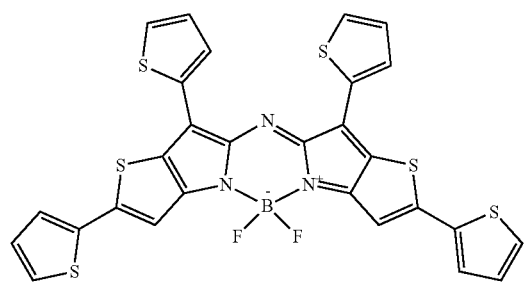
100
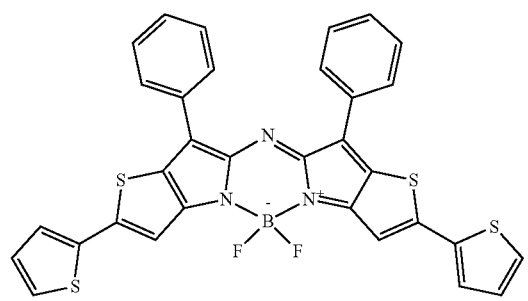
101
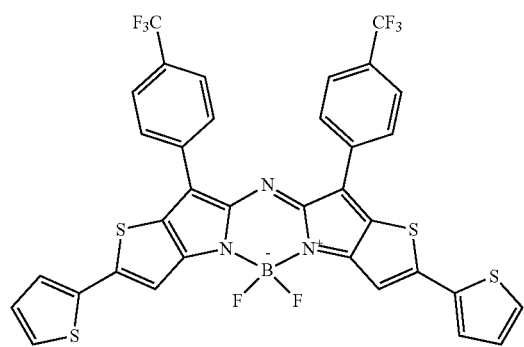
102
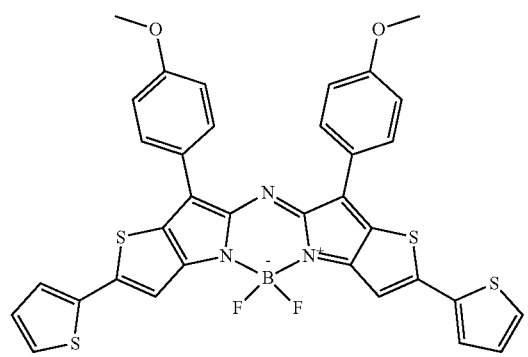

-continued
103
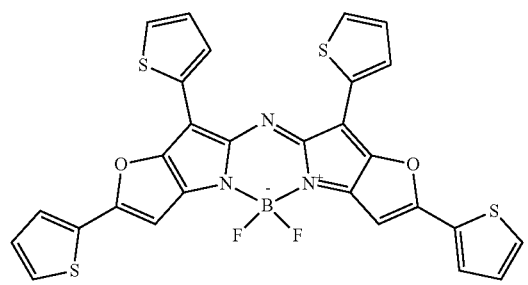
104
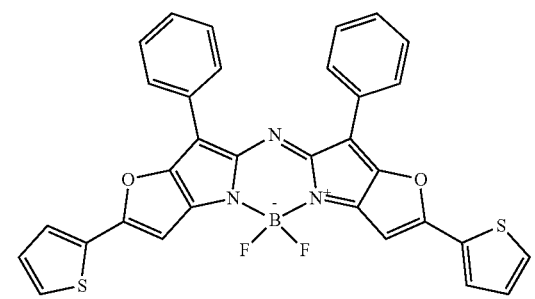
105
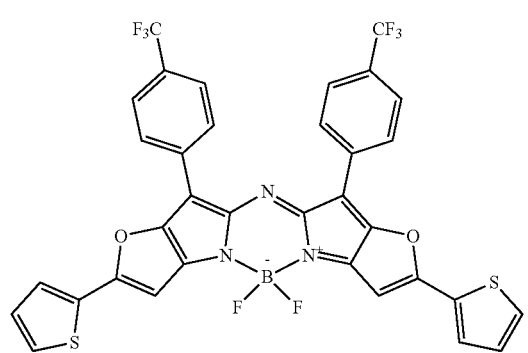
106
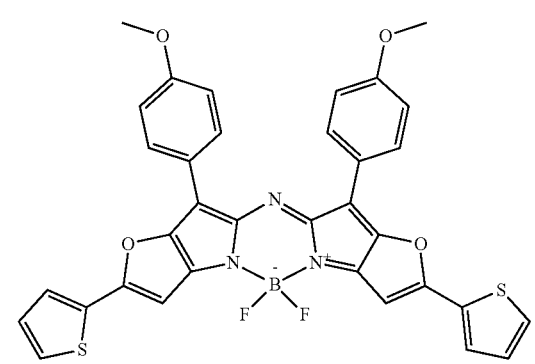
107
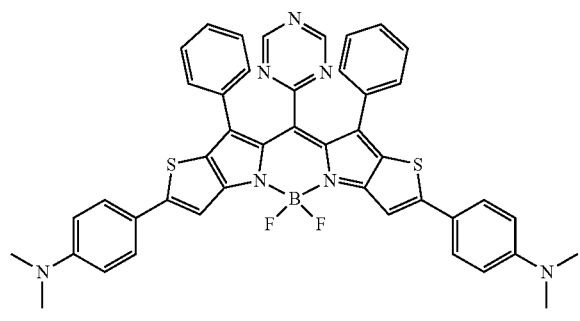
108
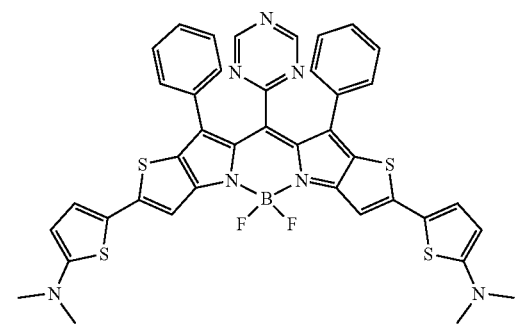
109
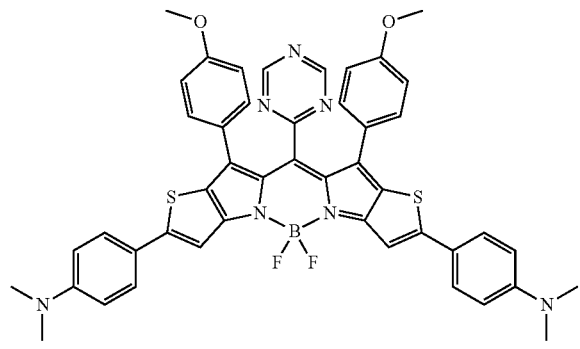
110
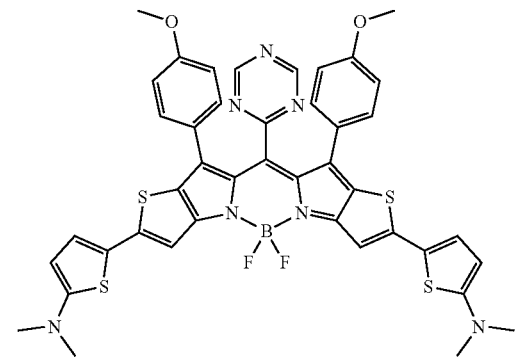

-continued
| 111 | 112 |
|---|---|
| 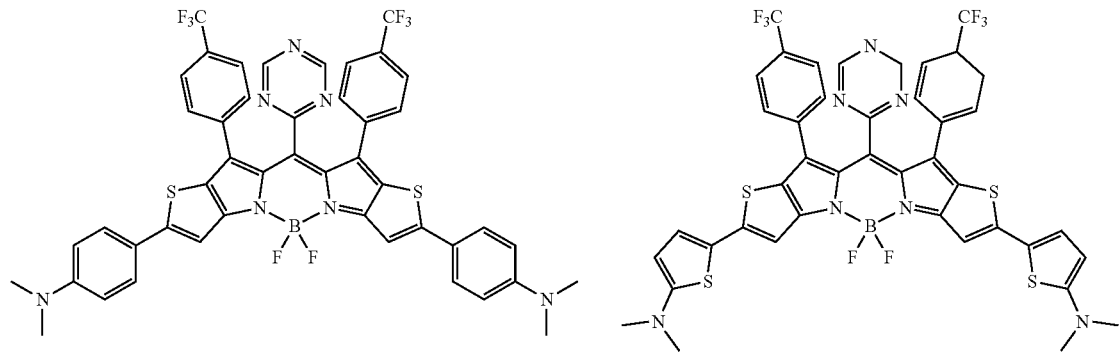 | |
113
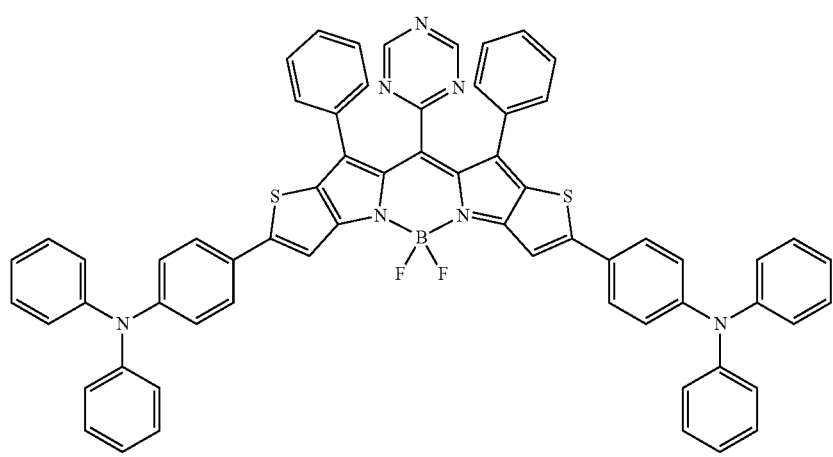
114
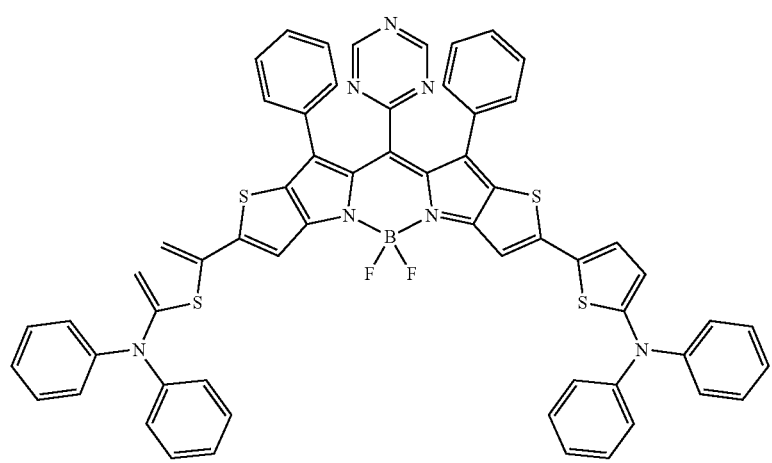

115
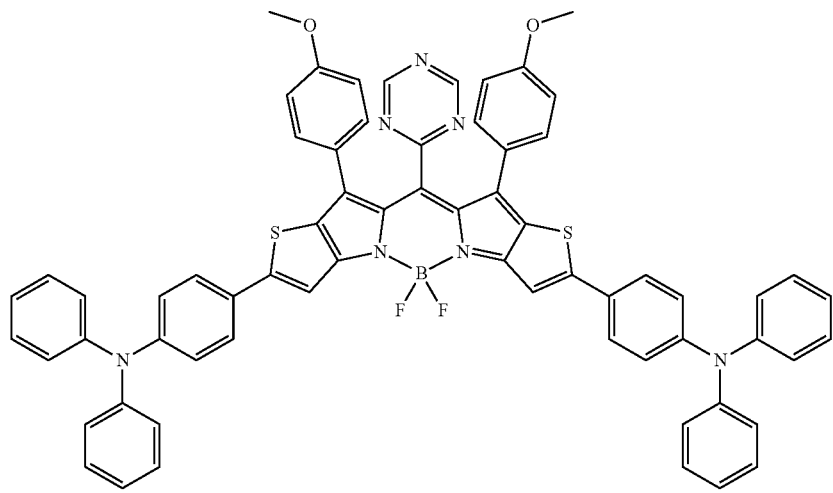
116
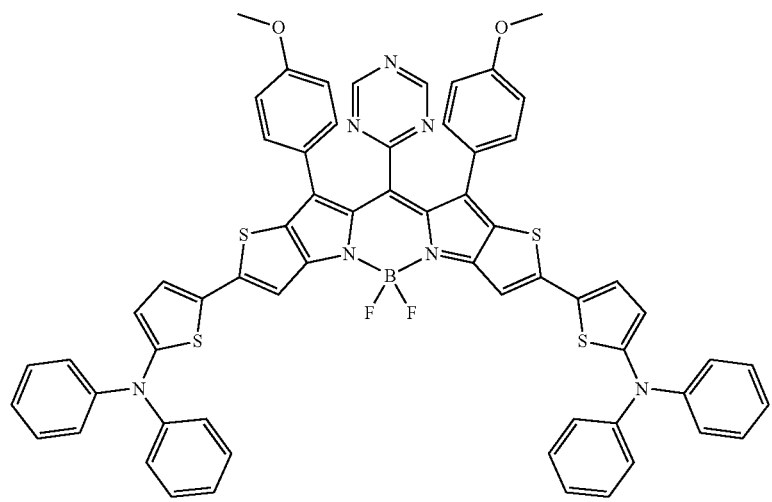
117
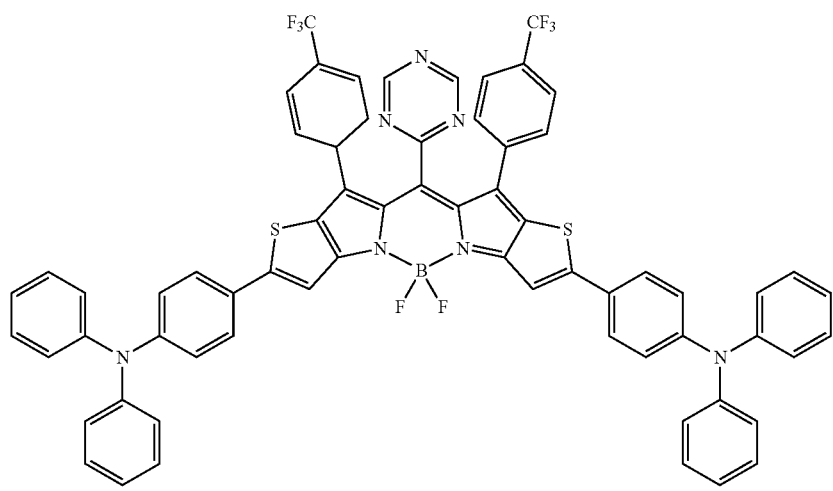

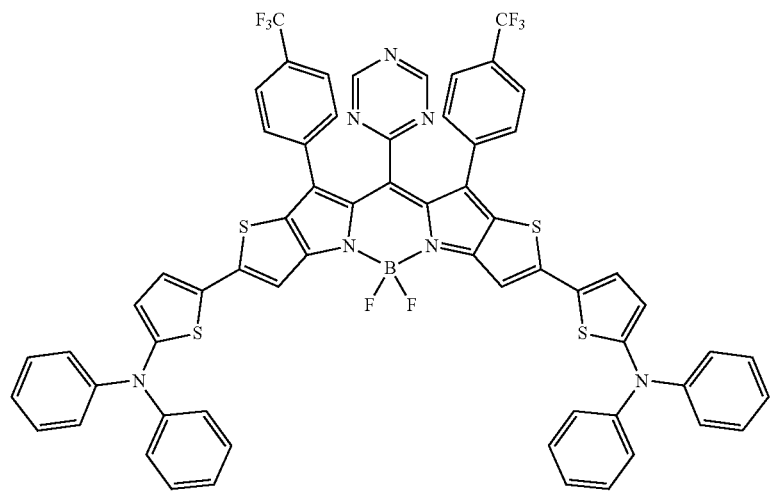
118
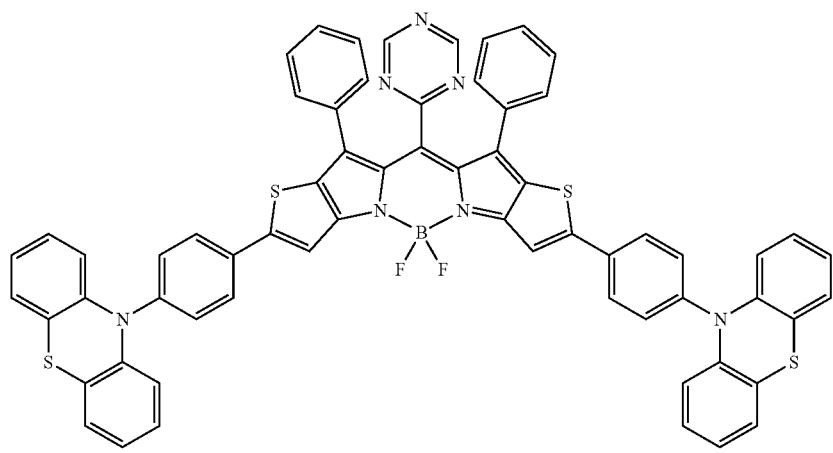
119
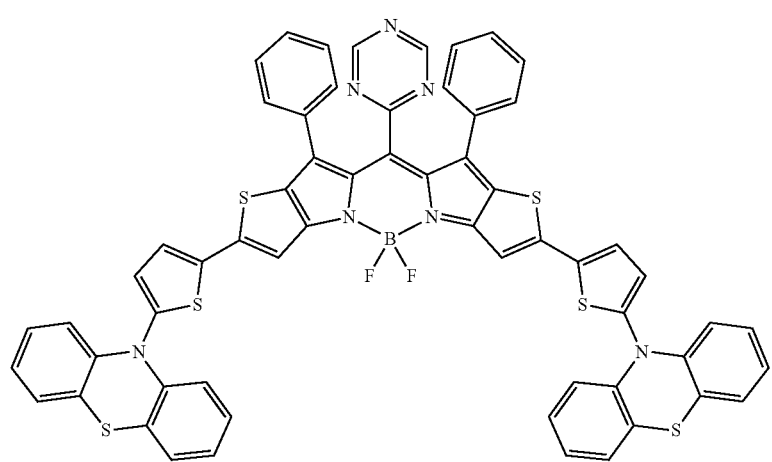
120

-continued
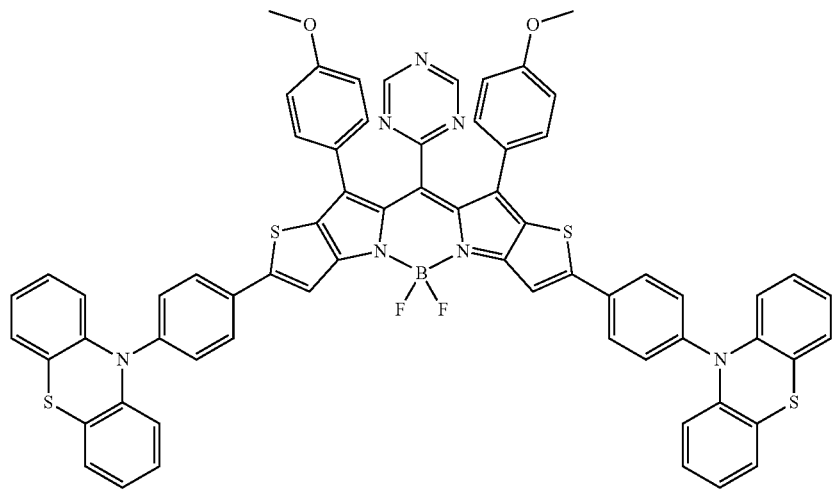
121
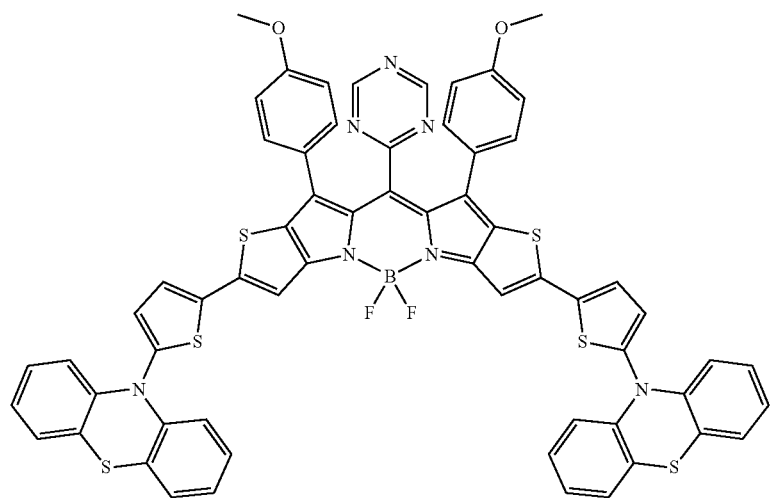
122
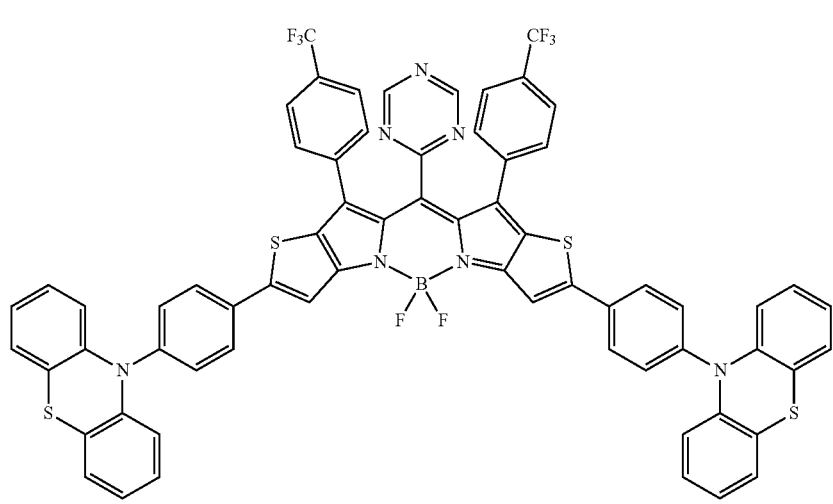
123

-continued
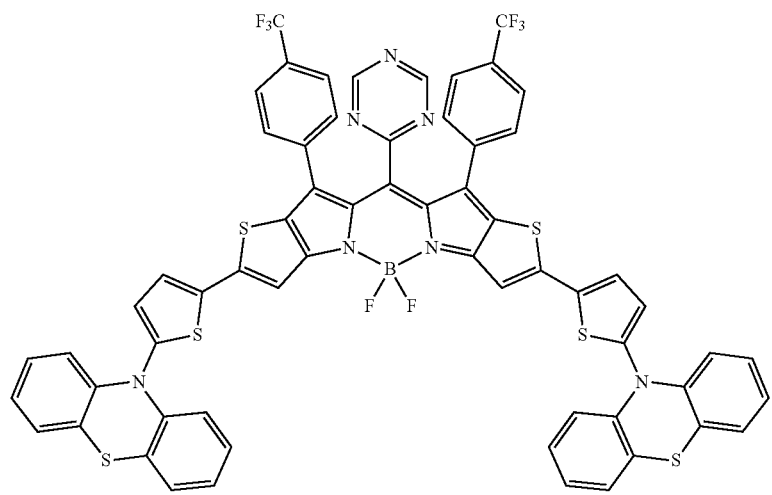
124
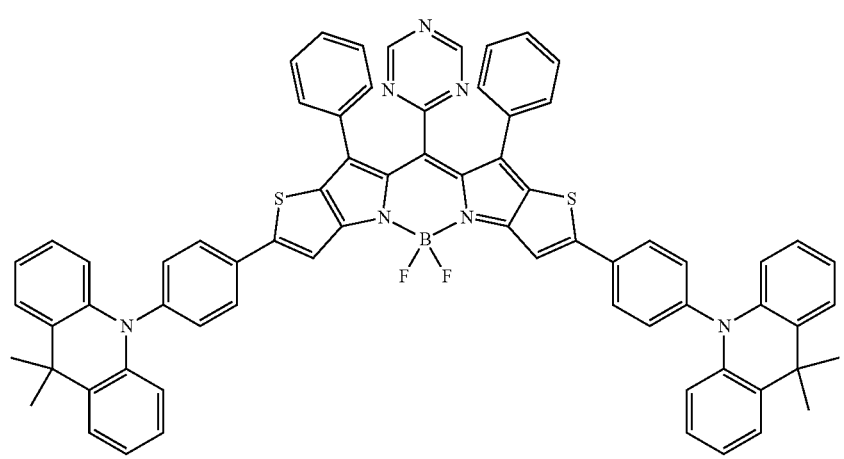
125
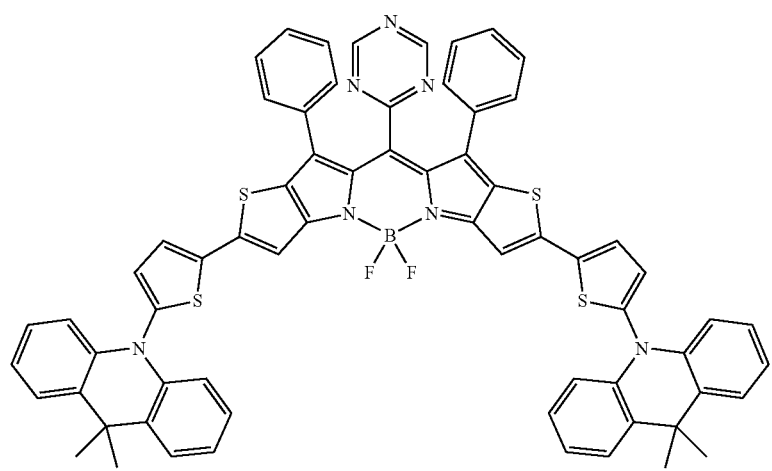
126

-continued
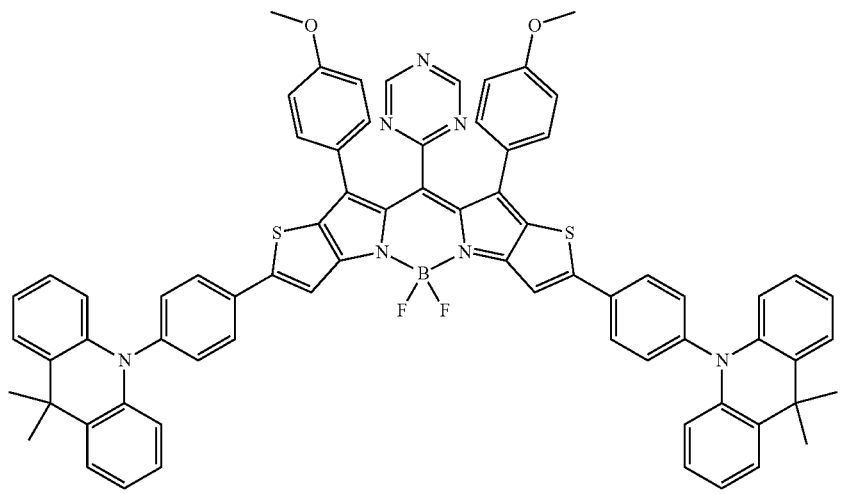
127
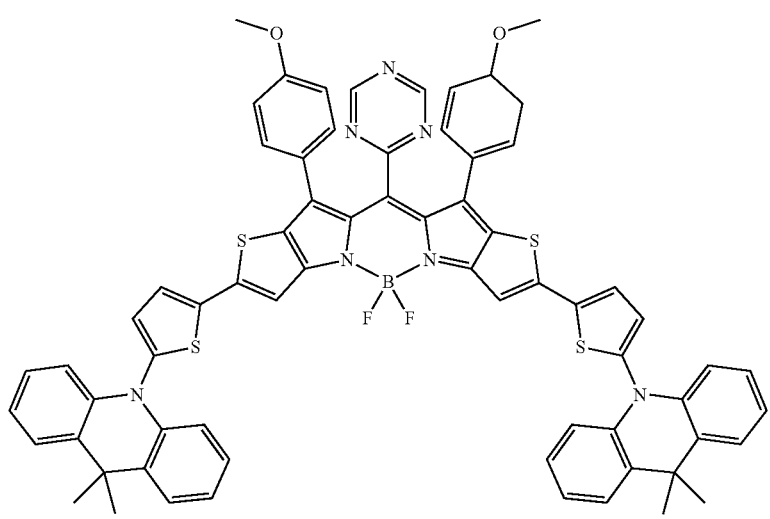
128
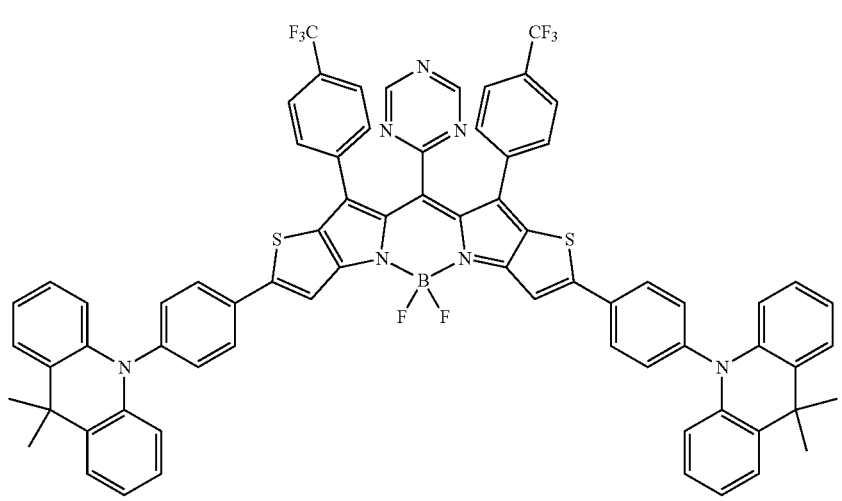
129

-continued
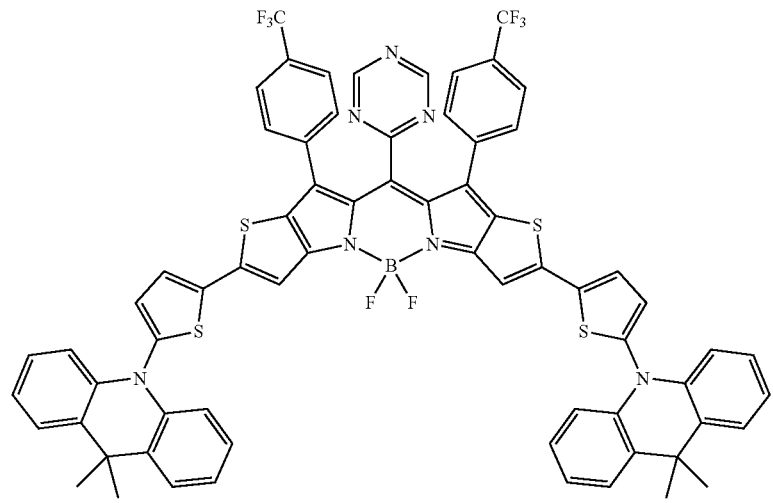
130
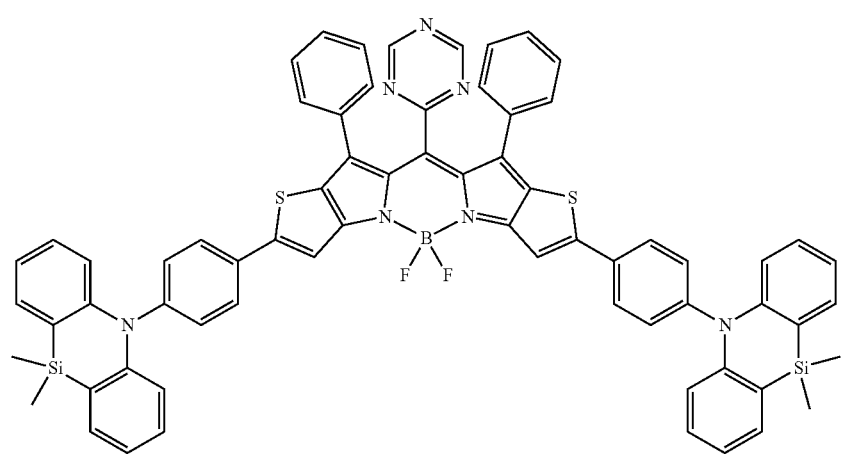
131
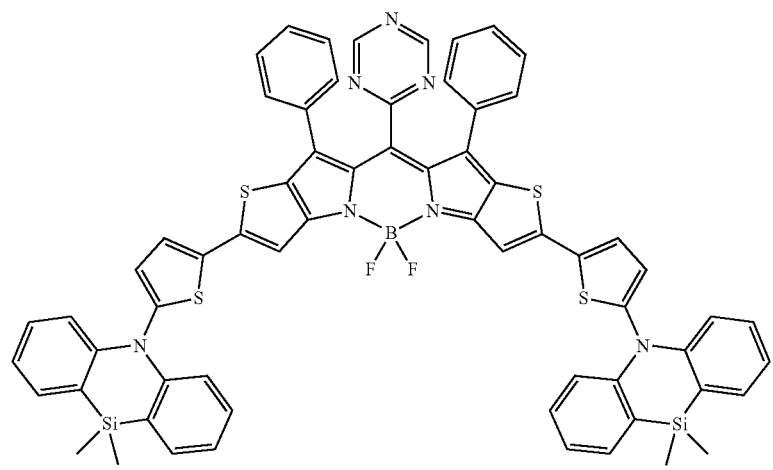
132

133
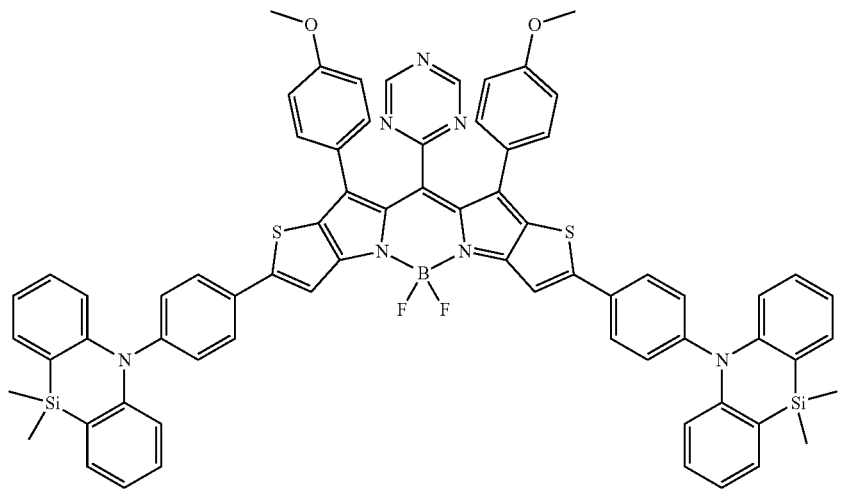
134
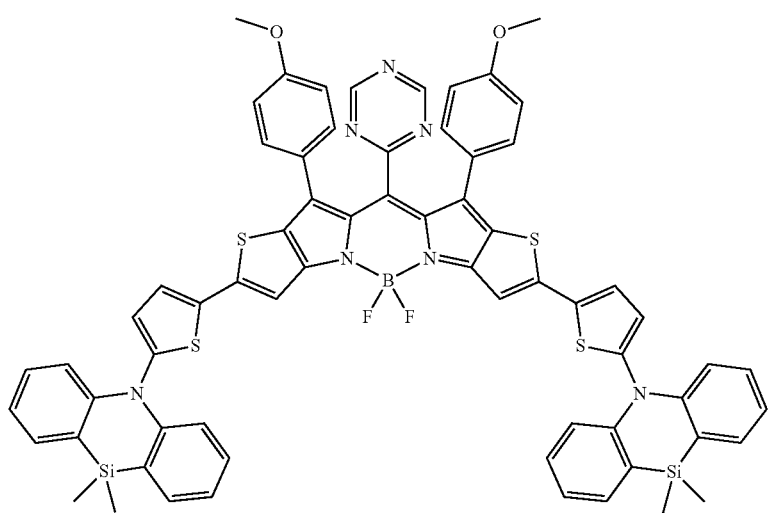
135
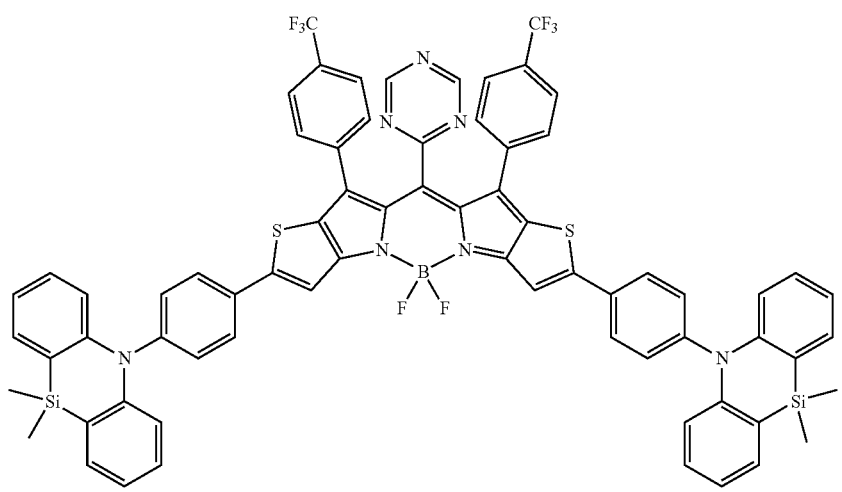

136
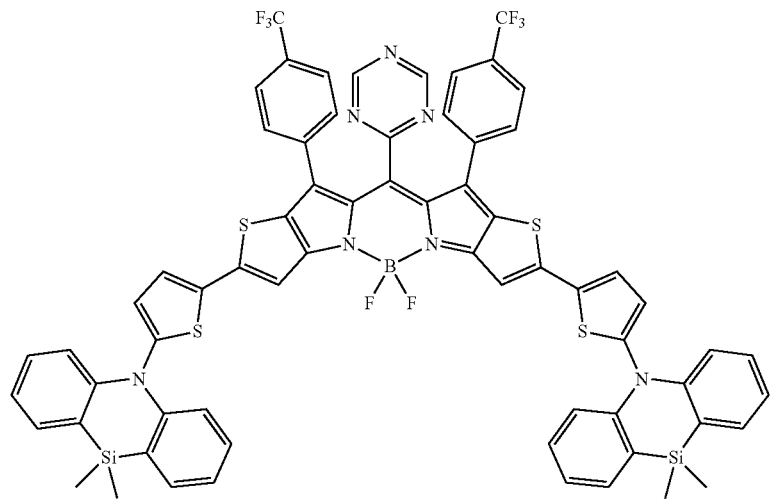
137 138
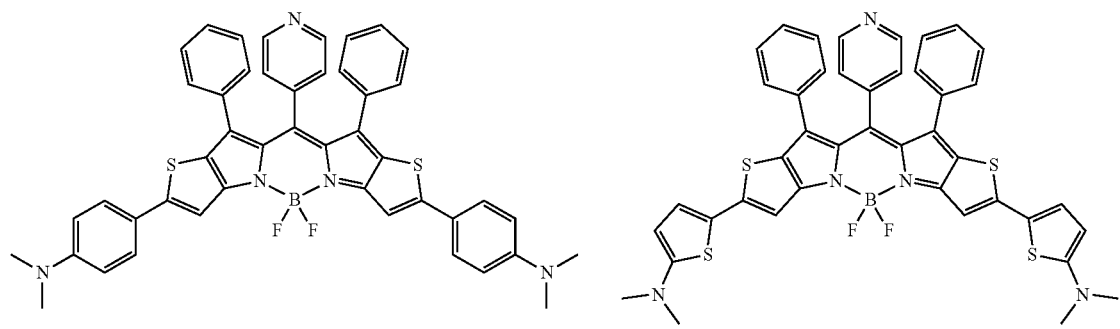
139 140
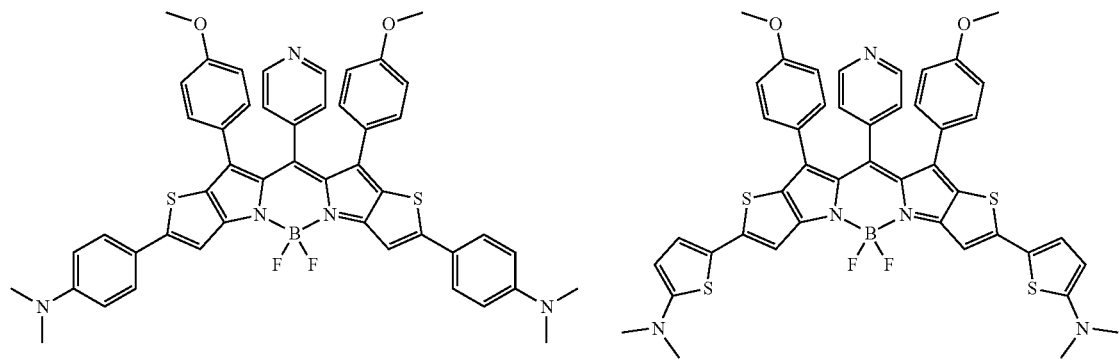
141 142
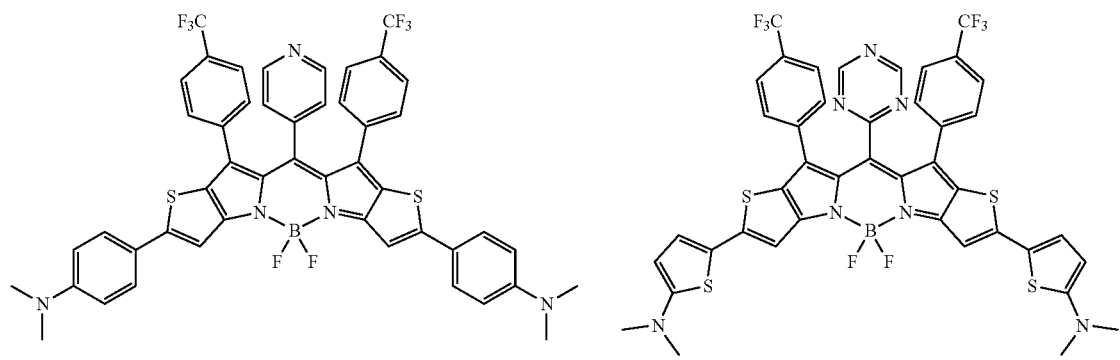

143
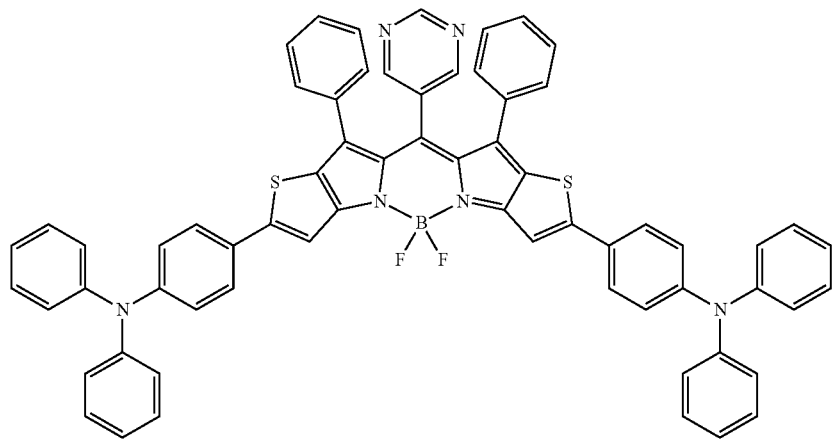
144
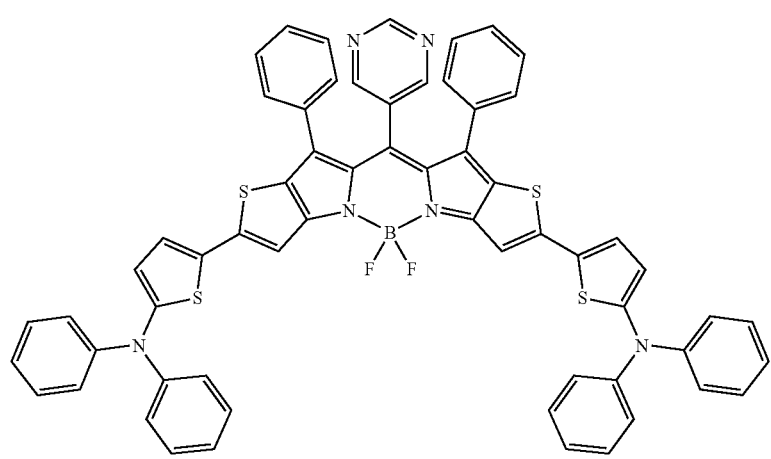
145
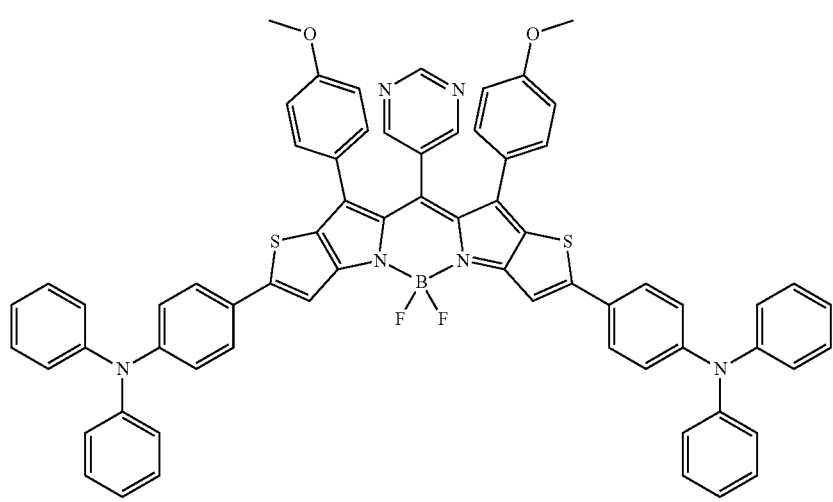

-continued
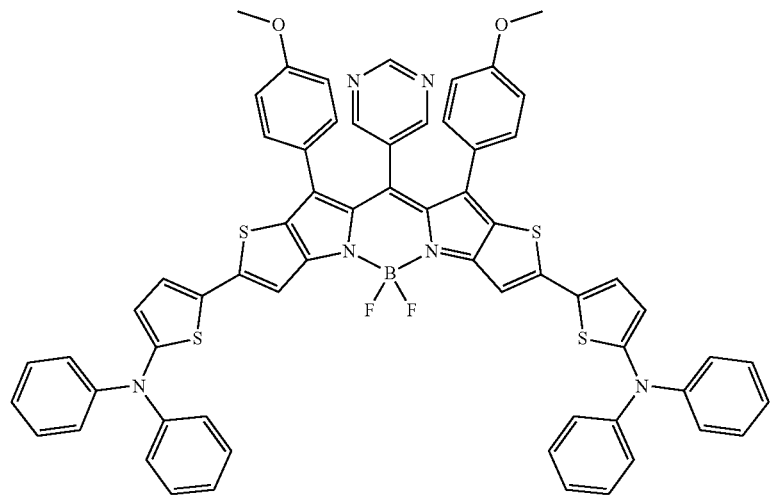
146
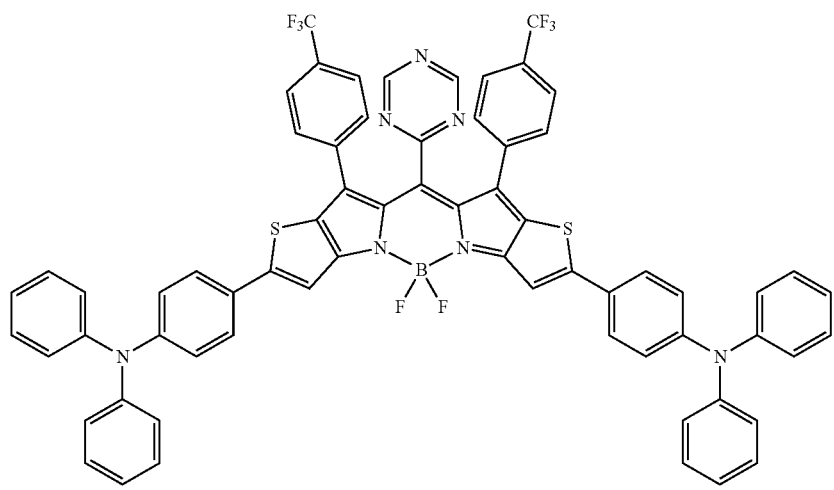
147
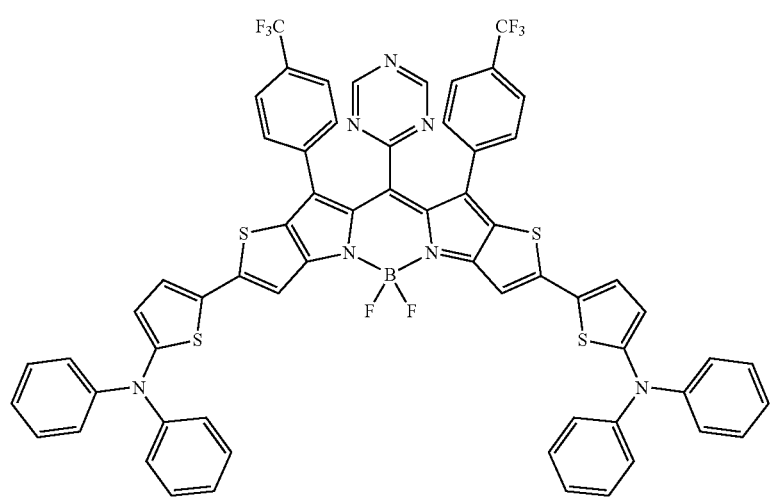
148

149
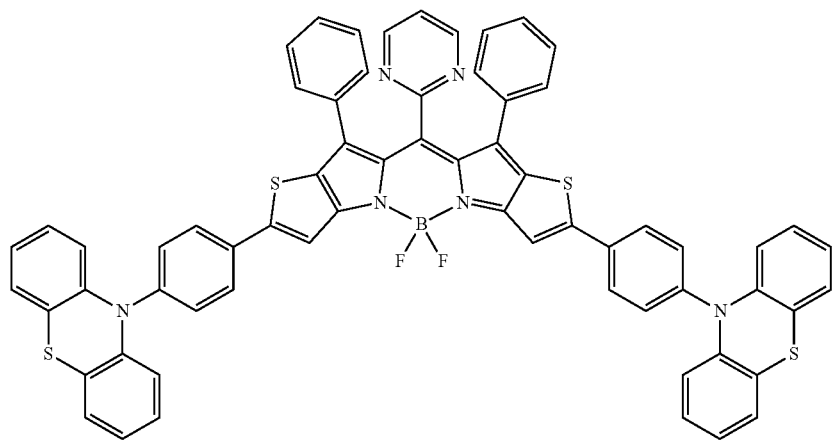
150
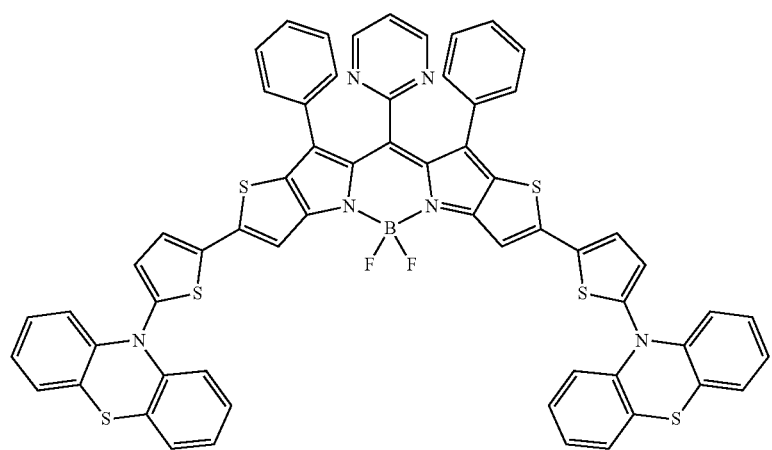
151
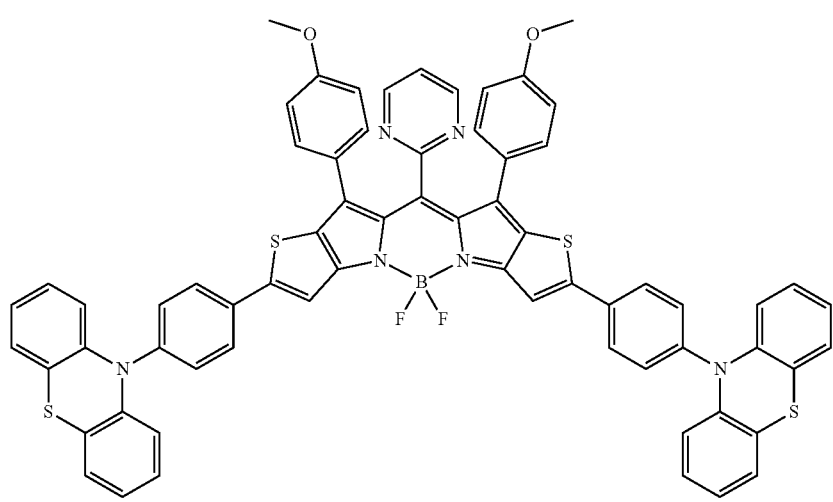

-continued
152
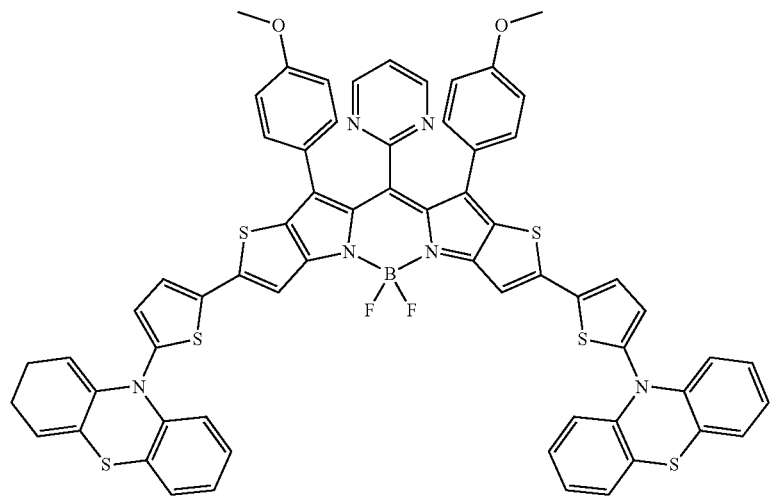
153
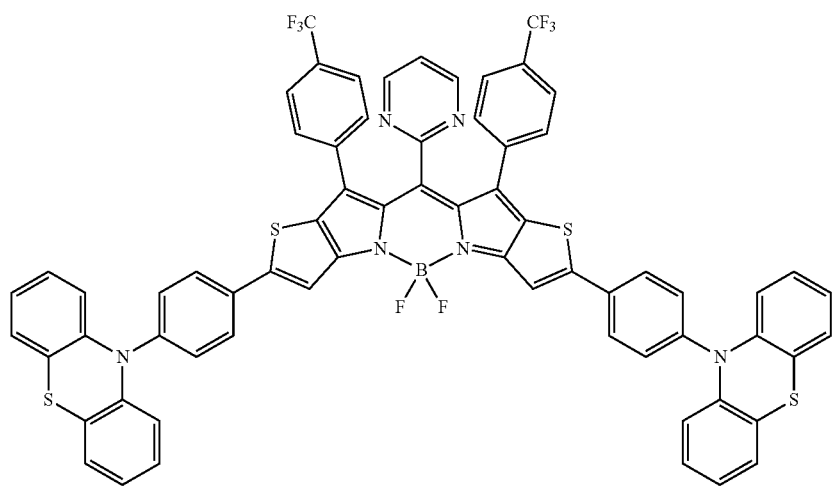
154
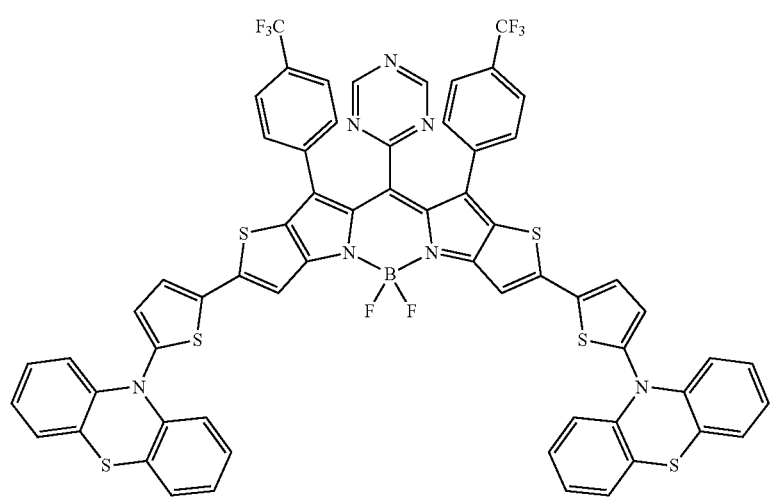

-continued
155
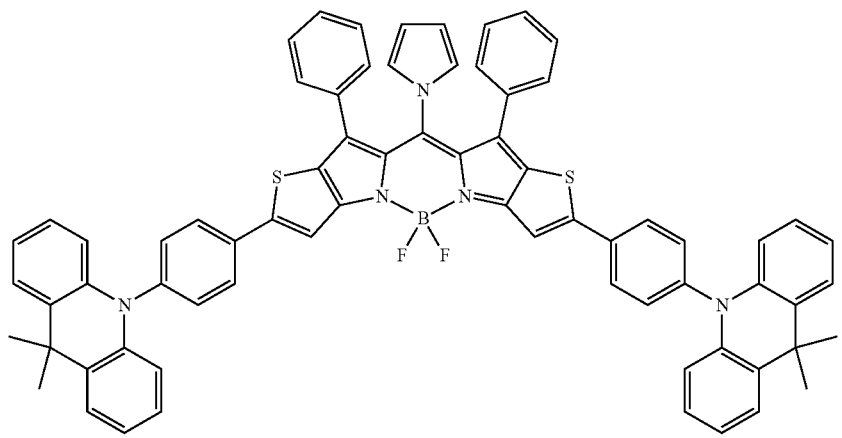
156
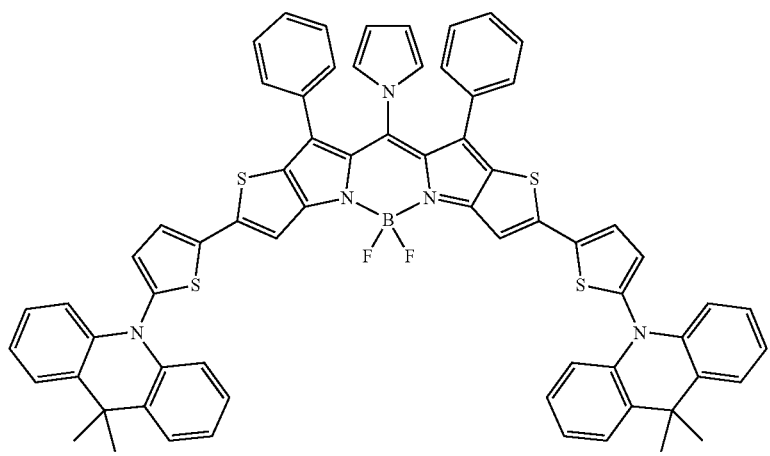
157
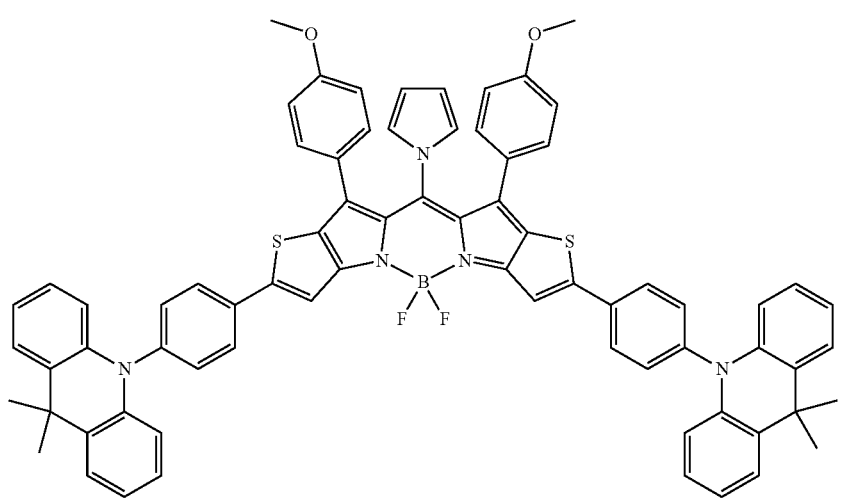

158

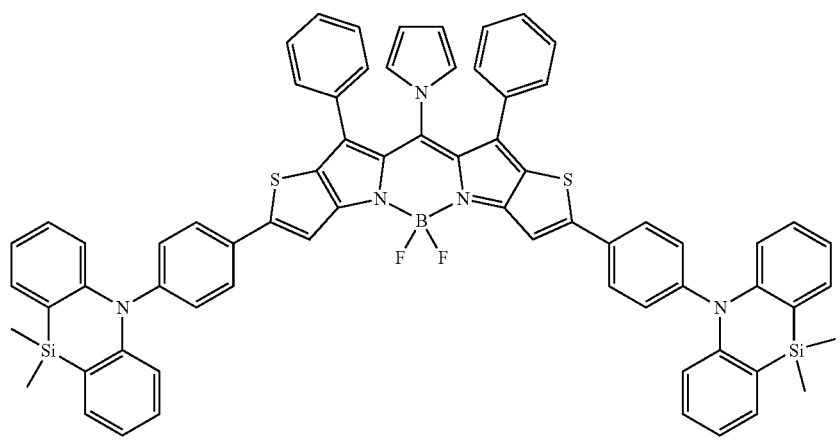

159

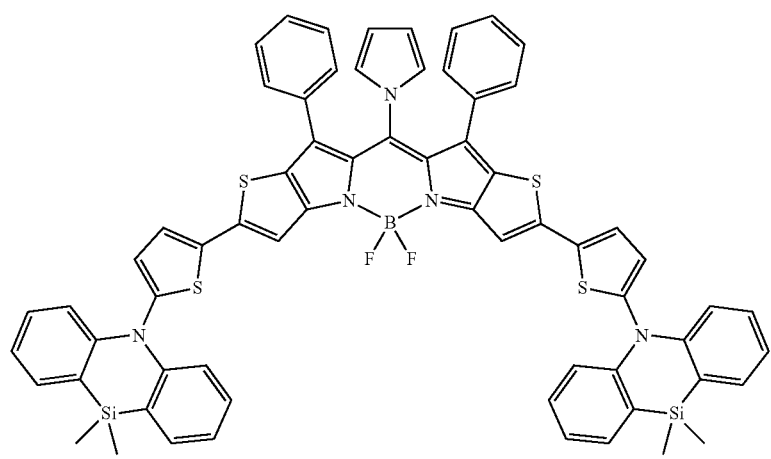

160

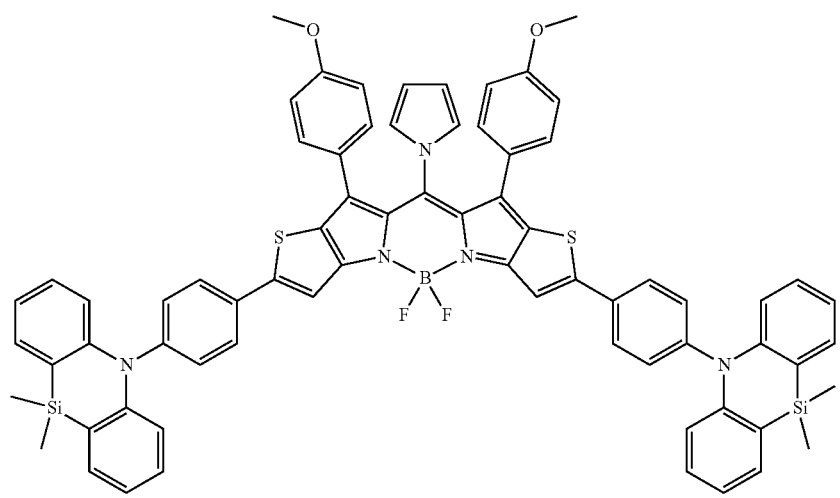

The compound may be a light absorbing material, for example, a light absorbing material configured to absorb light in a near infra-red wavelength spectrum. For example, a peak absorption wavelength of the compound may be for example greater than or equal to about 700 nm, greater than or equal to about 720 nm, greater than or equal to about 730 nm, greater than or equal to about 750 nm, greater than or equal to about 780 nm, greater than or equal to about 790 nm, greater than or equal to about 800 nm, greater than or equal to about 810 nm, greater than or equal to about 820 nm, greater than or equal to about 830 nm, greater than or equal to about 840 nm, greater than or equal to about 850 nm, greater than or equal to about 870 nm, greater than or equal to about 890 nm, greater than or equal to about 900 nm, or greater than or equal to about 910 nm. The peak absorption wavelength of the compound may be in a wavelength spectrum of for example about 700 nm to about 3000 nm, within the range, for example about 750 nm to about 2500 nm, about 780 nm to about 2200 nm, about 790 nm to about 2100 nm, about 800 nm to about 2000 nm, about 810 nm to about 2000 nm, about 820 nm to about 2000 nm, about 830 nm to about 2000 nm, about 850 nm to about 1900 nm, about 870 nm to about 1800 nm, about 900 nm to about 1600 nm, or about 910 nm to about 1500 nm.

The compound may exhibit good charge transfer characteristics and accordingly has good photoelectric conversion characteristics for absorbing light and converting the light into an electrical signal, so that the compound may be effectively used as a photoelectric conversion material of a photoelectric diode.

The compound has good heat resistance, which may prevent or reduce thermal decomposition during deposition, and thus may be deposited repeatedly. The compound may be thermally or vacuum deposited and may be deposited, for example, by sublimation. For example, deposition by sublimation may be confirmed by thermogravimetric analysis (TGA), and at a thermogravimetric analysis at a pressure of less than or equal to about 10 Pa, a temperature at which a 10% weight loss relative to an initial weight occurs may be less than or equal to about 450° C. and a temperature at which a 50% weight loss relative to an initial weight occurs may be less than or equal to about 500° C. For example, at a thermogravimetric analysis of the compound at a pressure of less than or equal to about 10 Pa, for example temperature at which a 10% weight loss relative to an initial weight occurs may be about 230° C. to about 450° C. and a temperature at which a 50% weight loss relative to an initial weight occurs may be about 300° C. to about 500° C.

The compound may be produced in the form of a film.

The film may be applied to various fields where absorption characteristics of the near infra-red wavelength range are required, and may be used, for example, as a near infra-red absorbing/blocking film.

Since the compound has both light absorption properties and photoelectric conversion properties in a near infra-red wavelength spectrum, the compound may be effectively used as a photoelectric conversion material.

Hereinafter, examples of the photoelectric diode and the organic sensor to which a compound of Formula 1 is applied are described with reference to the accompanying drawings.

FIG. 1 is a schematic view showing an example of a pixel array of an organic sensor according to some exemplary embodiment.

Referring to FIG. 1, an organic sensor 200 may include a plurality of pixels PX, and the plurality of pixels PX may have a matrix arrangement repeatedly arranged along columns and/or rows. The plurality of pixels PX may include, for example, a unit pixel group A such as a 2×2 pixel array. However, the arrangement of the pixels is not limited thereto and may be variously modified, and the unit pixel group A may be, for example, various pixel arrays such as a 3×3 pixel array and a 4×4 pixel array.

Figure 2:
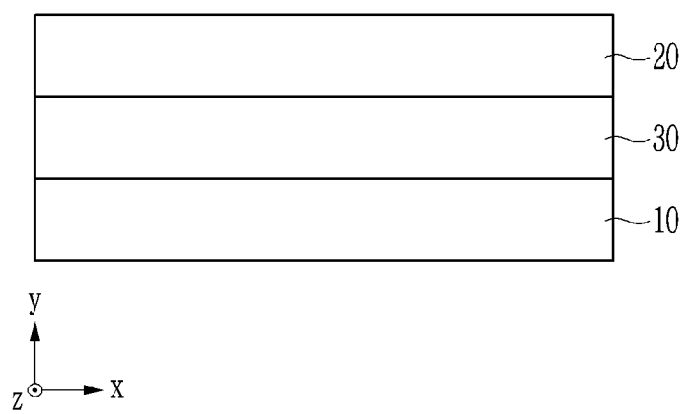
FIG. 2 is a cross-sectional view showing an example of a photoelectric diode according to an exemplary embodiment.

FIG. 2 is a cross-sectional view showing an example of a photoelectric diode according to some exemplary embodiment.

Referring to FIG. 2, a photoelectric diode 100 according to some exemplary embodiment includes a first electrode 10 and a second electrode 20 facing each other and an organic layer 30 between the first electrode 10 and the second electrode 20.

A substrate (not shown) may be disposed at the side of the first electrode 10 or the second electrode 20. The substrate may be for example made of an inorganic material such as glass; an organic material such as polycarbonate, polymethylmethacrylate, polyethyleneterephthalate, polyethylenenaphthalate, polyamide, polyethersulfone, or a combination thereof; or a silicon wafer. The substrate may be omitted.

One of the first electrode 10 and the second electrode 20 is an anode and the other is a cathode. For example, the first electrode 10 may be an anode and the second electrode 20 may be a cathode.

At least one of the first electrode 10 and the second electrode 20 may be a light-transmitting electrode and the light-transmitting electrode may be for example made of a conductive oxide such as an indium tin oxide (ITO), indium zinc oxide (IZO), zinc oxide (ZnO), tin oxide (SnO), aluminum tin oxide (AITO), and fluorine doped tin oxide (FTO), or a metal thin layer of a single layer or a multi-layer. When one of the first electrode 10 and the second electrode 20 is a non-light-transmitting electrode, the non-light-transmitting electrode may be made of for example an opaque conductor such as aluminum (Al), silver (Ag), or gold (Au). For example, both the first electrode 10 and the second electrode 20 may be light-transmitting electrodes. For example, the second electrode 20 may be a light receiving electrode disposed at a light receiving side.

The organic layer 30 may include an active layer.

The active layer is a layer including a p-type semiconductor and an n-type semiconductor to provide a pn junction, which is a layer producing excitons by receiving light from outside and then separating holes and electrons from the produced excitons.

The p-type semiconductor and the n-type semiconductor may be independently a light-absorbing material configured to absorb light in at least one part of a wavelength spectrum and the compound of Formula 1 may be a p-type semiconductor or an n-type semiconductor. For example, the compound of Formula 1 may be used as a p-type semiconductor and fullerene or a fullerene derivative may be included as an n-type semiconductor, but is not limited thereto.

The active layer may include an intrinsic layer (I layer) in which the aforementioned p-type semiconductor and an n-type semiconductor including fullerene derivative are co-deposited. Herein, the p-type semiconductor and the n-type semiconductor may be included in a volume ratio of about 1:9 to about 9:1, for example about 2:8 to about 8:2, about 3:7 to about 7:3, about 4:6 to about 6:4, or about 5:5.

The active layer may further include a p-type layer and/or an n-type layer in addition to the intrinsic layer. The p-type layer may include the aforementioned p-type semiconductor and the n-type layer may include the aforementioned n-type semiconductor. For example, they may be included in various combinations of p-type layer/I layer, I layer/n-type layer, p-type layer/I layer/n-type layer, and the like.

The organic layer 30 includes the compound of Formula 1, and thus may effectively be configured to absorb light in a near infra-red wavelength spectrum and perform photoelectric conversion. For example, a peak absorption wavelength of the organic layer 30 may be for example greater than or equal to about 700 nm, greater than or equal to about 720 nm, greater than or equal to about 730 nm, greater than or equal to about 750 nm, greater than or equal to about 780 nm, greater than or equal to about 790 nm, greater than or equal to about 800 nm, greater than or equal to about 810 nm, greater than or equal to about 820 nm, greater than or equal to about 830 nm, greater than or equal to about 840 nm, greater than or equal to about 850 nm, greater than or equal to about 870 nm, greater than or equal to about 890 nm, greater than or equal to about 900 nm, or greater than or equal to about 910 nm. The peak absorption wavelength of the organic layer 30 may be for example in a wavelength spectrum of about 700 nm to about 3000 nm, within the range, for example about 750 nm to about 2500 nm, about 780 nm to about 2200 nm, about 790 nm to about 2100 nm, about 800 nm to about 2000 nm, about 810 nm to about 2000 nm, about 820 nm to about 2000 nm, about 830 nm to about 2000 nm, about 850 nm to about 1900 nm, about 870 nm to about 1800 nm, about 900 nm to about 1600 nm, or about 910 nm to about 1500 nm.

The organic layer 30 may further include a charge auxiliary layer (not shown) between the first electrode 10 and the active layer and/or the second electrode 20 and the active layer. The charge auxiliary layer may make holes and electrons separated in the active layer 30 be transported easily to improve efficiency.

The charge auxiliary layer may include at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

The charge auxiliary layer may include for example an organic material, an inorganic material, or an organic/inorganic material. The organic material may be an organic material having hole or electron characteristics and the inorganic material may be for example a metal oxide such as a molybdenum oxide, a tungsten oxide, or a nickel oxide.

The charge auxiliary layer may include for example a compound of Formula 1.

The photoelectric diode 100 may further include an anti-reflection layer (not shown) on the first electrode 10 or the second electrode 20. The anti-reflection layer may be disposed at a light incidence side and lower reflectance of light of incident light and thereby light absorbance is further improved. For example, when light enters through the first electrode 10, the anti-reflection layer may be disposed on the first electrode 10 while when light enters through the second electrode 20, the anti-reflection layer may be disposed under the second electrode 20.

The anti-reflection layer may include, for example a material having a refractive index of about 1.6 to about 2.5 and may include for example at least one of a metal oxide, a metal sulfide, and an organic material having a refractive index within the ranges. The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as zinc sulfide; or an organic material such as an amine derivative, but is not limited thereto.

In the photoelectric diode 100, when light enters through the first electrode 10 or the second electrode 20 and the organic layer 30 may be configured to absorb light in a predetermined wavelength spectrum, excitons may be generated thereinside. The excitons may be separated into holes and electrons in the organic layer 30, and the separated holes may be transported to an anode that is one of the first electrode 10 and the second electrode 20 and the separated electrons may be transported to the cathode that is the other of the first electrode 10 and the second electrode 20 so as to flow a current.

The photoelectric diode 100 may be applied to a solar cell, an image sensor, a photodetector, or a photosensor, but is not limited thereto.

The photoelectric diode may be for example applied to an organic sensor. The organic sensor may be an organic CMOS sensor, for example an organic CMOS infra-red light sensor or an organic CMOS image sensor.

Figure 3:
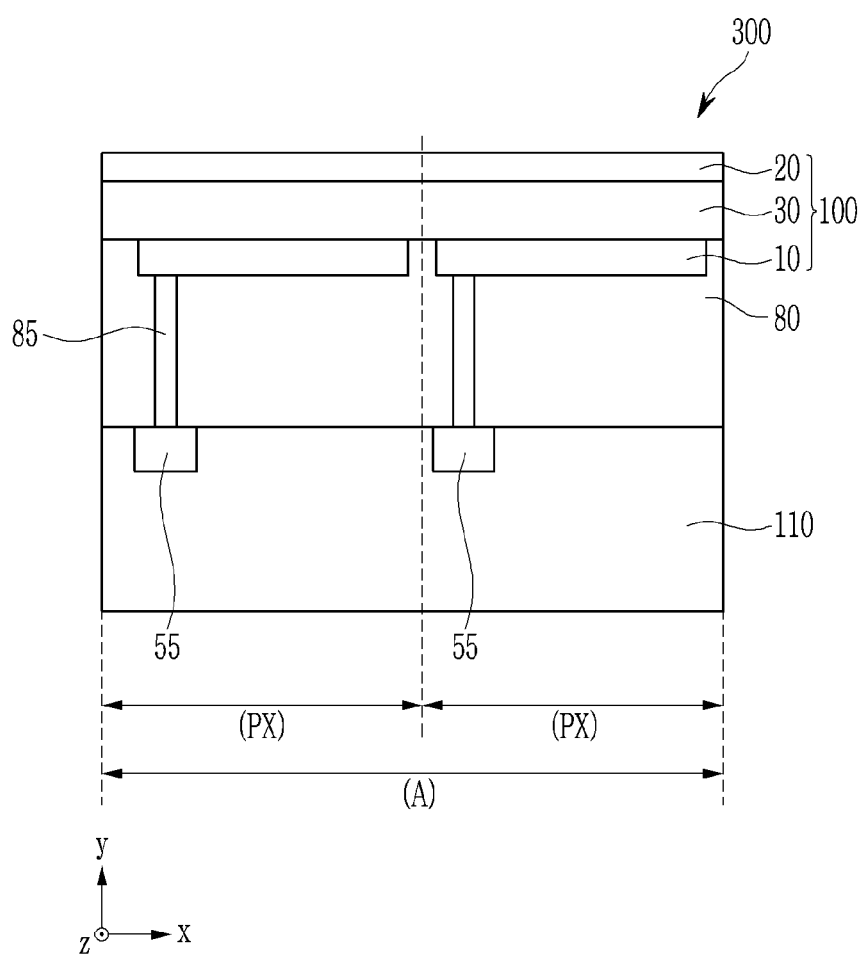
FIG. 3 is a cross-sectional view showing organic sensor according to an exemplary embodiment.

FIG. 3 is a cross-sectional view showing an organic sensor according to an exemplary embodiment.

The organic sensor 300 according to present embodiment includes a semiconductor substrate 110, an insulation layer 80, and a photoelectric diode 100.

The semiconductor substrate 110 may be a silicon substrate and is integrated with a transmission transistor (not shown) and a charge storage 55. The charge storage 55 may be integrated in each pixel. The charge storage 55 is electrically connected to the photoelectric diode 100 that will be described later and information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the semiconductor substrate 110.

The insulation layer 80 is formed on the metal wire and pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The aforementioned photoelectric diode 100 is formed on the insulation layer 80. As described above, the photoelectric diode 100 includes a first electrode 10, an organic layer 30, and a second electrode 20. Even though a structure in which the first electrode 10, the organic layer 30 and the second electrode 20 are sequentially stacked is shown as an example in the drawing, the present disclosure is not limited to this structure, and the second electrode 20, the organic layer 30, and the first electrode 10 may be arranged in this order.

The first electrode 10 and the second electrode 20 may both be transparent electrodes, and the organic layer 30 is the same as described above. The organic layer 30 may selectively absorb light in a near infra-red wavelength spectrum. Incident light from the side of the second electrode 20 may be photoelectrically converted by mainly absorbing light in a near infra-red wavelength spectrum in the organic layer 30.

A focusing lens (not shown) may be further formed on the photoelectric diode 100. The focusing lens may control a direction of incident light and gather the light in one region. The focusing lens may have a shape of, for example, a cylinder or a hemisphere, but is not limited thereto.

The organic sensor according to the present embodiment may be an organic infra-red light sensor, for example an iris sensor or a depth sensor.

The iris sensor identifies a person by using unique iris characteristics of every person and specifically, taking an image of an eye of a user within an appropriate distance, processing the image, and comparing it with his/her stored image.

The depth sensor identifies a shape and a location of an object from its three-dimensional information by taking an image of the object within an appropriate distance with a user and processing the image. This depth sensor may be for example used as a face recognition sensor.

Figure 4:
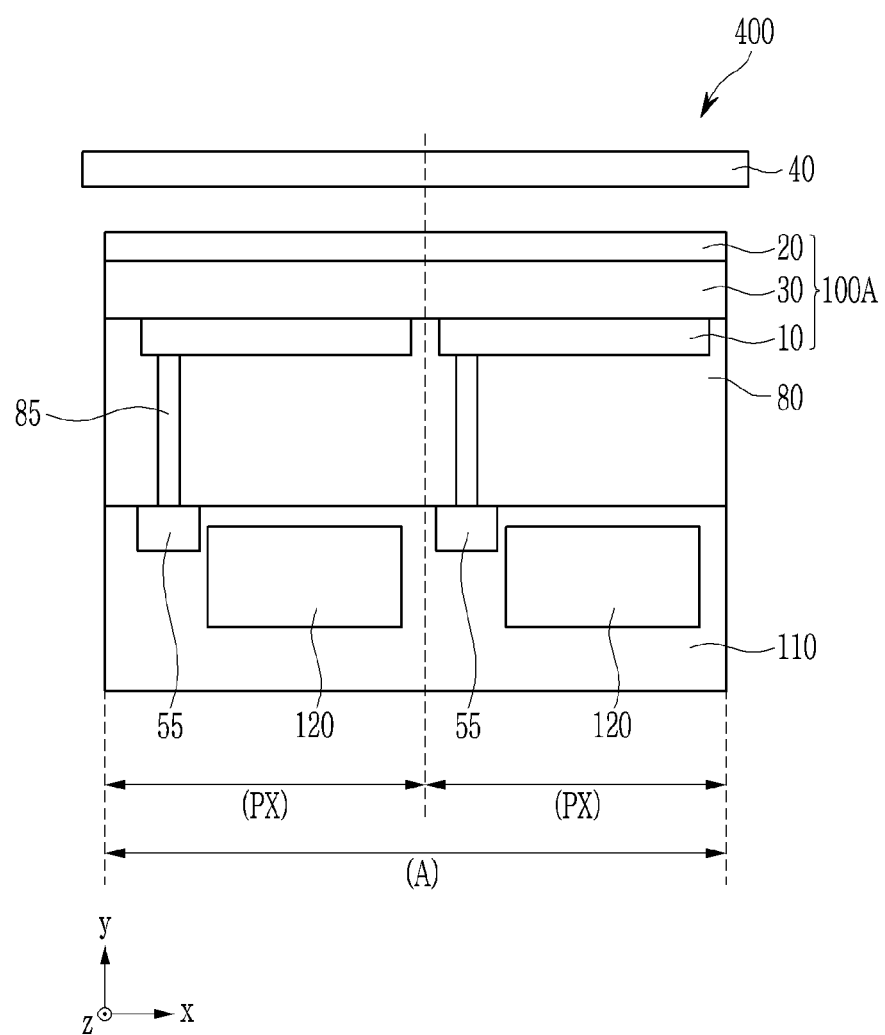
FIG. 4 is a cross-sectional view showing an organic sensor according to an exemplary embodiment.

FIG. 4 is a cross-sectional view showing another example of an organic sensor according to an exemplary embodiment.

The organic sensor according to the present embodiment may include a plurality of sensors having different functions. For example, at least one of the plurality of sensors having different functions may be a biometric sensor, and the biometric sensor may be for example an iris sensor, a depth sensor, a fingerprint sensor, a blood vessel distribution sensor, and the like, but is not limited thereto. For example, one of the plurality of sensors having different functions may be an iris sensor and the other may be a depth sensor.

For example, a plurality of sensors may include, for example a first infra-red light sensor configured to sense light in a near infra-red region having a first wavelength ($\lambda_1$) in a infra-red wavelength spectrum and a second infra-red light sensor configured to sense light in a near infra-red region having a second wavelength ($\lambda_2$) in an infra-red wavelength spectrum.

The first wavelength ($\lambda_1$) and the second wavelength ($\lambda_2$) may be for example different in a wavelength spectrum of about 750 nm to about 3000 nm, and for example a difference between the first wavelength ($\lambda_1$) and the second wavelength ($\lambda_2$) may be greater than or equal to about 30 nm, greater than or equal to about 50 nm, greater than or equal to about 70 nm, greater than or equal to about 80 nm, or greater than or equal to about 90 nm.

For example, one of the first wavelength ($\lambda_1$) and the second wavelength ($\lambda_2$) may belong to a wavelength spectrum of about 780 nm to about 900 nm and the other of the first wavelength ($\lambda_1$) and the second wavelength ($\lambda_2$) may belong to a wavelength spectrum of about 830 nm to about 1000 nm.

For example, one of the first wavelength ($\lambda_1$) and the second wavelength ($\lambda_2$) may belong to a wavelength spectrum of about 780 nm to about 840 nm and the other of the first wavelength ($\lambda_1$) and the second wavelength ($\lambda_2$) may belong to a wavelength spectrum of about 910 nm to about 970 nm.

For example, one of the first wavelength ($\lambda_1$) and the second wavelength ($\lambda_2$) may belong to a wavelength spectrum of about 800 nm to about 830 nm and the other of the first wavelength ($\lambda_1$) and the second wavelength ($\lambda_2$) may belong to a wavelength spectrum of about 930 nm to about 950 nm.

For example, one of the first wavelength ($\lambda_1$) and the second wavelength ($\lambda_2$) may belong to a wavelength spectrum of about 805 nm to about 815 nm and the other of the first wavelength ($\lambda_1$) and the second wavelength ($\lambda_2$) may belong to a wavelength spectrum of about 935 nm to about 945 nm.

For example, one of the first wavelength ($\lambda_1$) and the second wavelength ($\lambda_2$) may about 810 nm and the other of the first wavelength ($\lambda_1$) and the second wavelength ($\lambda_2$) may be about 940 nm.

The organic sensor 400 according to the present embodiment includes a dual bandpass filter 40, a first infra-red light sensor 100A, an insulation layer 80, and a semiconductor substrate 110 integrated with a second infra-red light sensor 120. The first infra-red light sensor 100A and the second infra-red light sensor 120 may be stacked.

The dual bandpass filter 40 may be disposed on a front side of the organic sensor 400 and may selectively transmit infra-red light including the first wavelength ($\lambda_1$) and infra-red light including the second wavelength ($\lambda_2$) and may block and/or absorb other light. Herein, other light may include light in an ultraviolet (UV) and visible region.

The first infra-red light sensor 100A may be the photoelectric diode 100 according to the aforementioned embodiment and details thereof are omitted.

The second infra-red light sensor 120 may be integrated in the semiconductor substrate 110 and may be a photo-sensing device. The semiconductor substrate 110 may be for example a silicon substrate and may be integrated with the second infra-red light sensor 120, the charge storage 55, and a transmission transistor (not shown).

The second infra-red light sensor 120 may be a photodiode and may sense entered light, and sensed information is transferred by the transmission transistor. Herein, the light entered into the second infra-red light sensor 120 is light that passes the dual bandpass filter 40 and the first infra-red light sensor 100A and may be infra-red light in a predetermined region including the second wavelength ($\lambda_2$). All infra-red light in a predetermined region including the first wavelength ($\lambda_1$) may be absorbed by the organic layer 30 and may not reach the second infra-red light sensor 120. In this case, a separate filter for wavelength selectivity with respect to the light entered into the second infra-red light sensor 120 is not separately needed. However, for the time when all infra-red light in a predetermined region including the first wavelength ($\lambda_1$) is not absorbed by organic layer 30, a filter between the first infra-red light sensor 100A and the second infra-red light sensor 120 may be further disposed.

The organic sensor according to the present embodiment may include two infra-red light sensors respectively performing separately functions and thus may work as a combination sensor. In addition, two sensors performing separately functions are stacked in each pixel, and thus the number of pixel performing functioning of each sensor is twice increased while maintaining a size and resultantly, sensitivity may be much improved.

Figure 5:
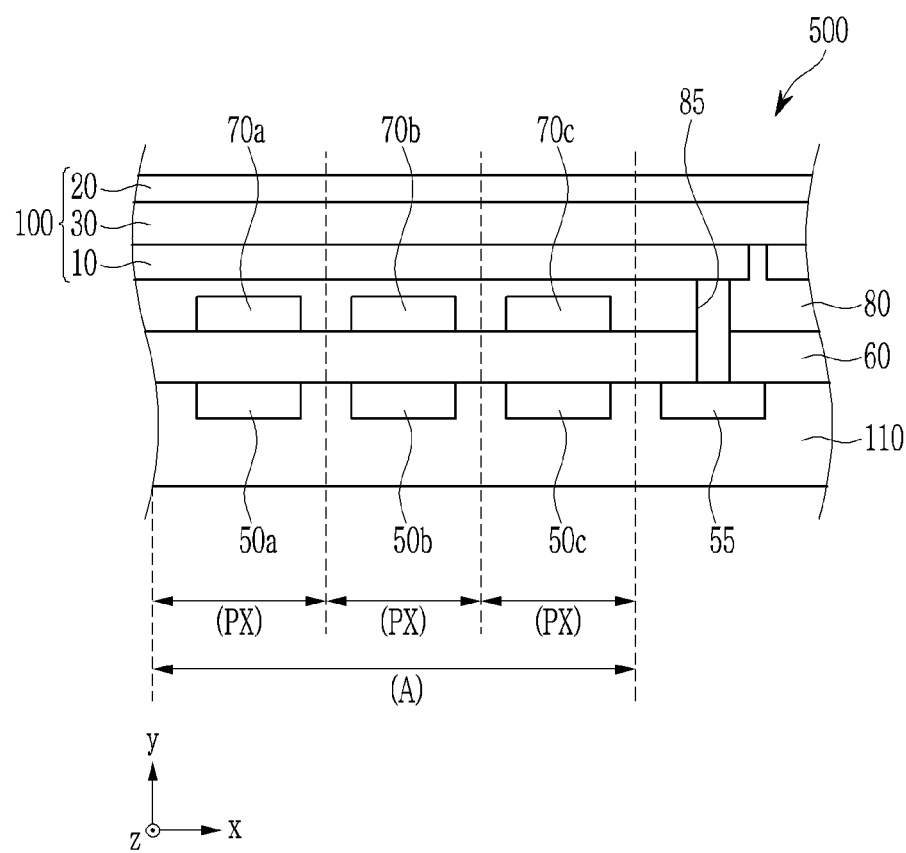
FIG. 5 is a cross-sectional view showing an organic sensor according to an exemplary embodiment.

FIG. 5 is a cross-sectional view showing another example of an organic sensor according to some exemplary embodiment.

An organic sensor according to the present embodiment may be an organic CMOS image sensor.

Referring to FIG. 5, an organic sensor 500 according to an embodiment includes a semiconductor substrate 110 integrated with photo-sensing devices 50a, 50b, and 50c, a transmission transistor (not shown), and a charge storage 55, a lower insulation layer 60, color filter layers 70a, 70b, and 70c, an upper insulation layer 80, and a photoelectric diode 100.

The semiconductor substrate 110 may be integrated with photo-sensing devices 50a, 50b, and 50c, a transmission transistor (not shown), and a charge storage 55. The photo-sensing devices 50a, 50b, and 50c may be photodiodes.

The photo-sensing devices 50a, 50b, and 50c, the transmission transistor, and/or the charge storage 55 may be integrated in each pixel. For example, the photo-sensing device 50a may be included in a red pixel, the photo-sensing device 50b may be included in a green pixel, and the photo-sensing device 50c may be included in a blue pixel.

The photo-sensing devices 50a, 50b, and 50c sense light, the information sensed by the photo-sensing devices may be transferred by the transmission transistor, the charge storage 55 is electrically connected to the photoelectric diode 100 that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. However, it is not limited to the structure, and the metal wire and pad may be disposed under the photo-sensing devices 50a, 50b, and 50c.

The lower insulation layer 60 is formed on the metal wire and the pad.

Color filters 70a, 70b, and 70c are formed on the lower insulation layer 60. The color filters 70a, 70b, and 70c includes a red filter 70a formed in a red pixel, a green filter 70b formed in a green pixel, and a blue filter 70c formed in a blue pixel.

The upper insulation layer 80 is formed on the color filters 70a, 70b, and 70c. The upper insulation layer 80 eliminates steps caused by the color filters 70a, 70b, and 70c and planarizes the surface.

The photoelectric diode 100 is formed on the upper insulation layer 80. As described above, the photoelectric diode 100 includes a first electrode 10, an organic layer 30, and a second electrode 20. Even though a structure in which the first electrode 10, the organic layer 30 and the second electrode 20 are sequentially stacked is shown as an example in the drawing, the present disclosure is not limited to this structure, and the second electrode 20, the organic layer 30, and the first electrode 10 may be arranged in this order.

The first electrode 10 and the second electrode 20 may both be transparent electrodes, and the organic layer 30 is the same as described above. The organic layer 30 may be configured to selectively absorb light in a near infra-red wavelength spectrum.

Incident light from the side of the second electrode 20 may be configured to be photoelectrically converted by mainly absorbing light in a near infra-red wavelength spectrum in the organic layer 30. Light in the remaining wavelength spectrum may pass through the first electrode 10 and the color filters 70a, 70b, and 70c, the light in a red wavelength spectrum passing through the color filter 70a may be sensed by the photo-sensing device 50a, the light in a green wavelength spectrum passing through the color filter 70b may be sensed by the photo-sensing device 50b, and the light in a blue wavelength spectrum passing through the color filter 70c may be sensed by the photo-sensing device 50c.

Figure 6:
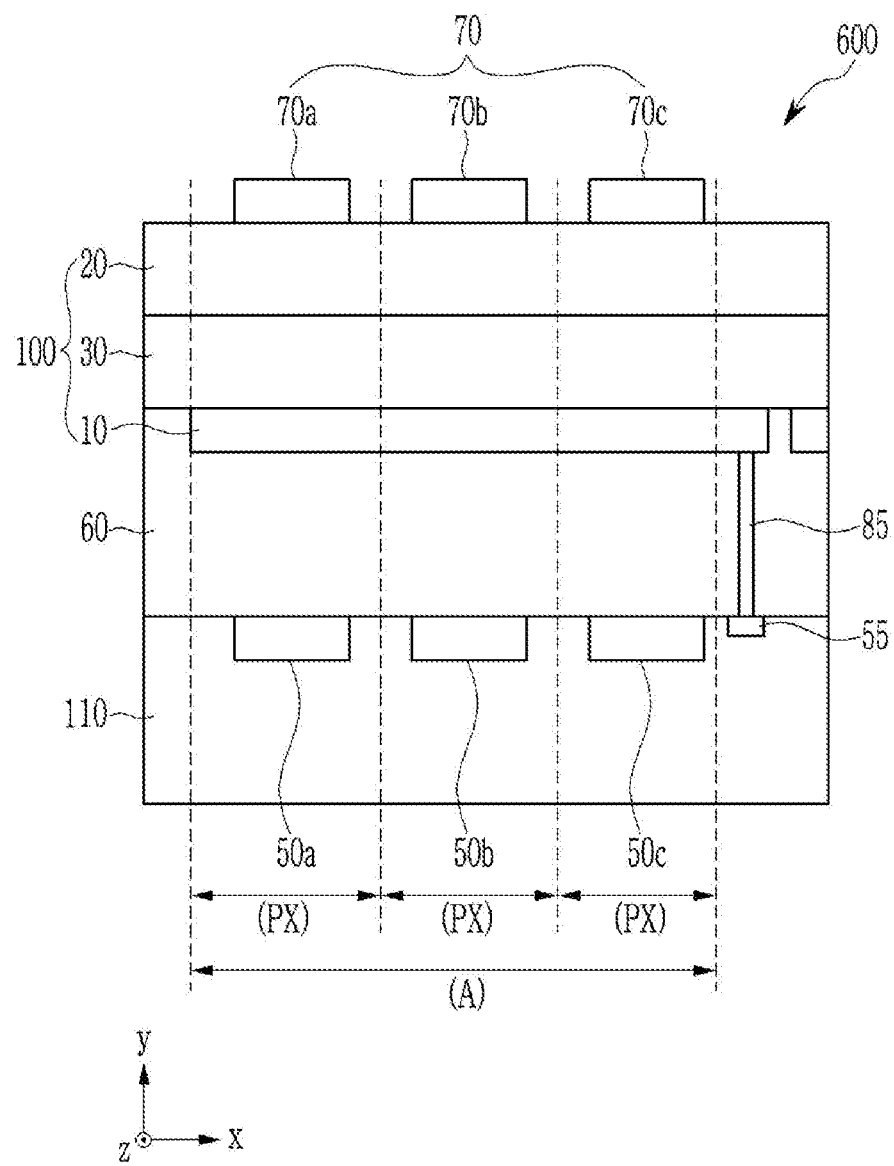
FIG. 6 is a schematic cross-sectional view of an organic sensor according to an exemplary embodiment.

FIG. 6 is a schematic cross-sectional view of another example of an organic sensor according to some exemplary embodiment.

Referring to FIG. 6, an organic sensor 600 according to an embodiment includes a semiconductor substrate 110 including photo-sensing devices 50a, 50b, and 50c, a transmission transistor (not shown), and a charge storage 55, a lower insulation layer 60, a color filter layer 70 including color filters 70a, 70b, and 70c, and a photoelectric diode 100. Referring to FIG. 6, the photoelectric diode 100 may be disposed between the semiconductor substrate 110 and the color filter layer 70, such that the color filter layer 70 is far from the photo-sensing devices 50a, 50b, and 50c with respect to the photoelectric diode 100. Other constituent elements are the same as the organic sensor of FIG. 5.

For example, the color filter layer 70 may further include a mixed color filter configured to transmit a wavelength spectrum of light of mixed colors. For example, in FIG. 6, the color filter 70a may be configured to selectively filter light in a magenta wavelength spectrum, the color filter 70b may be configured to selectively filter light in a cyan wavelength spectrum, and the color filter 70c may be configured to selectively filter light in a yellow wavelength spectrum. Herein, the photo-sensing device 50a may be configured to sense blue light and the photo-sensing device 50b may be configured to sense red light.

Figure 7:
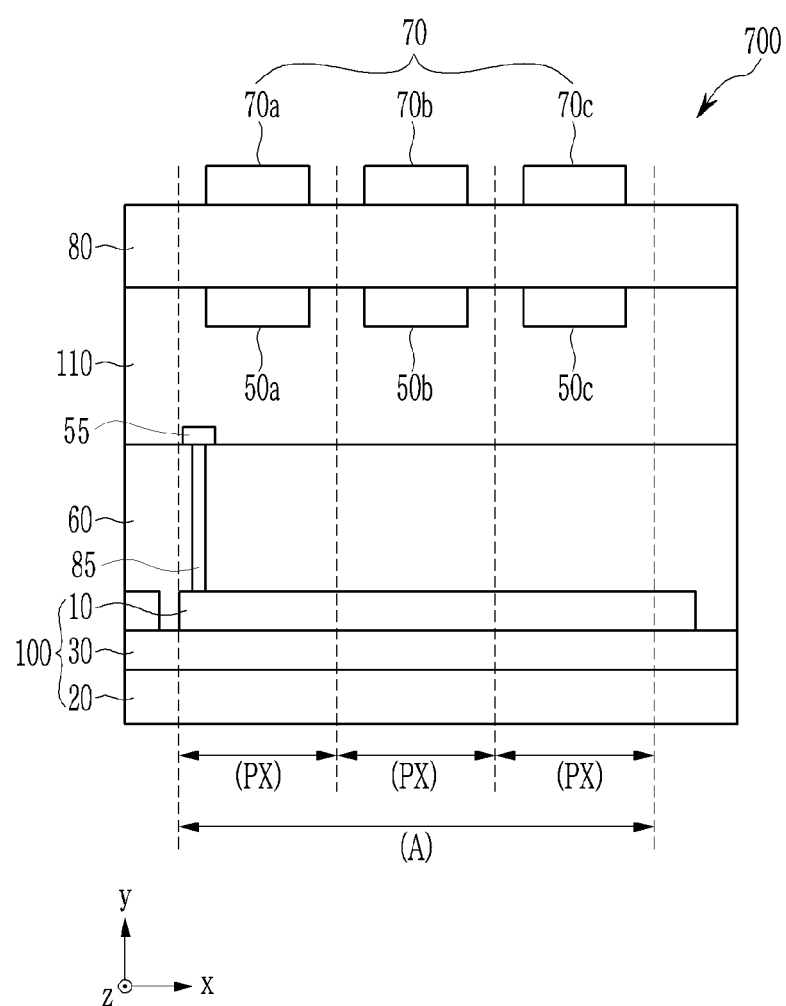
FIG. 7 is a schematic cross-sectional view of an organic sensor according to an exemplary embodiment.

FIG. 7 is a schematic cross-sectional view of another example of an organic sensor according to some exemplary embodiment.

Referring to FIG. 7, an organic image sensor 700 according to an embodiment includes a semiconductor substrate 110 including photo-sensing devices 50a, 50b, and 50c, a transmission transistor (not shown), and a charge storage 55; a lower insulation layer 60, a color filter layer 70 including color filters 70a, 70b, and 70c; an upper insulation layer 80; and a photoelectric diode 100 under the semiconductor substrate 110.

As shown in FIG. 7, the photoelectric diode 100 is disposed under the semiconductor substrate 110, and thereby the color filter layer 70 is far from the photoelectric diode 100 with respect to the photo-sensing devices 50a, 50b, and 50c. Other constituent elements are the same as the organic sensor of FIG. 5.

Figure 8:
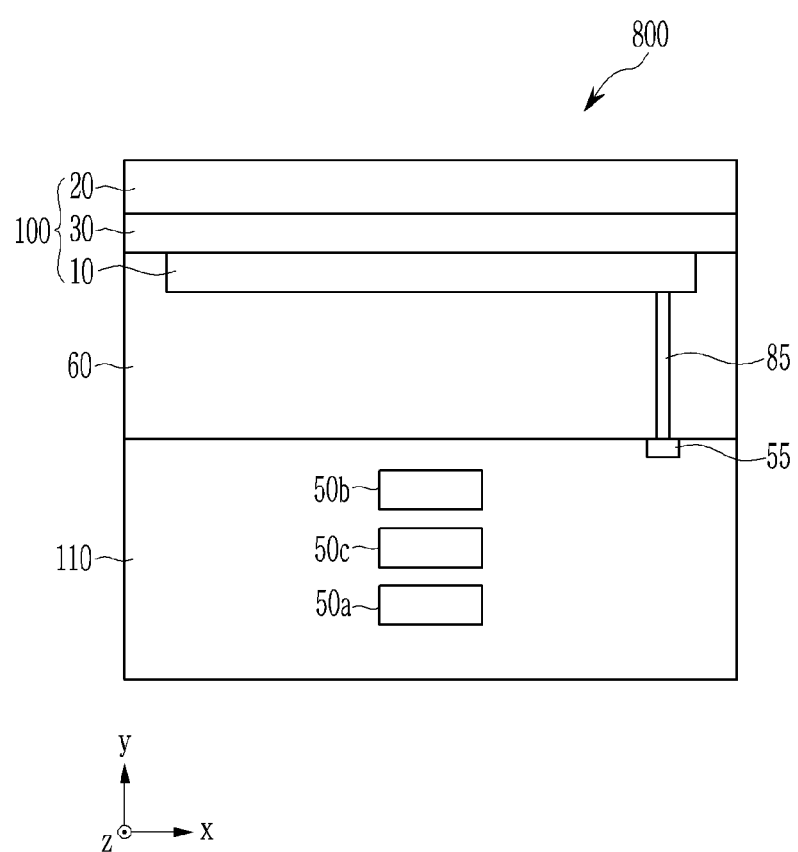
FIG. 8 is a schematic cross-sectional view showing an organic sensor according to an exemplary embodiment.

FIG. 8 is a schematic cross-sectional view showing an organic sensor according to some exemplary embodiment.

Referring to FIG. 8, an organic sensor 800 according to an embodiment includes a semiconductor substrate 110 including photo-sensing devices 50a, 50b, and 50c, a transmission transistor (not shown), and a charge storage 55; an insulation layer 60 having a trench 85, and a photoelectric diode 100. In the organic sensor 800, the photo-sensing devices 50a, 50b, and 50c are stacked in a vertical direction and the color filter layer 70 is omitted. The photo-sensing devices 50a, 50b, and 50c are electrically connected to charge storage (not shown) and their information may be transferred by the transmission transistor. The photo-sensing devices 50a, 50b, and 50c may selectively absorb light in each wavelength spectrum of light depending on a stack depth. Other constituent elements are the same as the organic sensor of FIG. 5.

Figure 9:
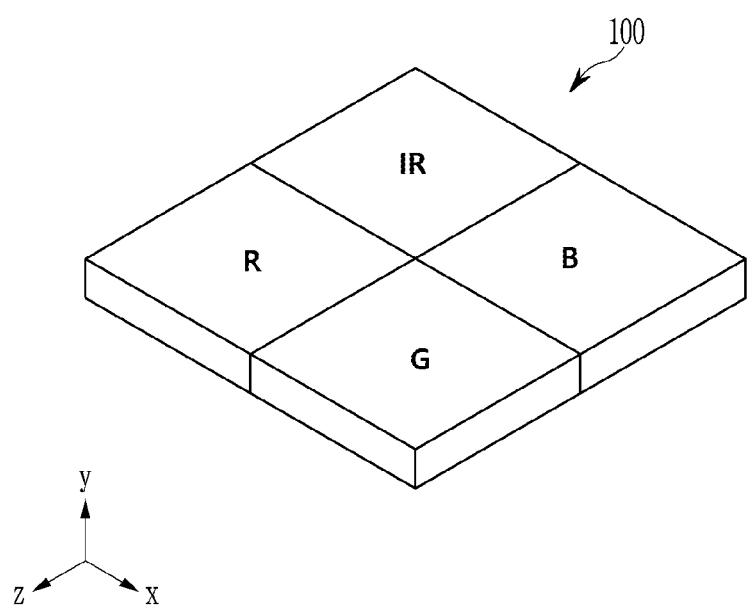
FIG. 9 is a schematic top view of an example of an organic sensor according to some exemplary embodiment.
Figure 10:
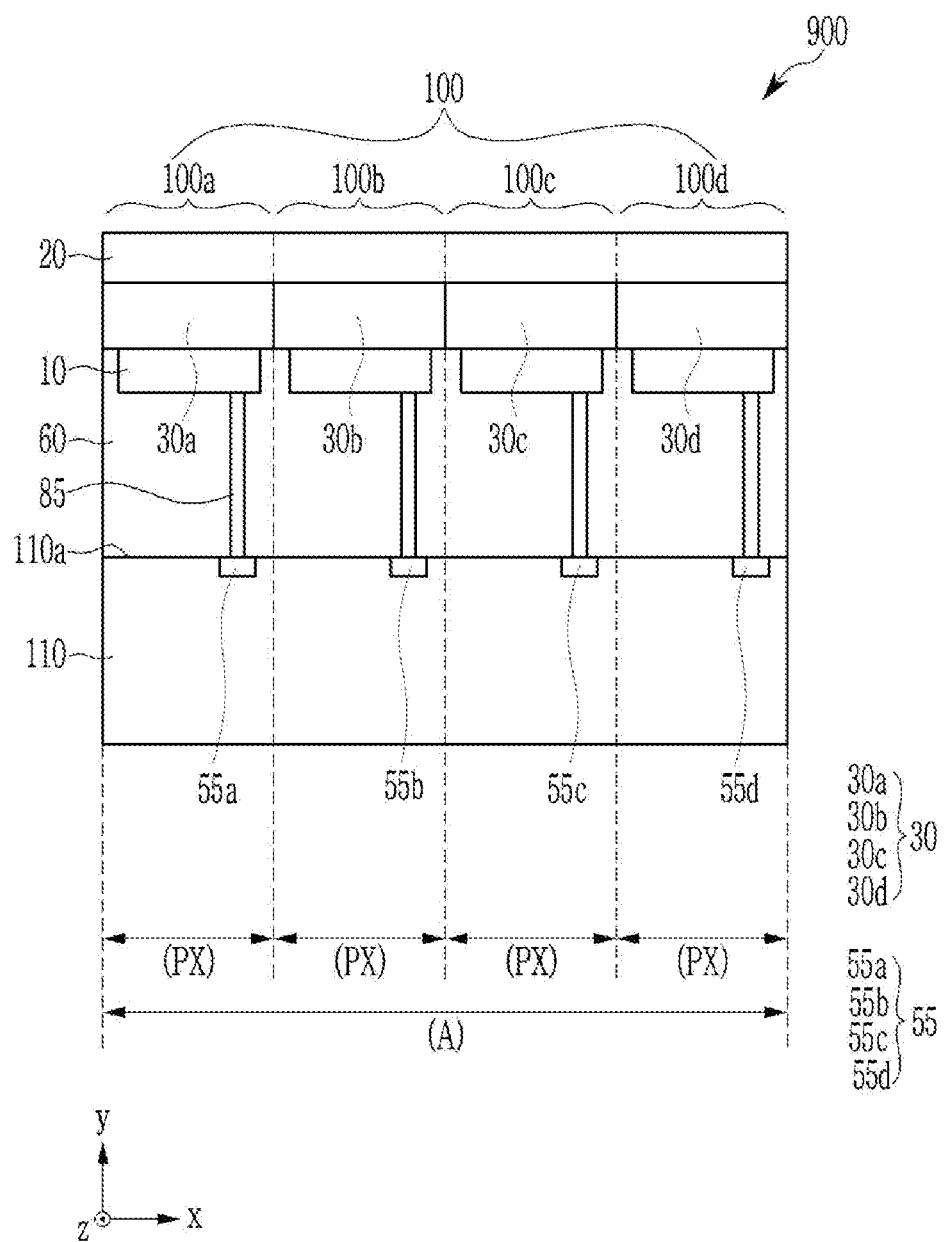
FIG. 10 is a schematic cross-sectional view of the organic sensor of FIG. 9.

FIG. 9 is a schematic top view of an example of an organic sensor according to some exemplary embodiment and FIG. 10 is a schematic cross-sectional view of the organic sensor of FIG. 9.

Referring to FIGS. 9 and 10, an organic sensor 900 according to an embodiment includes a near infra-red photoelectric diode configured to selectively absorb light in a near infra-red wavelength spectrum, a red photoelectric diode configured to selectively absorb light in a red wavelength spectrum and convert it into electrical signals, a green photoelectric diode configured to selectively absorb light in a green wavelength spectrum and convert it into electrical signals, and a blue photoelectric diode configured to selectively absorb light in a blue wavelength spectrum and convert it into electrical signals. The near infra-red photoelectric diode, red photoelectric diode, green photoelectric diode, and blue photoelectric diode are arranged in parallel in a horizontal direction.

Referring to FIG. 10, the organic sensor 900 according to an embodiment includes a photoelectric diode 100 that includes a plurality of photoelectric diodes 100a, 100b, 100c, and 100d on a semiconductor substrate 110. The plurality of photoelectric diodes 100a, 100b, 100c, and 100d are configured to absorb light in one wavelength spectrum of the red wavelength spectrum, blue wavelength spectrum, green wavelength spectrum, and near infra-red wavelength spectrum and to convert it into electrical signals.

Referring to FIG. 10, an organic sensor 900 according to an embodiment includes a semiconductor substrate 110 integrated with photo-sensing devices 55a to 55d, and a transmission transistor (not shown); a lower insulation layer 60; and photoelectric diodes 100a to 100d. The photoelectric diodes 100a to 100d are disposed in parallel on the semiconductor substrate 110 and are partially overlapped with each other. Each of the photoelectric diodes 100a to 100d are overlapped with each other in a parallel direction on the surface 110a of the semiconductor substrate 110. Each of the photoelectric diodes 100a to 100d may be electrically connected to the charge storage 55 that is integrated into the semiconductor substrate 110, via the trench 85. One of photoelectric diodes 100a to 100d may be the aforementioned photoelectric diode 100. For example, the photoelectric diodes 100a to 100d may share the same common electrode as the second electrode 20. Other constituent elements are the same as the organic sensor of FIG. 5.

Figure 11:
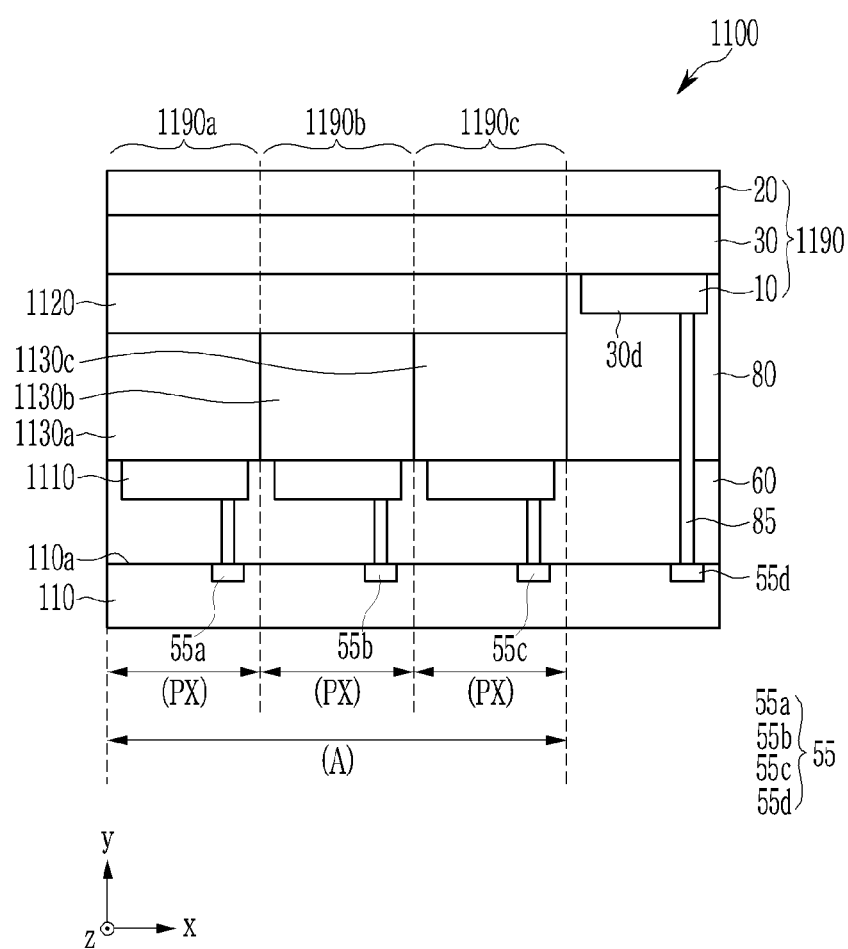
FIG. 11 is a schematic cross-sectional view of an example of an organic sensor according to some exemplary embodiment.

FIG. 11 is a schematic cross-sectional view of an example of an organic sensor according to some exemplary embodiment.

Referring to FIG. 11, an organic sensor 1100 according to an embodiment includes a semiconductor substrate 110 integrated with a charge storage and a transmission transistor (not shown); a lower insulation layer 60; a first photoelectric diode 1190, a second photoelectric diode 1190a, a third photoelectric diode 1190b; and a fourth photoelectric diode 1190c. The first photoelectric diode 1190 may be a photoelectric diode that absorbs light in a near infra-red wavelength spectrum and may be formed on the second to fourth photoelectric diodes 1190a to 1190c. The first photoelectric diode 1190 may be the aforementioned photoelectric diode 100. The second to fourth photoelectric diodes 1190a to 1190c may be configured to selectively absorb light in a different wavelength spectrum of a blue wavelength spectrum, a red wavelength spectrum, and a green wavelength spectrum. For example, the second to fourth photoelectric diodes 1190a to 1190c may share a common electrode 1120, and may include a separate pixel electrode 1110 and separate photoelectric conversion layers 1130a, 1130b, and 1130c, respectively. Other constituent elements are the same as the organic sensor of FIG. 5.

Referring to FIG. 11, the first photoelectric diode 1190 are stacked on the second to fourth photovoltaic elements 1190a to 1190c, which overlap each other in a direction perpendicular to the surface of the semiconductor substrate 110. The second to fourth photoelectric diodes 1190a to 1190c may partially overlap in a direction parallel to the surface of the semiconductor substrate 110.

Figure 12:
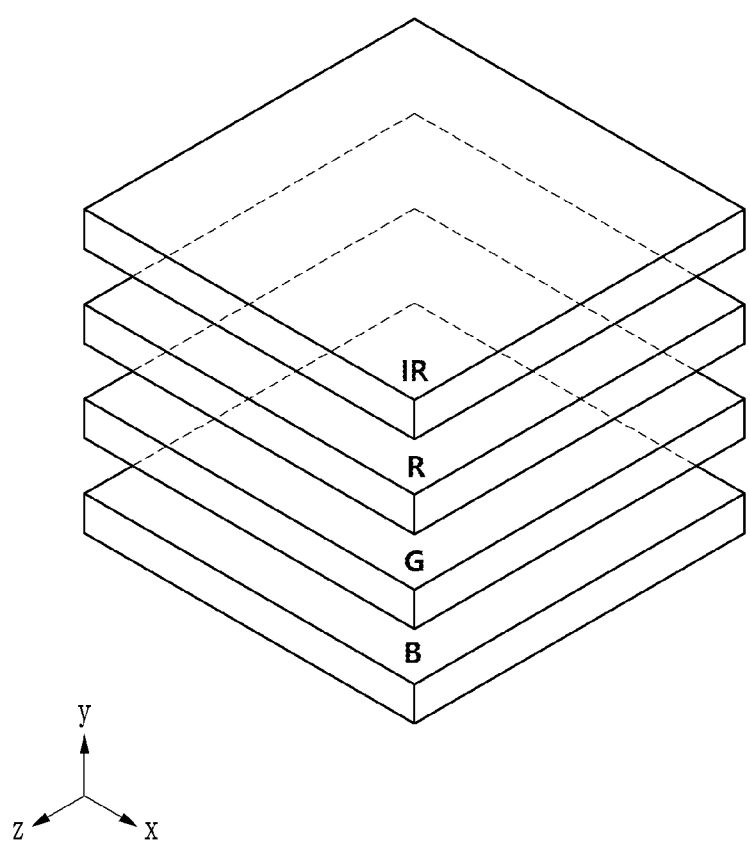
FIG. 12 is a schematic perspective view of an example of an organic sensor according to some exemplary embodiment.
Figure 13:
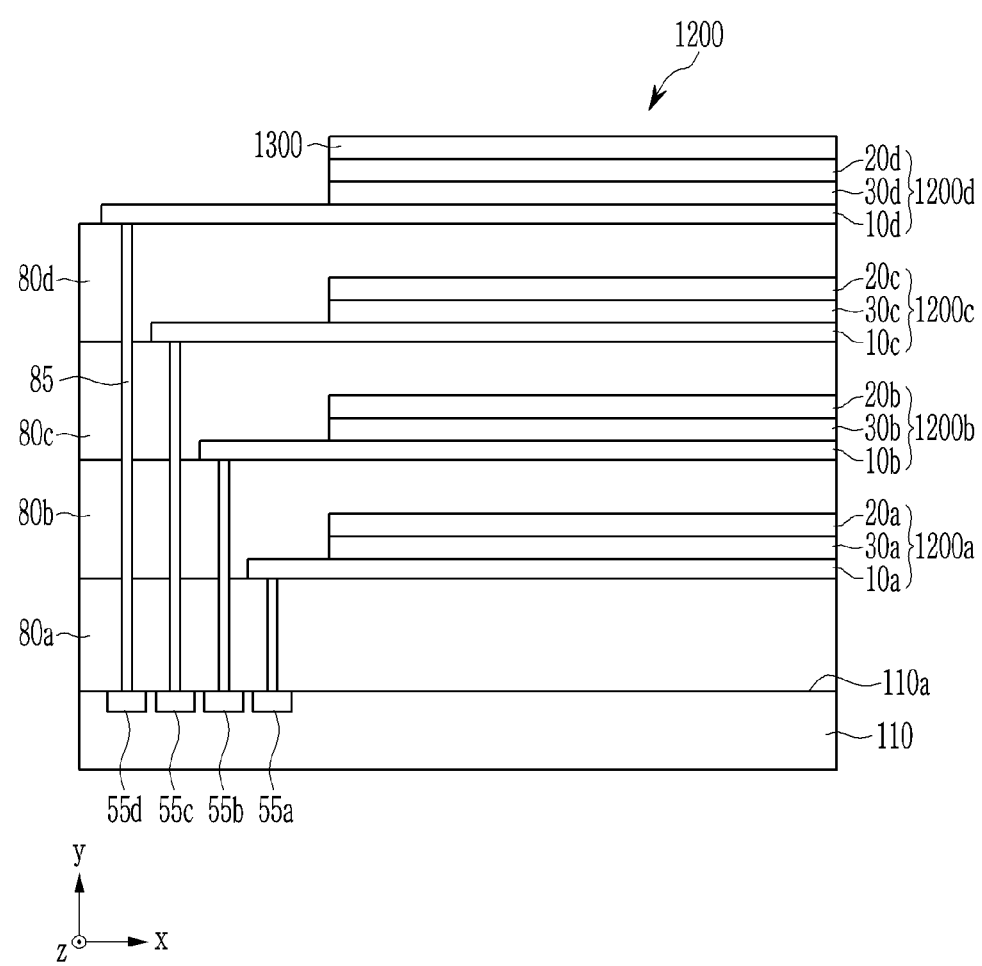
FIG. 13 is a schematic cross-sectional view according to one example of the organic sensor of FIG. 12.

FIG. 12 is a schematic perspective view of an example of an organic sensor according to some exemplary embodiment and FIG. 13 is a schematic cross-sectional view according to one example of the organic sensor of FIG. 12.

Referring to FIG. 12, an organic sensor 1200 according to an embodiment includes a photoelectric diode configured to selectively absorb light in a near infra-red wavelength spectrum, a photoelectric diode configured to selectively absorb and to electrically convert light in a red wavelength spectrum, a photoelectric diode configured to selectively absorb and to electrically convert light in a green wavelength spectrum, and a photoelectric diode configured to selectively absorb and to electrically convert light in a blue wavelength spectrum.

Referring to FIG. 13, an organic sensor 1200 according to an embodiment includes a semiconductor substrate 110 integrated with charge storages 55a to 55d, and transmission transistors; a lower insulation layer 80a; intermediate insulation layers 80b and 80c; an upper insulation layer 80d; a first photoelectric diode 1200a; a second photoelectric diode 1200b; a third photoelectric diode 1200c; and a fourth photoelectric diode 1200d. The first to fourth photoelectric diodes 1200a to 1200d are vertically stacked on the semiconductor substrate 110.

The first photoelectric diode 1200a includes a first electrode 10a and a second electrode 20a facing each other, and a photoelectric conversion layer 30a disposed between the first electrode 10a and the second electrode 20a. The second photoelectric diode 1200b includes a first electrode 10b and a second electrode 20b facing each other, and a photoelectric conversion layer 30b disposed between the first electrode 10b and the second electrode 20b. The third photoelectric diode 1200c includes a first electrode 10c and a second electrode 20c facing each other, and a photoelectric conversion layer 30c disposed between the first electrode 10c and the second electrode 20c. The fourth photoelectric diode 1200d includes a first electrode 10d and a second electrode 20d facing each other, and a photoelectric conversion layer 30d disposed between the first electrode 10d and the second electrode 20d. The photoelectric conversion layers 30a, 30b, 30c, and 30d may selectively absorb light in one wavelength spectrum of the red wavelength spectrum, the green wavelength spectrum, the blue wavelength spectrum, and the near infra-red wavelength spectrum and may photoelectrically convert the light. One of the photoelectric conversion layers 30a, 30b, 30c, and 30d may be the aforementioned organic layer 30. The first electrodes 10a, 10b, 10c, and 10d, and the second electrodes 20a, 20b, 20c, and 20d are the same as the first electrode 10 and the second electrode 20 that are described above.

Focusing lens 1300 may be further formed on the fourth photoelectric diode 1200d. The focusing 1300 lens may control a direction of incident light and gather the light in one region. The focusing lens 1300 may have a shape of, for example, a cylinder or a hemisphere, but is not limited thereto.

In the drawing, the first to fourth photoelectric diodes 1200a to 1200d are sequentially stacked, but the present disclosure is not limited thereto, and they may be stacked in various orders.

Figure 14:
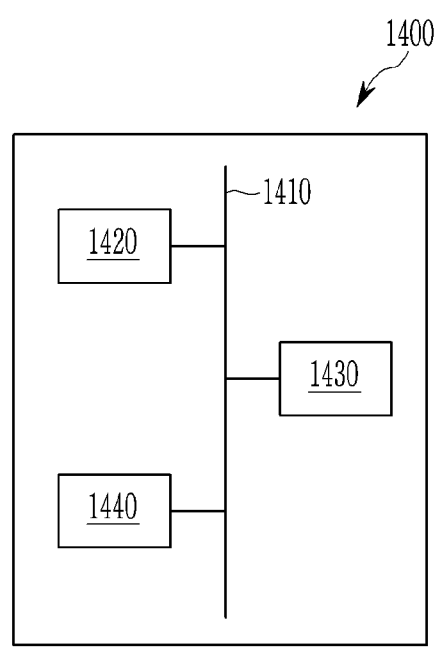
FIG. 14 is a schematic diagram of an electronic device according to some exemplary embodiment.

FIG. 14 is a schematic diagram of an electronic device according to some exemplary embodiment.

Referring to FIG. 14, an electronic device 1400 may include a processor 1420, a memory 1430, and an organic sensor 1440 that are electrically coupled together via a bus 1410. The organic sensor 1440 may be an organic sensor of any of the aforementioned embodiments The memory 1430, which may be a non-transitory computer readable medium, may store a program of instructions. The processor 1420 may execute the stored program of instructions to perform one or more functions. For example, the processor 1420 may be configured to process electrical signals generated by the organic sensor 1440. The processor 1420 may be configured to generate an output (e.g., an image to be displayed on a display interface) based on such as processing.

The organic sensor may be applied to various electronic devices, for example and the electronic devices may include for example a camera, a camcorder, a mobile phone internally having them, a display device, a security device, or a medical device, but are not limited thereto.

Hereinafter, the embodiments are illustrated in more detail with reference to examples. However, these examples are exemplary, and the present scope is not limited thereto.
Simulation Evaluation of Light Absorption Properties The light absorption properties of compounds are evaluated using a Gaussian09 program, a wave function is expressed by using a DGDZVP basis-set, an optimal structure is obtained through B3LYP hybrid density functional calculation, and then, the structure is used for a B3LYP hybrid density functional or ωB97X-D range-separated density functional time-dependent DFT (density functional theory) calculation, and thus an adsorption wavelength is obtained (by calculating an energy difference between singlet exited state and ground state).

The results are shown in Table 1.

TABLE 1

| | Peak absorption wavelength ($\lambda_{max}$) (nm) | Absorption intensity (a.u.) |
|---|---|---|
| Compound 32 | 896 | 1.72 |
| Compound 34 | 895 | 1.72 |
| Compound 35 | 872 | 1.72 |
| Compound 36 | 947 | 1.72 |
| Compound 38 | 914 | 1.89 |
| Compound 40 | 910 | 1.84 |
| Compound 41 | 877 | 1.90 |
| Compound 42 | 974 | 1.91 |
| Compound 62 | 872 | 1.94 |
| Compound 65 | 858 | 1.94 |
| Compound 66 | 918 | 1.95 |
| Compound 68 | 896 | 2.19 |
| Compound 70 | 886 | 2.14 |
| Compound 71 | 876 | 2.23 |
| Compound 72 | 953 | 2.23 |

SYNTHESIS EXAMPLES

Synthesis Example 1: Synthesis of Compound 35

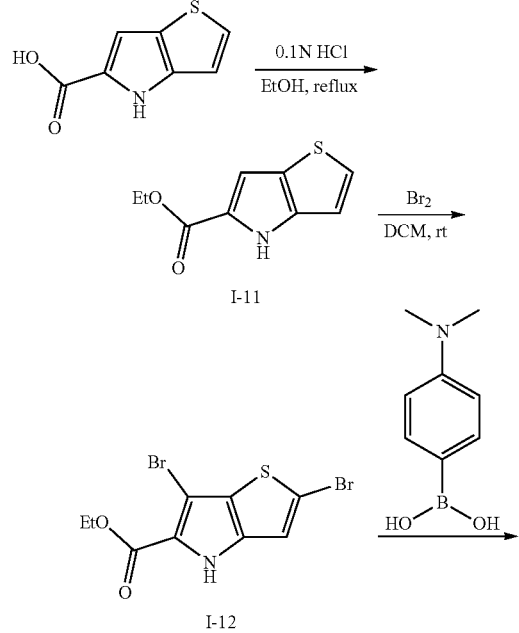

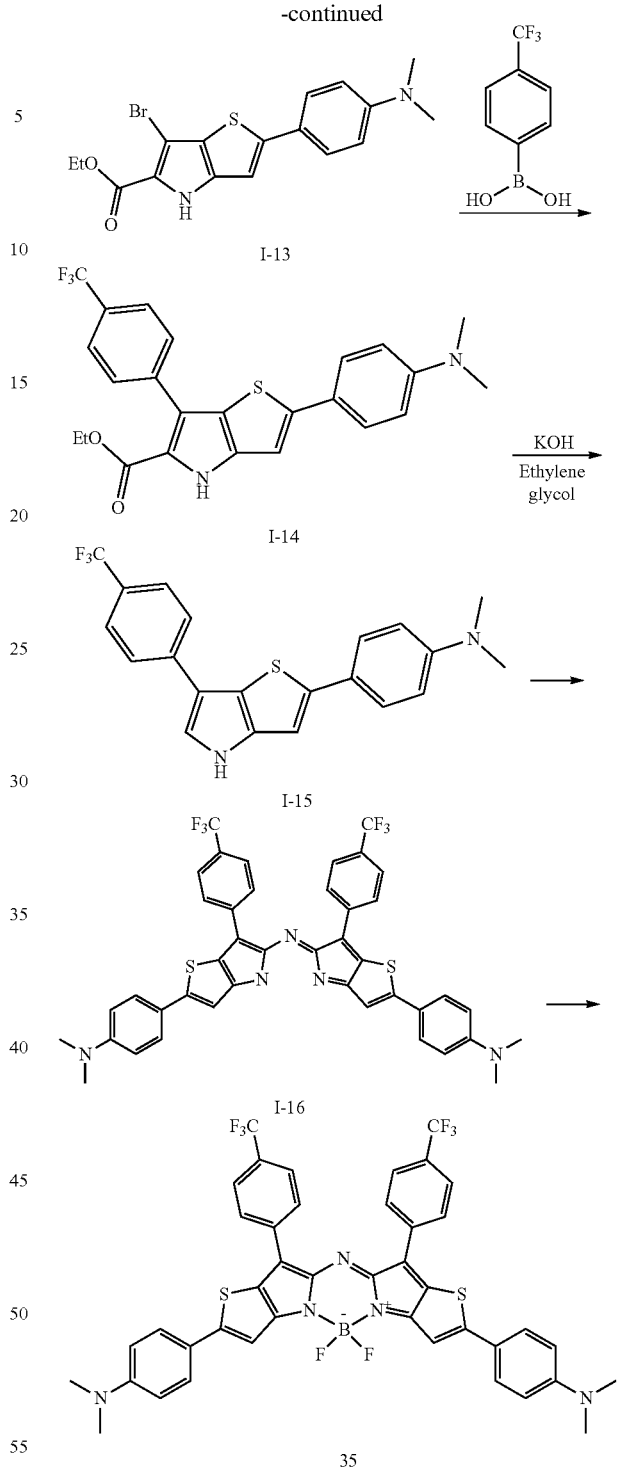

Synthesis of Intermediate I-11

1 g of 4H-thieno[3,2-b]pyrrole-5-carboxylic acid is dissolved in 50 ml of ethyl alcohol. 10 ml of 0.1 N HCl is added thereto and then, refluxed and stirred at 100° C. for 24 hours and cooled down to room temperature. When a reaction is complete, after evaporating the ethyl alcohol under a reduced pressure, 200 ml of ethyl acetate is poured thereinto for dilution. An organic layer therefrom is washed with a saturated NaHCO$_3$ aqueous solution (50 ml×2) and a saturated NaCl aqueous solution (50 ml×2), dried with MgSO$_4$, filtered, and evaporated under a reduced pressure. The residue is purified by column chromatography (ethyl acetate/hexane=1:5 v/v) to obtain 0.8 g of Intermediate I-11. A yield thereof is 69%.

The produced compound is identified by using LC-MS.

LC-MS m/z=196.24 (M+H)+

Synthesis of Intermediate I-12

1 g of ethyl4H-thieno[3,2-b]pyrrole-5-carboxylate (Intermediate I-11) was dissolved in 50 ml of dichloromethane. 0.2 g of bromine is slowly added thereto in a dropwise fashion and then, stirred at room temperature for 24 hours. When a reaction is complete, an organic layer therefrom is diluted with 100 ml of dichloromethane, washed with a NaHCO$_3$ aqueous solution (50 ml×2) and a saturated NaCl aqueous solution (50 ml×2), dried with MgSO$_4$, and filtered, and evaporated under a reduced pressure. The residue is purified by column chromatography (ethyl acetate/hexane=1:5 v/v) to obtain 1.7 g of Intermediate I-12. A yield thereof is 94%.

The produced compound is identified using LC-MS.

LC-MS m/z=354.03 (M+H)+

Synthesis of Intermediate I-13

2.3 g (6.94 mmol) of ethyl2,6-dibromo-4H-thieno[3,2-b]pyrrole-5-carboxylate (Intermediate I-12) and 1.5 g (7.64 mmol) of (4-(dimethylamino)phenyl)boronic acid are put in a flask, and 150 ml of a mixed solvent of tetrahydrofuran/distilled water (a volume ratio of 4:1) is added thereto under a nitrogen flow. Then, 0.4 g (0.35 mmol) of tetrakis(triphenylphosphine)palladium (0) and 2.21 g (20.83 mmol) of potassium carbonate are sequentially added thereto and stirred at 110° C. for 24 hours. When a reaction is complete, after decreasing the temperature down to room temperature, 500 ml of ethyl acetate is added thereto for dilution. An organic layer therefrom is washed with a saturated NaHCO$_3$ aqueous solution (150 ml×2) and a saturated NaCl aqueous solution (100 ml×2), dried with MgSO$_4$, filtered, and evaporated under a reduced pressure. The residue is purified by column chromatography (ethyl acetate/hexane=1:3 v/v) to obtain 2.3 g of Intermediate I-13. A yield thereof is 89%.

The produced compound is identified using LC-MS.

LC-MS m/z=394.30 (M+H)+

Synthesis of Intermediate I-14

5.3 g (7.64 mmol) of ethyl6-bromo-2-(4-(dimethylamino)phenyl)-4H-thieno[3,2-b]pyrrole-5-carboxylate (Intermediate I-13) and 1.5 g (6.94 mmol) of (4-(trifluoromethyl)phenyl)boronic acid are put in a flask, and 150 ml of a mixed solvent of toluene/ethanol/water (a volume ratio of 3:1:1) is added thereto under a nitrogen flow. Subsequently, 0.4 g (0.35 mmol) of tetrakis (triphenylphosphine)palladium (0) and 2.21 g (20.83 mmol) of potassium carbonate are sequentially added thereto and then, stirred at 120° C. for 24 hours. When a reaction is complete, after decreasing the temperature down to room temperature, 500 ml of ethyl acetate is added thereto for dilution. An organic layer therefrom is washed with a saturated NaHCO$_3$ aqueous solution (150 ml×2) and a saturated NaCl aqueous solution (100 ml×2), dried with MgSO$_4$, filtered, and evaporated under a reduced pressure. The residue is purified by column chromatography (ethyl acetate/hexane=1:3 v/v) to obtain 2.3 g of Intermediate I-14. A yield thereof is 37%.

The produced compound is identified by using LC-MS.

LC-MS m/z=459.50 (M+H)+

Synthesis of Intermediate I-15

1.0 g (2.18 mmol) of ethyl-(4-(dimethylamino)phenyl)-6-(4-(trifluoromethyl)phenyl)-4H-thieno[3,2-b]pyrrole-5-carboxylate (Intermediate I-14) is added to 10 ml of ethylene glycol and then, stirred at room temperature. 6.1 g (108.73 mmol) of potassium hydroxide is added thereto and then, stirred at 130° C. for 24 hours. When a reaction is complete, after decreasing the temperature to room temperature, 500 ml of ethyl acetate is added thereto for dilution. An organic layer therefrom is washed with a saturated NaHCO$_3$ aqueous solution (150 ml×2) and a saturated NaCl aqueous solution (100 ml×2), dried with MgSO$_4$, filtered, and evaporated under a reduced pressure. The residue is purified by column chromatography (ethyl acetate/hexane=1:3 v/v) to obtain 0.5 g of Intermediate I-15. A yield thereof is 59%.

The produced compound is identified by using LC-MS.

LC-MS m/z=387.11 (M+H)+

Synthesis of Intermediate I-16

0.80 g (2.07 mmol) of N,N-dimethyl-4-(6-(4-(trifluoromethyl)phenyl)-4H-thieno[3,2-b]pyrrol-2-yl)aniline (Intermediate I-15) is added to a mixed solvent of 2.0 ml/1.0 ml of acetic acid/acetic anhydride. After decreasing a temperature to 0° C., 1.60 g (2.31 mmol) of sodium nitrite (NaNO$_2$) is added thereto and then, stirred for 15 minutes. Subsequently, 0.80 g (2.07 mmol) of N,N-dimethyl-4-(6-(4-(trifluoromethyl)phenyl)-4H-thieno[3,2-b]pyrrol-2-yl)aniline (Intermediate I-15) is additionally added thereto. Then, the reaction solution is heated up to 80° C. and then, stirred for 3 hours. After decreasing the temperature down to room temperature, a solid generated therein is filtered and washed with n-hexane to obtain 0.70 g of Intermediate I-16. A yield thereof is 43%.

The produced compound is identified by using LC-MS.

LC-MS m/z=784.19 (M+H)+

Synthesis of Compound 35

0.70 g (0.89 mmol) of (Z)-2-(4-(dimethylamino)phenyl)-N-(2-(4-(dimethylamino)phenyl)-6-(4-(trifluoromethyl)phenyl)-5H-thieno[3,2-b]pyrrol-5-yl-dene)-6-(4-(trifluoromethyl)phenyl)-4H-thieno[3,2-b]pyrrole-5-amine (Intermediate I-16) is put in a flask and dissolved in 3.0 ml of toluene under a nitrogen flow, and 1.0 ml of triethylamine is added thereto. 0.3 mL of borontrifluoride diethyl etherate is slowly added thereto in a dropwise fashion and then, stirred at 80° C. for 3 hours. When a reaction is complete, after decreasing the temperature down to room temperature, precipitates therein are gathered and washed with ethanol, and the residue is purified by column chromatograph y(dichloromethane/hexane=1:3 v/v) to obtain 0.2 g of Compound 35. A yield thereof is 27%.

The produced compound is identified using LC-MS.

LC-MS m/z=832.19 (M+H)+

123

Synthesis Example 2: Synthesis of Compound 99

Reaction Scheme 2

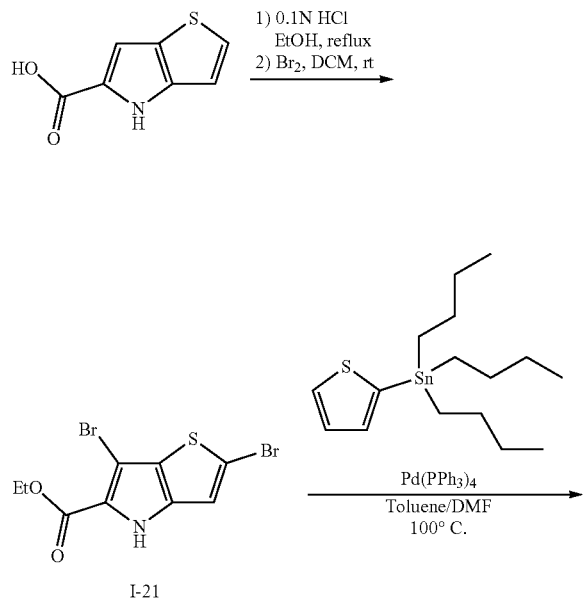

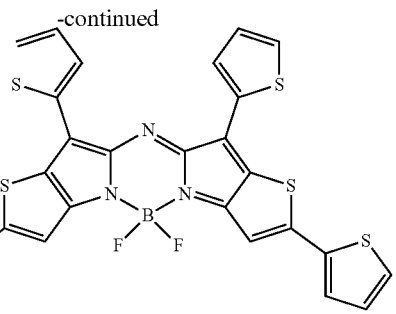

99

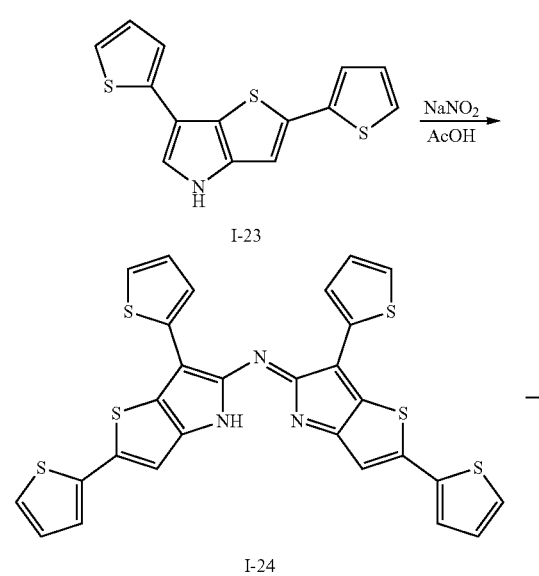

Synthesis of Intermediate I-21

Intermediate I-21 is obtained according to the aforementioned synthesis method of Intermediate I-12.

Synthesis of Intermediate I-22

1.0 g (2.83 mmol) of ethyl 2,6-dibromo-4H-thieno[3,2-b]pyrrole-5-carboxylate (Intermediate I-21) is dissolved in 50 ml of toluene and then, put in an ice bath, and a temperature thereof is decreased. 3.0 ml of tributyl(thiophen-2-yl)stannane is slowly added thereto in a dropwise fashion, and the obtained mixture is heated up to room temperature and 30 minutes later, refluxed and stirred at 120° C. for 24 hours. When a reaction is complete, after decreasing the temperature down to room temperature, 500 ml of ethyl acetate is poured thereinto for dilution. An organic layer therefrom is washed with a saturated NaHCO$_3$ aqueous solution (150 ml×2) and a saturated NaCl aqueous solution (100 ml×2), dried with MgSO$_4$, filtered, and evaporated under a reduced pressure. The residue is purified by column chromatography (ethyl acetate/hexane=1:3 v/v) to obtain 0.5 g of Intermediate I-22. A yield thereof is 49%.

The produced compound is identified using LC-MS.

LC-MS m/z=360.49 (M+H)+

Synthesis of Intermediate I-23

1.0 g (2.78 mmol) of ethyl 2,6-di(thiophene-2-yl)-4H-thieno[3,2-b]pyrrole-5-carboxylate (Intermediate I-22) is put in 30 ml of ethylene glycol and then, stirred at room temperature. 7.8 g (139.0 mmol) of potassium hydroxide is added thereto and then, stirred at 130° C. for 24 hours. When a reaction is complete, after decreasing the temperature down to room temperature, 500 ml of ethyl acetate is poured thereto for dilution. An organic layer therefrom is washed with a saturated NaHCO$_3$ aqueous solution (150 ml×2) and a saturated NaCl aqueous solution (100 ml×2), dried with MgSO$_4$, filtered, and evaporated under a reduced pressure. The residue is purified by column chromatography (ethyl acetate/hexane=1:3 v/v) to obtain 0.4 g of Intermediate I-23. A yield thereof is 50%.

The produced compound is identified by using LC-MS.

LC-MS m/z=287.99 (M+H)

Synthesis of Intermediate I-24

0.5 g (1.74 mmol) of 2,6-di(thiophene-2-yl)-4H-thieno[3,2-b]pyrrole (Intermediate I-23) is added to a mixed solvent of 2.0 ml/1.0 ml of acetic acid/acetic anhydride. Subsequently, after decreasing a temperature down to 0° C., 1.32 g (1.91 mmol) of sodium nitrite (NaNO$_2$) is added thereto and then, stirred for 15 minutes. 0.5 g (1.74 mmol) of 2,6-di(thiophene-2-yl)-4H-thieno[3,2-b]pyrrole (Intermediate I-23) is added thereto. Subsequently, the reaction solution is heated up to 80° C. and then, stirred for 3 hours. The reaction solution is cooled down to room temperature, and a solid generated therein is filtered and washed with ethanol to obtain 0.45 g of Intermediate I-24. A yield thereof is 44%.

The produced compound is identified by using LC-MS.
LC-MS m/z=585.98 (M+H)+

Synthesis of Compound 99

0.4 g (0.7 mmol) of (Z)—N-(2,6-di(thiophene-2-yl)-5H-thieno[3,2-b]pyrrole-5-yl-diene)-2,6-di(thiophene-2-yl)-4H-thieno[3,2-b]pyrrole-5-amine (Intermediate I-24) is put in a flask and dissolved in 3.0 ml of toluene under a nitrogen flow, and 1.0 ml of triethylamine is added thereto. 0.2 mL of borontrifluoride diethyl etherate is slowly added thereto in a dropwise fashion and then, stirred at 80° C. for 3 hours. When a reaction is complete, after decreasing the temperature down to room temperature, precipitates therein are gathered, washed with ethanol, and the residue is purified by column chromatography (dichloromethane/hexane=1:3 v/v) to obtain 0.1 g of Compound 99. A yield thereof is 23%.

The produced compound is identified by using LC-MS.
LC-MS m/z=634.63 (M+H)+

Evaluation I

The compounds of Synthesis Examples are respectively dissolved in dichloromethane at a concentration of 1×10$^{-5}$ M to prepare solutions to evaluate light absorption properties of the compounds.

The light absorption properties are evaluated by measuring a peak absorption wavelength ($\lambda_{max}$) with a Shimadzu UV-3600 Plus UV-Vis-NIR (UV-Vis-NIR) spectrometer.

The results are shown in Table 2.

TABLE 2

| | $\lambda_{max}$ (nm) |
|---|---|
| Synthesis Example 1 | 963 |
| Synthesis Example 2 | 819 |

Referring to Table 2, absorption spectra of the compounds of Synthesis Examples show a peak absorption wavelength in a near infra-red wavelength spectrum.

Evaluation II Deposition characteristics of the compounds of Synthesis Examples are evaluated.

The deposition characteristics are evaluated by sublimating the compounds under high vacuum of 10 Pa or less and measuring a weight loss of the compounds depending on a temperature increase in a thermogravimetric analysis method.

The results are shown in Table 3.

TABLE 3

| | $T_s$(° C.) (−10 wt %) | $T_s$(° C.) (−50 wt %) |
|---|---|---|
| Synthesis Example 1 | 220° C. | 280° C. |
| Synthesis Example 2 | 200° C. | 260° C. |

* $T_s$(° C.) (−10 wt %): A temperature at which a specimen loses 10 wt % of a weight
* $T_s$(° C.) (−50 wt %): A temperature at which a specimen loses 50 wt % of a weight Referring to Table 3, the compounds of Synthesis Examples have satisfactory heat resistance and are formed into a thin film through repetitive thermal deposition.

While this disclosure has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:
1. A compound represented by Chemical Formula 1:

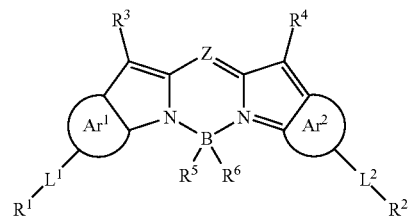

Chemical Formula 1 wherein, in Chemical Formula 1,
Ar$^1$ and Ar$^2$ are independently a substituted or unsubstituted heterocycle comprising at least one N, O, S, Se, Te;
Z is N,
L$^1$ and L$^2$ are independently a single bond, a substituted or unsubstituted C6 to C30 arylene group, a divalent substituted or unsubstituted C3 to C30 heterocyclic group, or a combination thereof,
R$^1$ is NR$^b$R$^c$, wherein R$^b$ and R$^c$ are independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof and R$^b$ and R$^c$ are independently present or are linked with each other to form a ring,
R$^2$ is NR$^d$R$^e$, wherein R$^d$ and R$^e$ are independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof, and R$^d$ and R$^e$ are independently present or are linked with each other to form a ring,
R$^3$ and R$^4$ are independently a substituted or unsubstituted C6 to C30 aryl group, a substituted or unsubstituted C3 to C30 heterocyclic group, or a combination thereof, and
R$^5$ and R$^6$ together are oxygen (=O), sulfur (=S), selenium (=Se), tellurium (=Te), or R$^5$ and R$^6$ are independently a substituted or unsubstituted C1 to C30 alkyl group, a substituted or unsubstituted C6 to C30 aryl group, a substituted or unsubstituted C3 to C30 heterocyclic group, a halogen, a cyano group, or a combination thereof,
wherein a peak absorption wavelength of the compound belongs to a wavelength spectrum of about 900 nm to about 2000 nm.

2. The compound of claim 1, wherein Ar$^1$ and Ar$^2$ are independently a substituted or unsubstituted thiophene, a substituted or unsubstituted furan, a substituted or unsubstituted selenophene, a substituted or unsubstituted tellurophene, or a combination thereof.

3. The compound of claim 1, wherein L$^1$ and L$^2$ are independently a single bond; a substituted or unsubstituted phenylene group; a substituted or unsubstituted biphenylene group; a substituted or unsubstituted naphthylene group; a substituted or unsubstituted terphenylene group; a divalent substituted or unsubstituted C3 to C30 heterocyclic group comprising at least one O, S, Se, Te, N, Si; or a combination thereof, a fused ring of two or more of a substituted or unsubstituted phenylene group; a substituted or unsubstituted biphenylene group; a substituted or unsubstituted naphthylene group; a substituted or unsubstituted terphenylene group; a divalent substituted or unsubstituted C3 to C30 heterocyclic group, or a combination thereof, or a combination thereof.

4. The compound of claim 1, wherein R$^1$ and R$^2$ are independently represented by one of Chemical Formulae A-1 to A-4:

Chemical Formula A-1

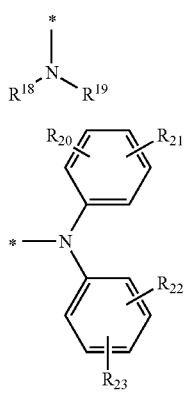

Chemical Formula A-2

Chemical Formula A-3

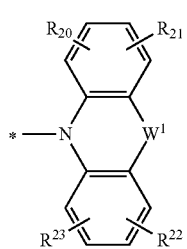

Chemical Formula A-4

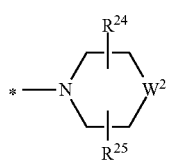

wherein, in Chemical Formulae A-1 to A-4,
W$^1$ is a single bond, O, S, Se, Te, CR$^f$R$^g$, or SiR$^h$R$^i$,
W$^2$ is O, S, Se, Te, CR$^j$R$^k$, or SiR$^l$R$^m$,
R$^{18}$ to R$^{25}$ and R$^f$ to R$^m$ are independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen, or a combination thereof, R$^{18}$ and R$^{19}$ are independently present or are linked with each other to form a ring, R$^{20}$ and R$^{21}$ are independently present or are linked with each other to form a ring, R$^{22}$ and R$^{23}$ are independently present or are linked with each other to form a ring, R$^{24}$ and R$^{25}$ are independently present or are linked with each other to form a ring, R$^f$ and R$^g$ are independently present or are linked with each other to form a ring, R$^h$ and R$^i$ are independently present or are linked with each other to form a ring, R$^j$ and R$^k$ are independently present or are linked with each other to form a ring, R$^l$ and R$^m$ are independently present or are linked with each other to form a ring, and

* is a bond with Chemical Formula 1.

5. The compound of claim 1, wherein R$^3$ and R$^4$ are independently a substituted or unsubstituted phenyl group, a substituted or unsubstituted pyrrolyl group, a substituted or unsubstituted thiophenyl group, a substituted or unsubstituted furanyl group, a substituted or unsubstituted selenophenyl group, a substituted or unsubstituted tellurophenyl group, a fused ring having two or more of a substituted or unsubstituted phenyl group, a substituted or unsubstituted pyrrolyl group, a substituted or unsubstituted thiophenyl group, a substituted or unsubstituted furanyl group, a substituted or unsubstituted selenophenyl group, a substituted or unsubstituted tellurophenyl group, or a combination thereof.

6. The compound of claim 1, wherein the compound is represented by one of Chemical Formulae 1c-1, 1d-1, 1g-1, and 1h-1:

Chemical Formula 1c-1

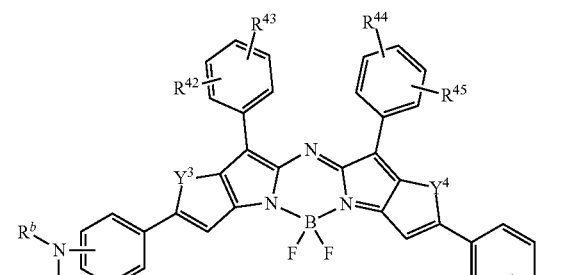

Chemical Formula 1d-1

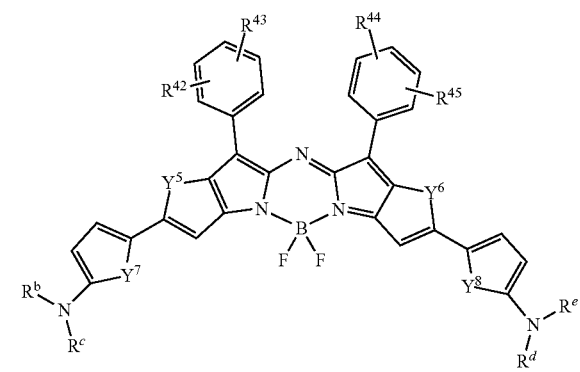

-continued

Chemical Formula 1g-1

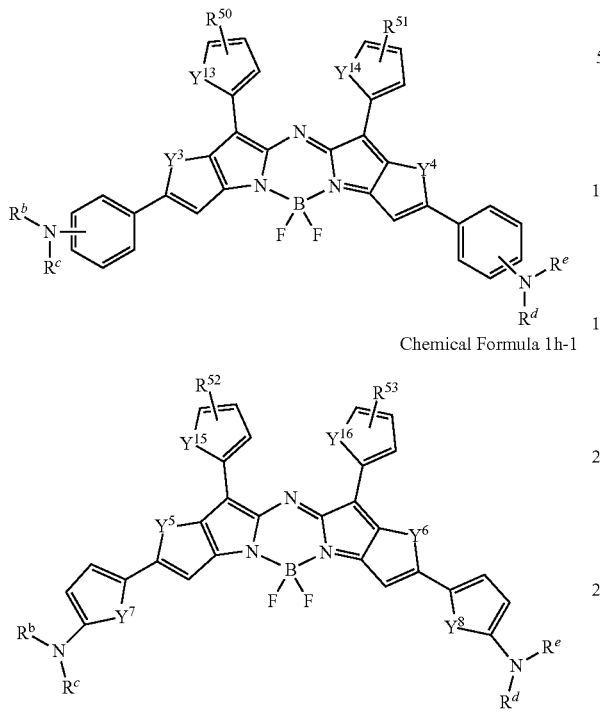

Chemical Formula 1h-1 wherein, in Chemical Formulae 1c-1, 1d-1, 1g-1, and 1h-1, $R^b$ to $R^e$ are independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof, $R^b$ and $R^c$ are independently present or are linked with each other to form a ring, $R^d$ and $R^e$ are independently present or are linked with each other to form a ring, $Y^3$, $Y^8$, and $Y^{13}$ to $Y^{16}$ are independently N, O, S, Se, Te, or a combination thereof, $X^{1a}$ and $X^{1b}$ are independently N, O, S, Se, Te, $CR''$, or a combination thereof, and $R^{34}$ to $R^{67}$ and $R''$ are independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen or a combination thereof.

7. A film comprising the compound of claim 1.

8. A photoelectric diode comprising
a first electrode and a second electrode facing each other, and
an organic layer between the first electrode and the second electrode
wherein the organic layer comprises a compound represented by Chemical Formula 1:

Chemical Formula 1

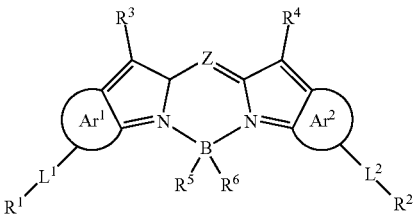

wherein, in Chemical Formula 1, $Ar^1$ and $Ar^2$ are independently a substituted or unsubstituted heterocycle comprising at least one N, O, S, Se, Te; or a combination thereof, Z is N, $L^1$ and $L^2$ are independently a single bond, a substituted or unsubstituted C6 to C30 arylene group, a divalent substituted or unsubstituted C3 to C30 heterocyclic group, or a combination thereof, $R^1$ is $NR^bR^c$, wherein $R^b$ and $R^c$ are independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof and $R^b$ and $R^c$ are independently present or are linked with each other to form a ring, $R^2$ $NR^dR^e$, wherein $R^d$ and $R^e$ are independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, and $R^d$ and $R^e$ are independently present or are linked with each other to form a ring, $R^3$ and $R^4$ are independently a substituted or unsubstituted C6 to C30 aryl group, a substituted or unsubstituted C3 to C30 heterocyclic group, or a combination thereof, and $R^5$ and $R^6$ together are oxygen (=O), sulfur (=S), selenium (=Se), tellurium (=Te), or $R^5$ and $R^6$ are independently a substituted or unsubstituted C1 to C30 alkyl group, a substituted or unsubstituted C6 to C30 aryl group, a substituted or unsubstituted C3 to C30 heterocyclic group, a halogen, a cyano group, or a combination thereof wherein a peak absorption wavelength of the compound belongs to a wavelength spectrum of about 900 nm to about 2000 nm.

9. The photoelectric diode of claim 8, wherein $Ar^1$ and $Ar^2$ are independently a substituted or unsubstituted thiophene, a substituted or unsubstituted furan, a substituted or unsubstituted selenophene, a substituted or unsubstituted tellurophene, or a combination thereof.

10. The photoelectric diode of claim 8, wherein $L^1$ and $L^2$ are independently a single bond; a substituted or unsubstituted phenylene group; a substituted or unsubstituted biphenylene group; a substituted or unsubstituted naphthylene group; a substituted or unsubstituted terphenyl group; a divalent substituted or unsubstituted C3 to C30 heterocyclic group comprising at least one O, S, Se, Te, N, Si; or a combination thereof, a fused ring having two or more of a substituted or unsubstituted phenylene group; a substituted or unsubstituted biphenylene group; a substituted or unsubstituted naphthylene group; a substituted or unsubstituted terphenylene group; a divalent substituted or unsubstituted C3 to C30 heterocyclic group, or a combination thereof, or a combination thereof.

11. The photoelectric diode of claim 8, wherein $R^1$ and $R^2$ are independently represented by one of Chemical Formulae A-1 to A-4:

Chemical Formula A-1

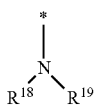

Chemical Formula A-2

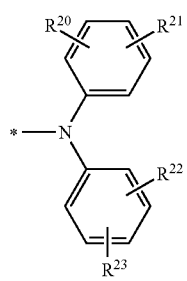

Chemical Formula A-3

Chemical Formula A-4

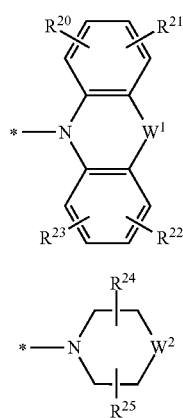

wherein, in Chemical Formulae A-1 to A-4,
$W^1$ is a single bond, O, S, Se, Te, $CR^fR^g$, or $SiR^hR^i$,
$W^2$ is O, S, Se, Te, $CR^jR^k$, or $SiR^lR^m$,
$R^{18}$ to $R^{25}$ and $R^f$ to $R^m$ are independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen, or a combination thereof,
$R^{18}$ and $R^{19}$ are independently present or are linked with each other to form a ring, $R^{20}$ and $R^{21}$ are independently present or are linked with each other to form a ring,
$R^{22}$ and $R^{23}$ are independently present or are linked with each other to form a ring,
$R^{24}$ and $R^{25}$ are independently present or are linked with each other to form a ring,
$R^f$ and $R^g$ are independently present or are linked with each other to form a ring,
$R^h$ and $R^i$ are independently present or are linked with each other to form a ring,
$R^j$ and $R^k$ are independently present or are linked with each other to form a ring,
$R^l$ and $R^m$ are independently present or are linked with each other to form a ring, and
* is a bond with Chemical Formula 1.

12. The photoelectric diode of claim 8, wherein $R^3$ and $R^4$ are independently a substituted or unsubstituted phenyl group, a substituted or unsubstituted pyrrolyl group, a substituted or unsubstituted naphthyl group, a substituted or unsubstituted thiophenyl group, a substituted or unsubstituted furanyl group, a substituted or unsubstituted selenophenyl group, a substituted or unsubstituted tellurophenyl group, a fused ring having two or more of a substituted or unsubstituted phenyl group, a substituted or unsubstituted pyrrolyl group, a substituted or unsubstituted naphthyl group, a substituted or unsubstituted thiophenyl group, a substituted or unsubstituted furanyl group, a substituted or unsubstituted selenophenyl group, a substituted or unsubstituted tellurophenyl group, or a combination thereof, or a combination thereof.

13. The photoelectric diode of claim 8, wherein the compound is represented by one of Chemical Formulae 1c-1, 1d-1, 1g-1, and 1h-1:

Chemical Formula 1c-1

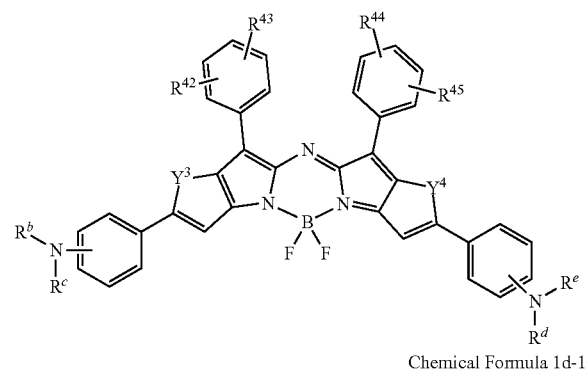

Chemical Formula 1d-1

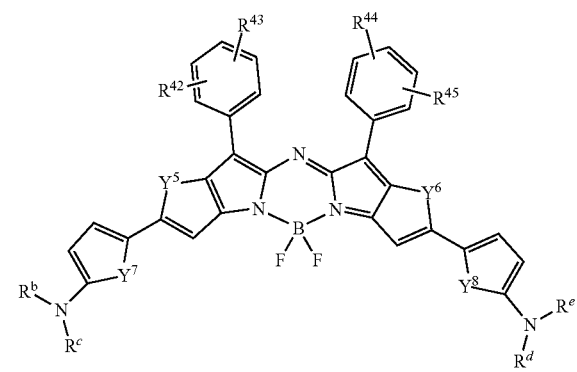

133

-continued

Chemical Formula 1g-1

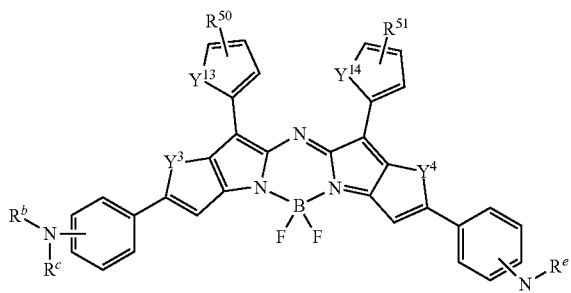

Chemical Formula 1h-1

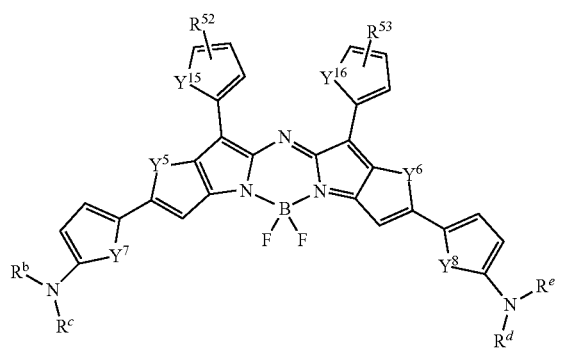

wherein, in Chemical Formulae 1c-1, 1d-1, 1g-1, and 1h-1, $R^b$ to $R^e$ are independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, or a combination thereof, $R^b$ and $R^c$ are independently present or are linked with each other to form a ring, $R^d$ and $R^e$ are independently present or are linked with each other to form a ring, $Y^3$ to $Y^8$ and $Y^{13}$ to $Y^{16}$ are independently N, O, S, Se, or Te, $X^{1a}$ and $X^{1b}$ are independently N, O, S, Se, Te, or CR″, and $R^{34}$ to $R^{67}$ and W are independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C30 aryl group, a substituted or unsubstituted C3 to C30 heterocyclic group, a substituted or unsubstituted amine group, a substituted or unsubstituted silyl group, a halogen or a combination thereof.

14. An organic sensor comprising the photoelectric diode of claim 8.

15. An electronic device comprising the organic sensor of claim 14.

16. An electronic device comprising the photoelectric diode of claim 8.

\* \* \* \* \*